(12) United States Patent
Sawashima et al.

(10) Patent No.: US 12,327,737 B2
(45) Date of Patent: Jun. 10, 2025

(54) SUBSTRATE TREATING APPARATUS

(71) Applicant: SCREEN Holdings Co., Ltd., Kyoto (JP)

(72) Inventors: Jun Sawashima, Kyoto (JP); Takahiro Yamaguchi, Kyoto (JP); Toshimitsu Namba, Kyoto (JP); Sei Negoro, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 711 days.

(21) Appl. No.: 17/676,900

(22) Filed: Feb. 22, 2022

(65) Prior Publication Data

US 2022/0277966 A1 Sep. 1, 2022

(30) Foreign Application Priority Data

Feb. 26, 2021 (JP) ................................ 2021-030445
Jun. 15, 2021 (JP) ................................ 2021-099296

(51) Int. Cl.
*H01L 21/67* (2006.01)
*H01L 21/673* (2006.01)

(52) U.S. Cl.
CPC ...... *H01L 21/67023* (2013.01); *H01L 21/673* (2013.01)

(58) Field of Classification Search
None
See application file for complete search history.

(56) References Cited

U.S. PATENT DOCUMENTS

| 5,850,183 A * | 12/1998 | Berry, III ............... F24F 8/108 340/611 |
| 6,321,637 B1 * | 11/2001 | Shanks ................. B01D 46/10 55/467 |
| 2014/0000659 A1 * | 1/2014 | Lee ................... H01L 21/67075 134/99.1 |

(Continued)

FOREIGN PATENT DOCUMENTS

| JP | H09-145112 A | 6/1997 |
| JP | 2009-200193 A | 9/2009 |

(Continued)

OTHER PUBLICATIONS

Office Action dated Sep. 26, 2023 for corresponding Korean Patent Application No. 10-2022-0023516.

(Continued)

*Primary Examiner* — Brit E. Anbacht
(74) *Attorney, Agent, or Firm* — OSTROLENK FABER LLP

(57) ABSTRACT

A substrate treating apparatus includes a treating housing and a gas supply unit. The treating housing treats substrates in the interior thereof. The gas supply unit supplies a gas to the interior of the treating housing. The gas supply unit has a filter, a duct, and a fan. The filter is located in an upper part of the treating housing. The filter blows off the gas to the interior of the treating housing. The duct is provided in the exterior of the treating housing. The duct is connected to the filter. The fan is provided in the exterior of the treating housing. The fan is connected to the duct. The fan is located in a position not overlapping the filter in plan view. At least part of the fan is located in the same height position as the treating housing.

27 Claims, 20 Drawing Sheets

(56) References Cited

U.S. PATENT DOCUMENTS

| | | | |
|---|---|---|---|
| 2018/0061678 A1 | 3/2018 | Miura et al. | |
| 2019/0295863 A1* | 9/2019 | Inagaki | |
| 2020/0234985 A1* | 7/2020 | Hashizume | H01L 22/26 |
| 2022/0165589 A1* | 5/2022 | Eum | H01L 21/68785 |
| 2022/0277966 A1* | 9/2022 | Sawashima | H01L 21/67173 |
| 2023/0080325 A1* | 3/2023 | Lee | B08B 15/00 |
| | | | 134/18 |

FOREIGN PATENT DOCUMENTS

| | | |
|---|---|---|
| JP | 2015-230921 A | 12/2015 |
| JP | 2016-127107 A | 7/2016 |
| JP | 2018-037448 A | 3/2018 |
| JP | 2019-169681 A | 10/2019 |
| KR | 10-2019-0112666 A | 10/2019 |

OTHER PUBLICATIONS

Office Action dated Mar. 6, 2025 for corresponding Japanese Patent Application No. 2021-099296 and its English machine translation.

* cited by examiner

SUBSTRATE TREATING APPARATUS

CROSS-REFERENCE TO RELATED APPLICATIONS

This application claims priority to Japanese Patent Application No. 2021-030445 filed Feb. 26, 2021, and Japanese Patent Application No. 2021-099296 filed Jun. 15, 2021, the disclosure of which is hereby incorporated herein by reference in its entirety for all purposes.

BACKGROUND OF THE INVENTION

Field of the Invention

This invention relates to a substrate treating apparatus for treating substrates. The substrates are, for example, semiconductor wafers, substrates for liquid crystal displays, substrates for organic EL (Electroluminescence), substrates for FPDs (Flat Panel Displays), substrates for optical displays, substrates for magnetic disks, substrates for optical disks, substrates for magneto-optical disks, substrates for photomasks, and substrates for solar cells.

Description of the Related Art

Japanese Unexamined Patent Publication No. 2009-200193 discloses a substrate treating apparatus. The substrate treating apparatus includes a treating housing and a gas supply unit. The treating housing treats substrates in the interior of the treating housing. The gas supply unit supplies a gas (e.g. air) to the interior of the treating housing.

The gas supply unit has a filter, a duct, and a fan. The filter is disposed in an upper part of the treating housing. The filter blows the gas into the treating housing. The duct is disposed in the exterior of the treating housing. The duct is connected to the filter. The fan is disposed in the exterior of the treating housing. The fan is connected to the duct.

The fan is located above the filter. The fan is located in a position overlapping the filter in plan view. The fan and filter are aligned vertically. The duct extends vertically between the filter and fan.

SUMMARY OF THE INVENTION

However, the substrate treating apparatus in Japanese Unexamined Patent Publication No. 2009-200193 has the following problem. The filter is located in an upper part of the treating housing. The fan is located above the filter. Thus, the entire fan is located above the treating housing. The gas supply unit projects a large extent upward from the treating housing. In other words, a projection length of the gas supply unit projecting upward from the treating housing is relatively large.

Incidentally, the treatment capacity of a substrate treating apparatus improves, without increasing the footprint of the substrate treating apparatus, by arranging a plurality of treating housings in the vertical direction. However, where the gas supply unit projects largely upward from each treating housing, it is not easy to increase the number of treating housings arranged in the vertical direction. This is because the length of the substrate treating apparatus in the vertical direction becomes excessively large.

This invention has been made having regard to the state of the art noted above, and its object is to provide a substrate treating apparatus which can reduce the projection length of a gas supply unit projecting upward from a treating housing.

To fulfill the above object, this invention provides the following construction. A substrate treating apparatus, according to this invention, comprises a first treating housing for treating substrates in an interior thereof; and a first gas supply unit for supplying a gas to the interior of the first treating housing; wherein the first gas supply unit includes a filter disposed in an upper part of the first treating housing for blowing off the gas to the interior of the first treating housing; a duct disposed in an exterior of the first treating housing and connected to the filter; and a fan disposed in the exterior of the first treating housing and connected to the duct; the fan being located in a position not overlapping the filter in plan view; at least part of the fan being located in a same height position as the first treating housing.

The substrate treating apparatus has a first treating housing and a first gas supply unit. The first treating housing treats the substrates in the interior thereof. The first gas supply unit supplies the gas to the interior of the first treating housing. The first gas supply unit has a filter, a duct, and a fan. The filter is located in an upper part of the first treating housing. The filter blows off the gas into the first treating housing. The duct and the fan are provided in the exterior of the first treating housing, respectively. The duct is connected to the filter. The fan is connected to the duct.

Here, the fan is located in a position not overlapping the filter in plan view. Therefore, the filter and the fan are not aligned in the vertical direction. At least part of the fan is located in the same height position as the first treating housing. Therefore, at least part of the fan does not project upward from the first treating housing. This reduces a projection length of the first gas supply unit projecting upward from the first treating housing.

According to the substrate treating apparatus of this invention, as noted above, the projection length of the first gas supply unit projecting upward from the first treating housing can be reduced. The projection length of the first gas supply unit projecting upward from the first treating housing will simply be called hereinafter "the projection length of the first gas supply unit".

In the above substrate treating apparatus, it is preferred that at least part of the fan is located in a position lower than the filter. The height position of the fan is relatively low. Therefore, the projection length of the first gas supply unit can be reduced conveniently.

In the above substrate treating apparatus, it is preferred that the fan is located in a position not overlapping the first treating housing in plan view. The fan is not located over the first treating housing. This effectively reduces the projection length of the first gas supply unit.

In the above substrate treating apparatus, it is preferred that the projection length of the first gas supply unit projecting upward from the first treating housing is at most twice a length of the filter in a vertical direction. The projection length of the first gas supply unit is sufficiently small.

In the above substrate treating apparatus, it is preferred that the duct includes a first horizontal portion extending substantially horizontally from the filter; a vertical portion extending downward from the first horizontal portion; and a second horizontal portion extending substantially horizontally from the vertical portion and located in a position lower than the first horizontal portion. The second horizontal portion can easily be located in the position lower than the first horizontal portion by means of the vertical portion. By the second horizontal portion, the height position of the fan can easily be made low. Therefore, the projection length of the first gas supply unit is reduced conveniently.

In the above substrate treating apparatus, it is preferred that the first treating housing includes a top plate; the top plate having a first top plate portion with the filter mounted thereon; and a second top plate portion disposed below the vertical portion and the second horizontal portion; the second top plate portion being lower than the first top plate portion. The second top plate portion is lower than the first top plate portion. Therefore, the height position of the vertical portion can easily be made low. Further, the height position of the second horizontal portion can easily be made low. Therefore, the height position of the fan can easily be made low. Consequently, the projection length of the first gas supply unit is reduced conveniently.

In the above substrate treating apparatus, it is preferred that part of the duct overlaps the filter in front view. In other words, it is preferred that part of the duct is located in the same height position as the filter. The height position of the duct is relatively low. Therefore, the projection length of the first gas supply unit is reduced conveniently.

In the above substrate treating apparatus, it is preferred that the duct includes a flat part disposed above the filter and extending horizontally for blowing off the gas downward; the flat part having a vertical length smaller than a vertical length of the filter. The length of the flat part in the vertical direction is smaller than the length of the filter in the vertical direction. That is, the flat part is thinner than the filter. Therefore, the projection length of the first gas supply unit is reduced conveniently.

In the above substrate treating apparatus, it is preferred that a total vertical length of the flat part and the filter is smaller than twice the vertical length of the filter. The height position of the flat part is relatively low. Consequently, the projection length of the first gas supply unit is reduced conveniently.

In the above substrate treating apparatus, it is preferred that a height position of an upper surface of the flat part corresponds to an upper end of the duct. The upper end of the duct is relatively low. Consequently, the projection length of the first gas supply unit is reduced conveniently.

In the above substrate treating apparatus, it is preferred that the duct includes an outer groove region communicatively connected to an edge region of the flat part for supplying the gas to the flat part; a vertical length of the outer groove region being larger than the vertical length of the flat part. The vertical length of the outer groove region is larger than the vertical length of the flat part. Therefore, the outer groove region can smoothly supply the gas to the flat part.

In the above substrate treating apparatus, it is preferred that the outer groove region has a loop shape surrounding the flat part in plan view. The outer groove region can supply the gas to the whole of the edge region of the flat part. The outer groove region can supply the gas to the flat part through the whole of the edge region.

In the above substrate treating apparatus, it is preferred that the outer groove region extends downward from the edge region of the flat part; at least part of the outer groove region overlapping the filter in front view. The outer groove region extends downward from the edge region of the flat part. Therefore, the height position of the outer groove region can easily be made low. At least part of the outer groove region overlaps the filter in front view. Therefore, the height position of the outer groove region is relatively low. Thus, the projection length of the first gas supply unit is reduced conveniently.

In the above substrate treating apparatus, it is preferred that the duct includes baffle plates installed in the outer groove region for guiding, to the flat part, part of the gas flowing through the outer groove region. The baffle plates cause the gas to flow with increased smoothness from the outer groove region to the flat part. The filter thus blows off the gas appropriately. Consequently, the substrates can be treated appropriately in the interior of the first treating housing.

In the above substrate treating apparatus, it is preferred that the baffle plates cross directions in which the outer groove region extends. Therefore, the baffle plates can conveniently guide part of the gas flowing through the outer groove region to the flat part.

It is preferred that the above substrate treating apparatus further comprises a transporting space extending in a horizontal first direction and adjoining the first treating housing; a transport mechanism installed in the transporting space for transporting the substrates into the first treating housing; and a piping space adjoining the first treating housing; wherein the first treating housing and the transporting space are aligned in a horizontal second direction perpendicular to the first direction in plan view; the first treating housing and the piping space are aliened in the first direction; the fan is open to the piping space; and the fan sends the gas from the piping space to the filter. The transporting space extends in the first direction. The first treating housing and transporting space are aligned in the second direction in plan view. The first treating housing and piping space are aligned in the first direction in plan view. Here, the second direction is perpendicular to the first direction. Therefore, the transporting space and piping space each adjoin the first treating housing without interfering with each other. The fan is open to the piping space adjoining the first treating housing. The fan sends the gas in the piping space adjoining the first treating housing to the filter. Therefore, the fan is easily located close to the first treating housing without the fan interfering with the transport mechanism. The first gas supply unit is easily reduced in size.

In the above substrate treating apparatus, it is preferred that the first treating housing includes an exhaust port formed in a position facing the piping space; and the fan is disposed above the exhaust port. Therefore, the fan does not interfere with the exhaust port.

It is preferred that the above substrate treating apparatus further comprises a horizontal exhaust unit provided in the piping space, connected to the exhaust port, and extending horizontally; and a vertical exhaust unit provided in the piping space, connected to the horizontal exhaust unit, and extending vertically; wherein the fan is located in a position higher than the horizontal exhaust unit; and the fan and the vertical exhaust unit are aligned in the second direction as seen from the first direction. The fan is located in the position higher than the horizontal exhaust unit. Therefore, the fan does not interfere with the horizontal exhaust unit. The fan and vertical exhaust unit are aligned in the second direction as seen from the first direction. In other words, the fan and vertical exhaust unit are aligned in the second direction in front view. Therefore, the fan does not interfere with the vertical exhaust unit.

In the above substrate treating apparatus, it is preferred that the vertical exhaust unit includes a first vertical exhaust pipe extending vertically; and a second vertical exhaust pipe extending vertically; the horizontal exhaust unit includes a switching mechanism for switching an exhaust path of the first treating housing to one of the first vertical exhaust pipe and the second vertical exhaust pipe; and the fan, the first vertical exhaust pipe, and the second vertical exhaust pipe are aligned in the second direction as seen from the first direction. The switching mechanism, first vertical exhaust pipe, and second vertical exhaust pipe can appropriately discharge the gas from the interior of the first treating housing. Consequently, the substrates can be treated appropriately in the interior of the first treating housing. The fan, first vertical exhaust pipe, and second vertical exhaust pipe are aligned in the second direction as seen from the first direction. In other words, the fan, first vertical exhaust pipe, and second vertical exhaust pipe are aligned in the second direction in front view. Therefore, the fan does not interfere with the first vertical exhaust pipe or second vertical exhaust pipe.

It is preferred that the above substrate treating apparatus further comprises a pressure sensor for measuring gas pressure inside the first treating housing; and a controller for controlling the fan based on detection results of the pressure sensor. The controller can conveniently control the gas pressure inside the first treating housing. Consequently, the substrates can be treated in the interior of the first treating housing appropriately.

It is preferred that the above substrate treating apparatus further comprises a regulator installed in the interior of the first treating housing for receiving the gas blown off from the filter and blowing off the gas downward; and a substrate holder installed in the interior of the first treating housing and located below the regulator for holding the substrates; wherein the filter blows off the gas downward; the regulator includes a regulating chamber larger than the filter in plan view, located below the filter, and extending horizontally; a guide member provided in the regulating chamber for guiding the gas downward in the regulating chamber; and a blowout plate located below the regulating chamber, extending horizontally, and having a plurality of blowout bores; a whole of the guide member is located outward of the filter in plan view; and the whole of the guide member is located outward of the substrates held by the substrate holder in plan view.

The filter blows off the gas into the first treating housing. The filter blows off the gas downward. The regulator is installed in the interior of the first treating housing. The regulator has a regulating chamber. The regulating chamber is located under the filter. Therefore, the regulator can conveniently receive the gas blown off from the filter in the regulating chamber.

The regulator has a blowout plate. The blowout plate is located under the regulating chamber. The blowout plate extends horizontally. The blowout plate has a plurality of blowout bores. Consequently, the regulator can conveniently blow off the gas downward from the blowout plate through the blowout bores.

The substrate holder is installed in the interior of the first treating housing. The substrate holder is located below the regulator. The substrate holder holds a substrate. The regulator can therefore conveniently supply the gas to the substrate held by the substrate holder.

The regulating chamber extends horizontally. The regulating chamber is larger than the filter in plan view. The regulator has a guide member. The guide member is provided in the regulating chamber. The guide member guides the gas downward in the regulating chamber. The whole of the guide member is located outward of the filter in plan view. The guide member therefore prevents the blowout plate from including blowout faulty parts. The blowout faulty parts are portions of the blowout plate that substantially fail to blow off the gas. Thus, the blowout plate does not include blowout bores that substantially fail to blow off the gas. All the blowout bores blow off the gas.

The whole of the guide member is located outward of the substrate held by the substrate holder in plan view. Here, the part of the blowout plate located under the guide member will be called a guide zone. Gas currents blown off from the guide zone will be called third blowout currents. The guide zone is located outward of the substrate held by the substrate holder in plan view. The third blowout currents are relatively strong. Therefore, the third blowout currents protect the substrate held by the substrate holder from the atmosphere outward of the third blowout currents. Consequently, the third blowout currents keep clean the substrate held by the substrate holder. As a result, the substrate treating apparatus can treat the substrate held by the substrate holder with high quality.

In the above substrate treating apparatus, it is preferred that the guide member is located only in an upper part of the regulating chamber, and extends vertically. The guide member can conveniently guide the gas downward in the regulating chamber. Further, the gas flows through the lower part of the regulating chamber without stagnating. Thus, the gas in the regulating chamber flows smoothly along the blowout plate. As a result, the guide member prevents with increased convenience the blowout plate from including the blowout faulty parts.

It is preferred that the above substrate treating apparatus further comprises a barrier wall closing lateral parts of the regulating chamber. The barrier wall prevents the gas from flowing out of the regulating chamber through the lateral parts of the regulating chamber. Thus, the whole gas in the regulating chamber comes out of the blowout plate through the blowout bores. The barrier wall therefore prevents the blowout plate from including the blowout faulty parts.

It is preferred that the above substrate treating apparatus further comprises a dispensing unit installed in the interior of the first treating housing for dispensing a treating liquid to the substrates held by the substrate holder; wherein the dispensing unit includes a distal end movable between a dispensing position and a standby position; when the distal end is located in the standby position, the distal end lies outward of the substrates held by the substrate holder in plan view; and when the distal end is located in the standby position, the guide member lies between the distal end and the substrates held by the substrate holder in plan view. When the distal end is located in the standby position, the guide member is located between the distal end and the substrate held by the substrate holder in plan view. Therefore, when the distal end is located in the standby position, the guide zone is located between the distal end and the substrate held by the substrate holder in plan view. When the distal end is located in the standby position, the third blowout currents are blown off toward areas between the distal end and the substrate held by the substrate holder. Therefore, when the distal end is located in the standby position, the third blowout currents protect the substrate held by the substrate holder from the distal end. Consequently, the third blowout currents keep still cleaner the substrate held by the substrate holder. As a result, the substrate treating apparatus can treat the substrate held by the substrate holder with high quality.

It is preferred that the above substrate treating apparatus further comprises a cup installed in the interior of the first treating housing and located around the substrate holder for catching a treating liquid; wherein at least part of the guide member overlaps the cup in plan view. At least part of the guide member overlaps the cup in plan view. Therefore, at least part of the guide zone overlaps the cup in plan view. At least part of the third blowout currents are blown off toward the cup. Thus, the third blowout currents effectively protect the substrate held by the substrate holder. Consequently, the third blowout currents effectively keep clean the substrate held by the substrate holder. As a result, the substrate treating apparatus can treat the substrate held by the substrate holder with high quality.

In the above substrate treating apparatus, it is preferred that the blowout plate is detachably attached to the first treating housing. The blowout plate can be maintained easily.

In the above substrate treating apparatus, it is preferred that the blowout plate includes a first member, and a second member adjoining the first member. The blowout plate has a first member and a second member. The first member is smaller than the entire blowout plate. The first member can therefore be maintained with increased ease. The second member is smaller than the entire blowout plate. The second member can therefore be maintained with increased ease. The blowout plate can therefore be maintained with increased ease.

A substrate treating apparatus, according to this invention, comprises a first treating housing for treating substrates in an interior thereof; and a first gas supply unit for supplying a gas to the interior of the first treating housing; wherein the first gas supply unit includes a filter disposed in an upper part of the first treating housing for blowing off the gas to the interior of the first treating housing; and a duct disposed in an exterior of the first treating housing and connected to the filter; the duct includes a flat part disposed above the filter and extending horizontally for blowing off the gas downward, and an outer groove region connected to an edge region of the flat part for feeding the gas to the flat part; a vertical length of the outer groove region being larger than a vertical length of the flat part.

The vertical length of the outer groove region is larger than the vertical length of the flat part. The outer groove region can therefore smoothly feed the gas to the flat part. As a result, the flat part can easily be made thin. Consequently, a projection length of the first gas supply unit is reduced conveniently.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

A substrate treating apparatus of this invention will be described hereinafter with reference to the drawings.

1. Outline of Substrate Treating Apparatus

Figure 1:
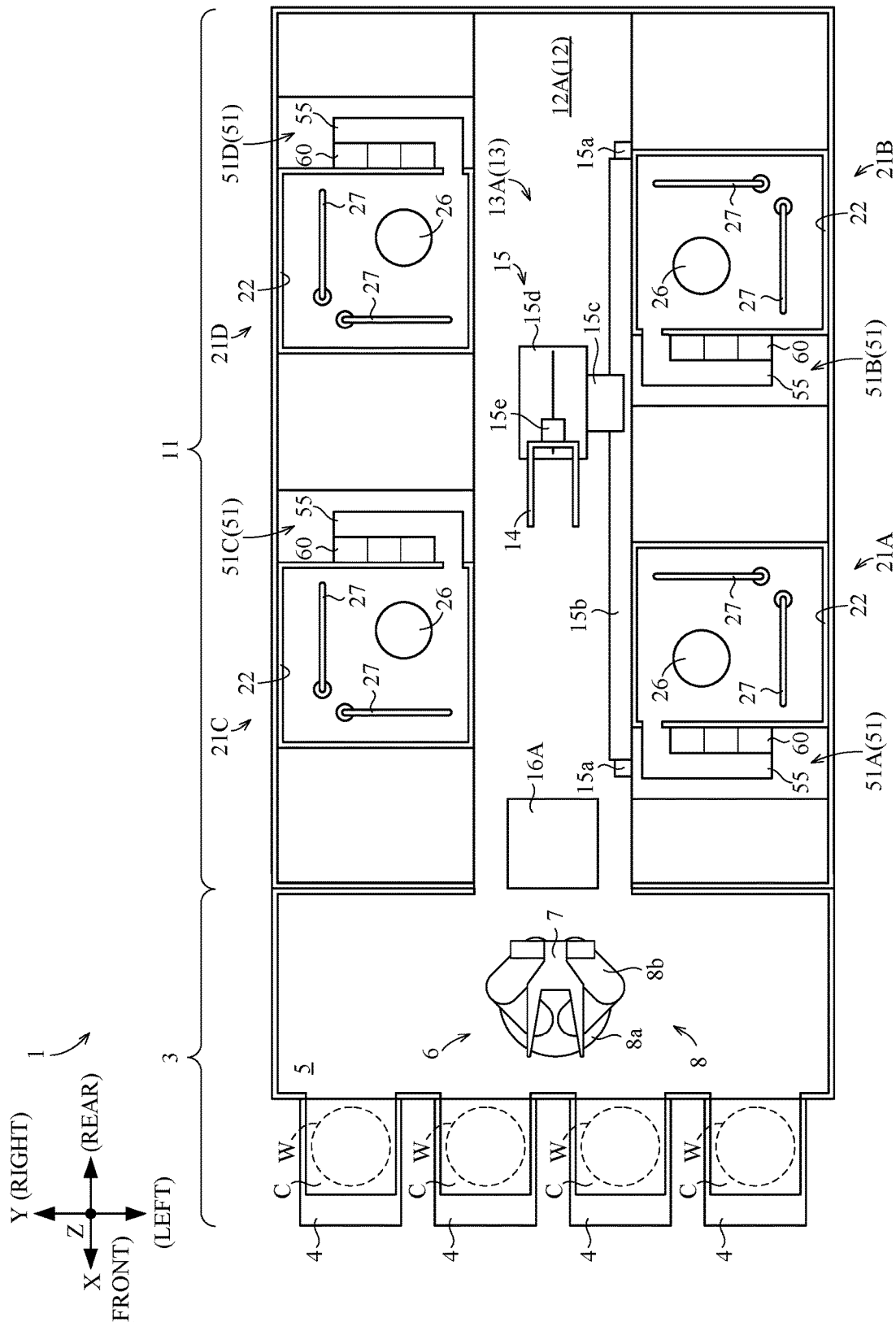
FIG. 1 is a plan view showing an interior of a substrate treating apparatus in an embodiment.

FIG. 1 is a plan view showing an interior of a substrate treating apparatus 1 in an embodiment. The substrate treating apparatus 1 performs treatment on substrates (e.g. semiconductor wafers) W.

The substrates W are, for example, semiconductor wafers, substrates for liquid crystal displays, substrates for organic EL (Electroluminescence), substrates for FPDs (Flat Panel Displays), substrates for optical displays, substrates for magnetic disks, substrates for optical disks, substrates for magneto-optical disks, substrates for photomasks, or substrates for solar cells. The substrates or wafers W have a thin flat shape. The wafers W have a substantially circular shape in plan view.

The substrate treating apparatus 1 includes an indexer division 3 and a treating block 11. The treating block 11 is connected to the indexer division 3. The indexer division 3 feeds wafers W to the treating block 11. The treating block 11 performs treatment on the wafers W. The indexer division 3 collects the wafers W from the treating block 11.

In this specification, for expediency, the direction in which the indexer division 3 and treating block 11 are arranged next to each other will be called the "longitudinal direction X". The longitudinal direction X is horizontal. Of the longitudinal direction X, the direction pointing from the treating block 11 to the indexer division 3 will be called "forward". The direction opposite to forward will be called "rearward". A horizontal direction perpendicular to the longitudinal direction X will be called the "transverse direction Y". One direction of the "transverse direction Y" will be called "rightward". The direction opposite to rightward will be called "leftward". A direction perpendicular to the horizontal direction will be called the "vertical direction Z". For reference, the drawings show front, rear, right, left, up, and down, as appropriate.

The longitudinal direction X is an example of the first direction in this invention. The transverse direction Y is an example of the second direction in this invention.

The "forward", "rearward", "rightward" and "leftward", when not distinguished in particular, will be called "horizontal direction", "laterally" or "sideways".

The indexer division 3 includes a plurality of (e.g. four) carrier racks 4. The carrier racks 4 are aligned in the transverse direction Y. Each carrier rack 4 holds one carrier C. Each carrier C stores a plurality of wafers W. The carriers C are FOUPs (front opening unified pods), for example.

The indexer division 3 has a transporting space 5. The transporting space 5 is located rearward of the carrier racks 4.

The indexer division 3 has a transport mechanism 6. The transport mechanism 6 is installed in the transporting space 5. The transport mechanism 6 is disposed rearward of the carrier racks 4. The transport mechanism 6 transports the wafers W. The transport mechanism 6 can access the carriers C placed on the carrier racks 4.

The construction of the transport mechanism 6 will be described. The transport mechanism 6 has a hand 7 and a hand driver 8. The hand 7 supports one wafer W in a horizontal position. The hand driver 8 is connected to the hand 7. The hand driver 8 moves the hand 7.

The construction of the hand driver 8 is illustrated by way of example. The hand driver 8 includes a first driver 8a and a second driver 8b. The first driver 8a itself is incapable of movement in the horizontal direction. The first driver 8a supports the second driver 8b. The first driver 8a moves the second driver 8b in the vertical direction Z. Further, the first driver 8a rotates the second driver 8b about an axis of rotation parallel to the vertical direction Z. The second driver 8b supports the hand 7. The second driver 8b advances and withdraws the hand 7 horizontally relative to the first driver 8a. The second driver 8b is constructed of multiple articulated arms, for example.

With the above hand driver 8, the hand 7 is movable in the vertical direction Z. The hand 7 is horizontally movable. The hand 7 is rotatable in a horizontal plane.

The treating block 11 includes a transporting space 12A. The transporting space 12A is located in the middle in the transverse direction of the treating block 11. The transporting space 12A extends in the longitudinal direction X. A front part of the transporting space 12A is connected to the transporting space 5 of the indexer division 3.

The treating block 11 includes a transport mechanism 13A. The transport mechanism 13A is installed in the transporting space 12A. The transport mechanism 13A transports wafers W.

The treating block 11 includes a substrate rack 16A. The substrate rack 16A is installed in the transporting space 12A. The substrate rack 16A is located forward of the transport mechanism 13A. The transport mechanism 13A can access the substrate rack 16A. The transport mechanism 6 of the indexer division 3 can also access the substrate rack 16A. The substrate rack 16A receives and holds wafers W transported between the transport mechanism 6 and transport mechanism 13A.

Figure 2:
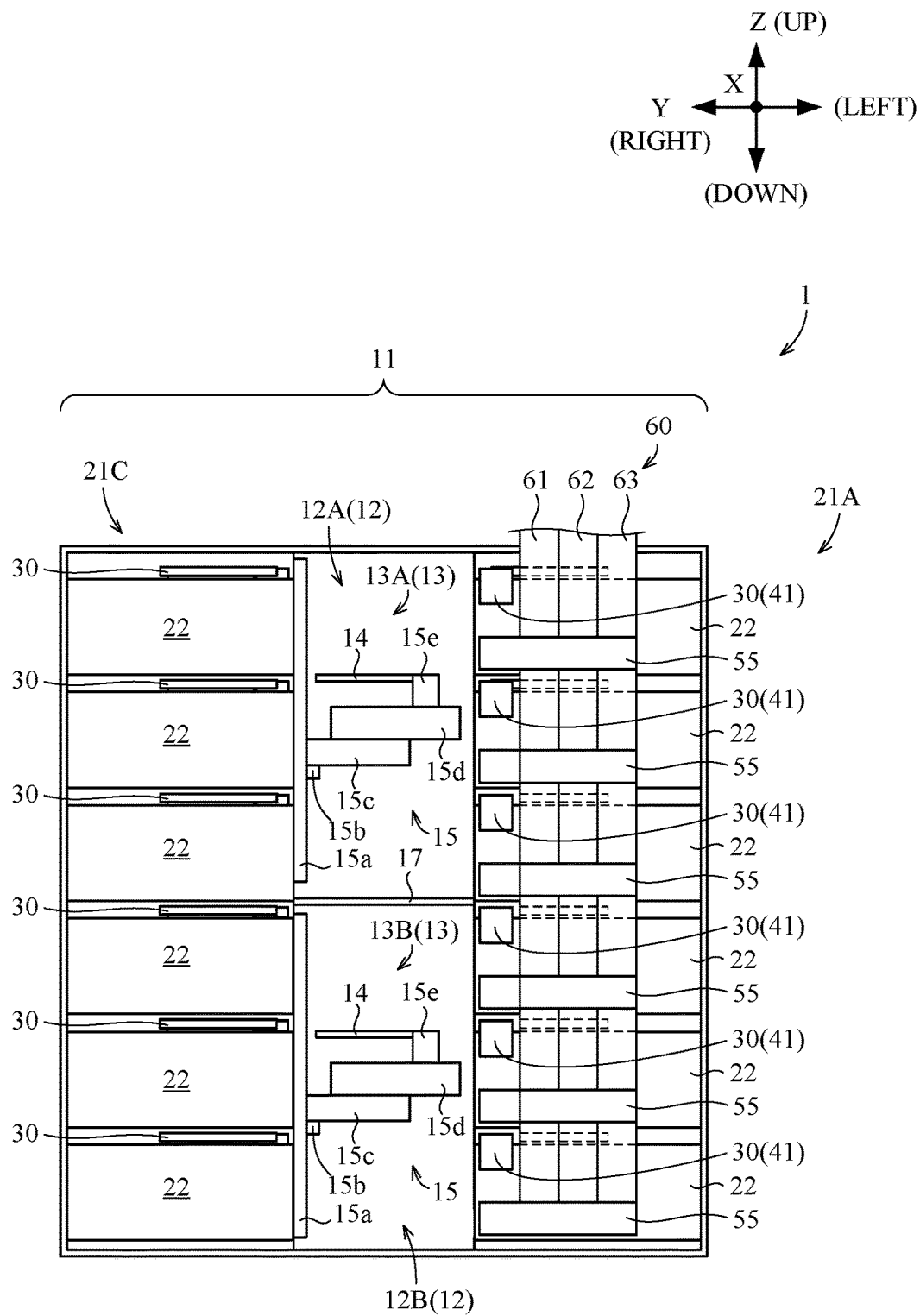
FIG. 2 is a front view of a treating block.

FIG. 2 is a front view of the treating block 11. The treating block 11 includes a transporting space 12B besides the transporting space 12A. The transporting space 12B is located below the transporting space 12A. The transporting space 12B is located, in plan view, in the same position as the transporting space 12A. The transporting space 12B is connected to the transporting space 5 of the indexer division 3.

The treating block 11 has one partition wall 17. The partition wall 17 is located below the transporting space 12A and above the transporting space 12B. The partition wall 17 has a horizontal plate shape. The partition wall 17 separates the transporting space 12A from the transporting space 12B.

The treating block 11 includes a transport mechanism 13B besides the transport mechanism 13A. The transport mechanism 13B is installed in the transporting space 12B. The transport mechanism 13B is installed below the transport mechanism 13A. The transport mechanism 13B transports wafers W.

Although not shown, the treating block 11 includes a substrate rack installed in the transporting space 12B. Thus, the transport mechanism 6 and transport mechanism 13B can transfer wafers W to and from each other.

The transport mechanisms 13A and 13B have the same construction. The transport mechanisms 13A and 13B, when not distinguished, will be called the transport mechanism(s) 13 as appropriate.

The transporting spaces 12A and 12B, when not distinguished, will be called transporting space(s) 12 as appropriate.

The construction of each transport mechanism 13 will be described. The transport mechanism 13 has a hand 14 and a hand driver 15. The hand 14 supports one wafer W in a horizontal position. The hand driver 15 is connected to the hand 14. The hand driver 15 moves the hand 14. The hand driver 15 moves the hand 14 in the longitudinal direction X, transverse direction Y, and vertical direction Z.

The construction of the hand driver 15 is illustrated by way of example. The hand driver 15 has two struts 15a, a vertical mover 15b, a horizontal mover 15c, a rotary member 15d, and an advancing and withdrawing member 15e, for example. The struts 15a are fixedly installed. The struts 15a are arranged laterally of the transporting space 12. The two struts 15a are aligned in the longitudinal direction X. Each strut 15a extends in the vertical direction Z. Each strut 15a supports the vertical mover 15b. The vertical mover 15b extends in the longitudinal direction X between the two struts 15a. The vertical mover 15b makes parallel translation in the vertical direction Z relative to the struts 15a. The vertical mover 15b supports the horizontal mover 15c. The horizontal mover 15c makes parallel translation in the longitudinal direction X relative to the vertical mover 15b. The horizontal mover 15c supports the rotary member 15d. The rotary member 15d is rotatable relative to the horizontal mover 15c. The rotary member 15d rotates about an axis of rotation parallel to the vertical direction Z. The rotary member 15d supports the advancing and withdrawing member 15e. The advancing and withdrawing member 15e supports the hand 14. The advancing and withdrawing member 15e advances and withdraws the hand 14 horizontally relative to the rotary member 15d. The advancing and withdrawing member 15e reciprocates the hand 14 in one horizontal direction determined by an angular position of the rotary member 15d.

With the above hand driver 15, the hand 14 can make parallel transition in the vertical direction Z. The hand 14 can make parallel transition in the longitudinal direction X. The hand 14 is rotatable in a horizontal plane. The hand 14 can advance and retreat relative to the rotary member 15d.

The treating block 11 includes treating towers 21A, 21B, 21C, and 21D. The treating towers 21A and 21B are located leftward of the transporting spaces 12. The treating towers 21A and 21B are aligned in the longitudinal direction X. The treating towers 21C and 21D are located rightward of the transporting spaces 12. The treating towers 21C and 21D are aligned in the longitudinal direction X.

The treating block 11 includes piping spaces 51A, 51B, 51C, and 51D. The piping spaces 51A and 51B are located leftward of the transporting spaces 12. The piping space 51A adjoins the treating tower 21A. The piping space 51B adjoins the treating tower 21B. The piping spaces 51C and 51D are located rightward of the transporting spaces 12. The piping space 51C adjoins the treating tower 21C. The piping space 51D adjoins the treating tower 21D. The piping spaces 51A-51D are separated from the transporting spaces 12 respectively.

Figure 3:
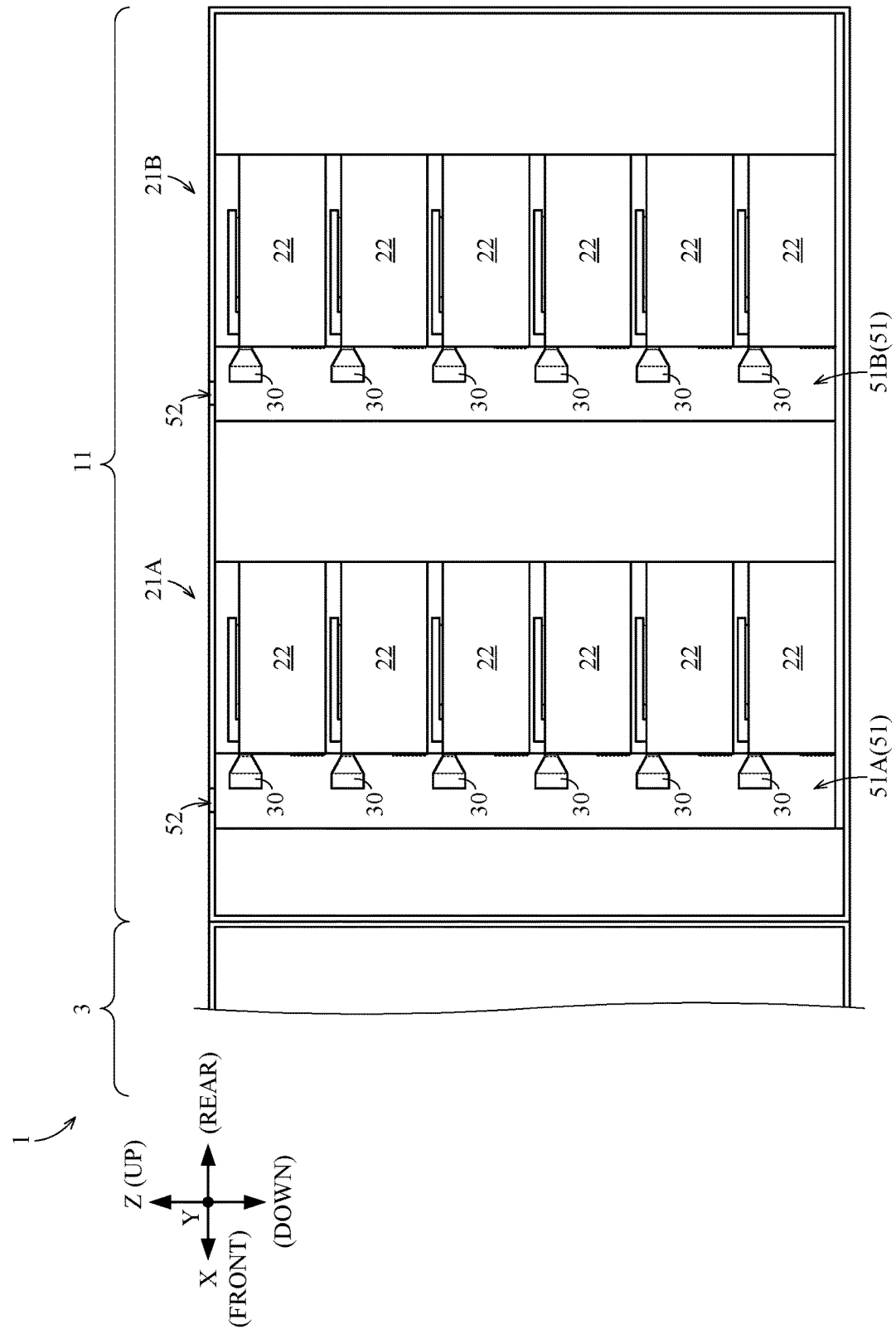
FIG. 3 is a left side view showing a construction of a left part of the substrate treating apparatus.

FIG. 3 is a left side view showing the construction of a left part of the substrate treating apparatus 1. The treating tower 21A includes a plurality of (e.g. six) treating housings 22. All the treating housings 22 belonging to the treating tower 21A are aligned in the vertical direction Z. The treating housings 22 belonging to the treating tower 21A are stacked one over the other.

The piping space 51A extends in the vertical direction Z. The piping space 51A is adjacent to each treating housing 22 belonging to the treating tower 21A.

The piping space 51A is open to the exterior of the substrate treating apparatus 1. For example, the treating block 11 has an opening 52 formed in an upper part of the piping space 51A. The piping space 51A communicates with the exterior of the substrate treating apparatus 1 through the opening 52.

Reference is made to FIG. 2. Each treating housing 22 belonging to the treating tower 21A is adjacent to the transporting space 12. Part of the treating housings 22 belonging to the treating tower 21A adjoin the transporting space 12A. The other treating housings 22 belonging to the treating tower 21A adjoin the transporting space 12B.

Reference is made to FIGS. 1 to 3. The treating tower 21B includes a plurality of (e.g. six) treating housings 22. The treating housings 22 belonging to the treating tower 21B are arranged like the treating housings 22 belonging to the treating tower 21A. The piping space 51B is constructed like the piping space 51A. Consequently, each treating housing 22 belonging to the treating tower 21B adjoins the piping space 51B. Each treating housing 22 belonging to the treating tower 21B adjoins the transporting space 12.

The treating towers 21C and 21D include a plurality of (e.g. six) treating housings 22 respectively. The treating housings 22 belonging to the treating towers 21C and 21D are arranged like the treating housings 22 belonging to the treating tower 21A respectively. The piping spaces 51C and 51D are constructed like the piping space 51A respectively. Consequently, each treating housing 22 belonging to the treating tower 21C adjoins the piping space 51C. Each treating housing 22 belonging to the treating tower 21C adjoins the transporting spaces 12. Each treating housing 22 belonging to the treating tower 21D adjoins the piping space 51D. Each treating housing 22 belonging to the treating tower 21D adjoins the transporting space 12.

The transport mechanisms 13 transport wafers W to all the treating housings 22 belonging to the treating towers 21A-21D. Specifically, the transport mechanism 13A transports wafers W to the treating housings 22 adjoining the transporting space 12A. The transport mechanism 13B transports wafers W to the treating housings 22 adjoining the transporting space 12B.

Reference is made to FIG. 1. The treating housing 22 and transporting space 12 are arranged in the transverse direction Y in plan view. For example, the treating housing 22 belonging to the treating tower 21A and the transporting space 12 are arranged next to each other in the transverse direction Y in plan view. For example, the treating housing 22 belonging to the treating tower 21C and the transporting space 12 are arranged next to each other in the transverse direction Y in plan view.

The piping spaces 51A-51D, when not distinguished, will be called piping space(s) 51 as appropriate. The treating housings 22 and piping spaces 51 are aligned in the longitudinal direction X in plan view. For example, the treating housing 22 belonging to the treating tower 21A and the piping space 51A adjoining the treating tower 21A are arranged next to each other in the longitudinal direction X in plan view. For example, the treating housing 22 belonging to the treating tower 21C and the piping space 51C adjoining the treating tower 21C are aligned in the longitudinal direction X in plan view.

One treating housing 22 is an example of the first treating housing in this invention.

2. Construction Inside Treating Housing 22

Reference is made to FIG. 1. The treating housings 22 belonging to the treating towers 21A-21D have the same construction. The treating housings 22 treat wafers W inside. Each treating housing 22 demarcates a treating space for treating the wafers W inside. The substrate treating apparatus 1 includes substrate holders 26 and dispensing units 27. The substrate holder 26 is disposed inside each treating housing 22. The substrate holder 26 holds the wafers W. The dispensing units 27 are disposed inside each treating housing 22. The dispensing units 27 dispense treating liquids to the wafers W held by the substrate holder 26.

Figure 4:
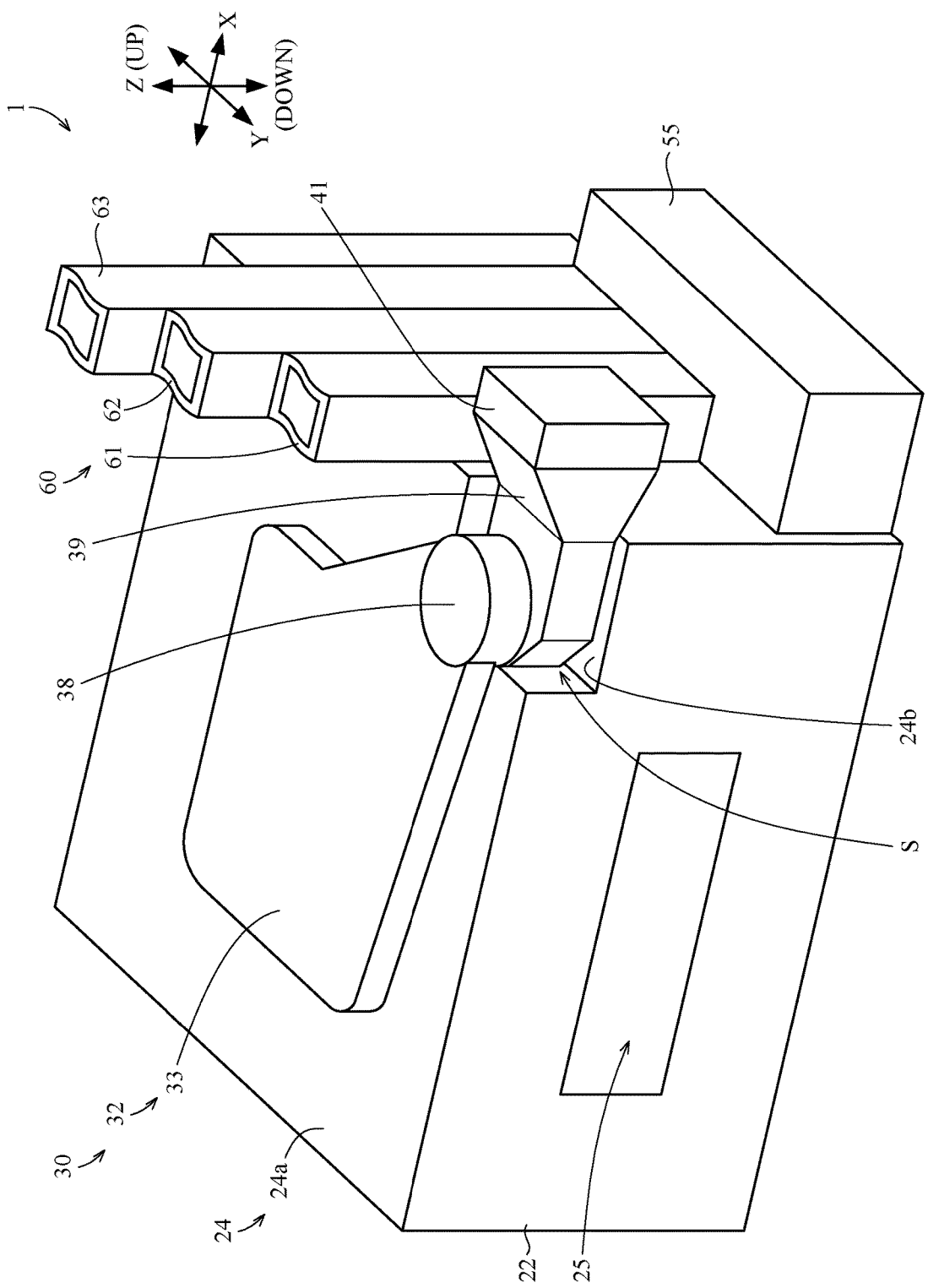
FIG. 4 is a perspective view of a treating housing.
Figure 5:
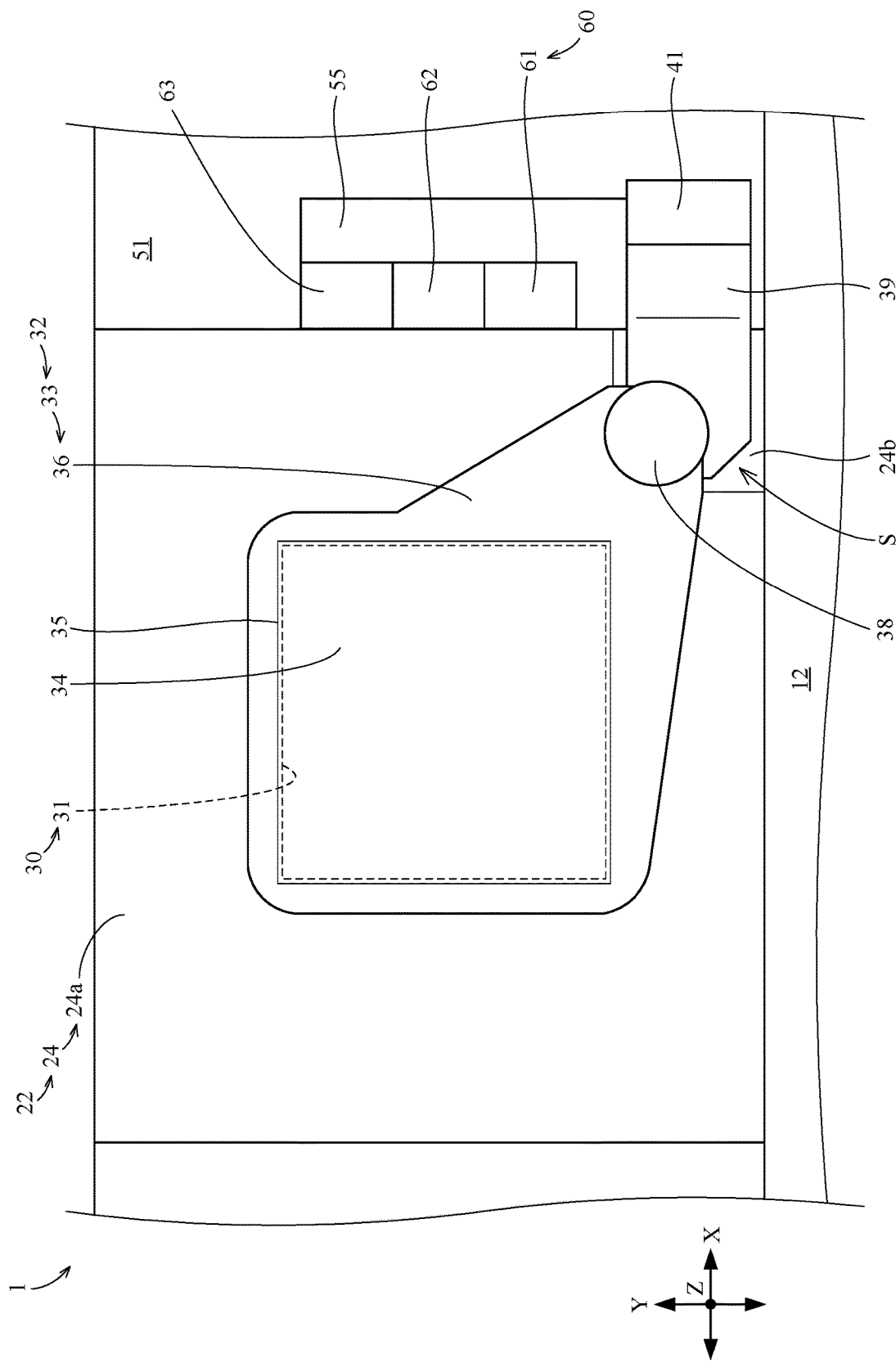
FIG. 5 is a plan view of the treating housing.
Figure 6:
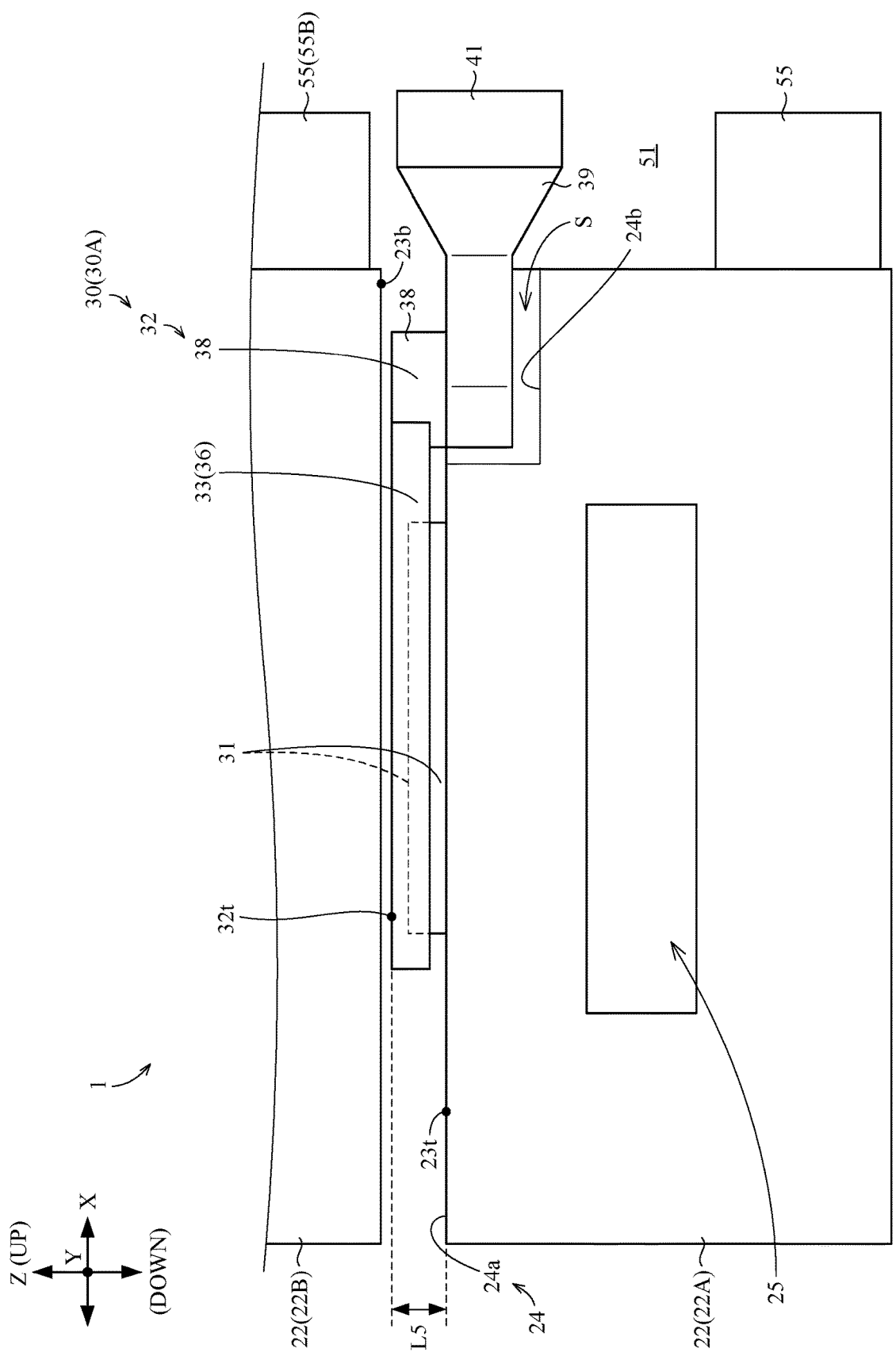
FIG. 6 is a side view of the treating housing.
Figure 7:
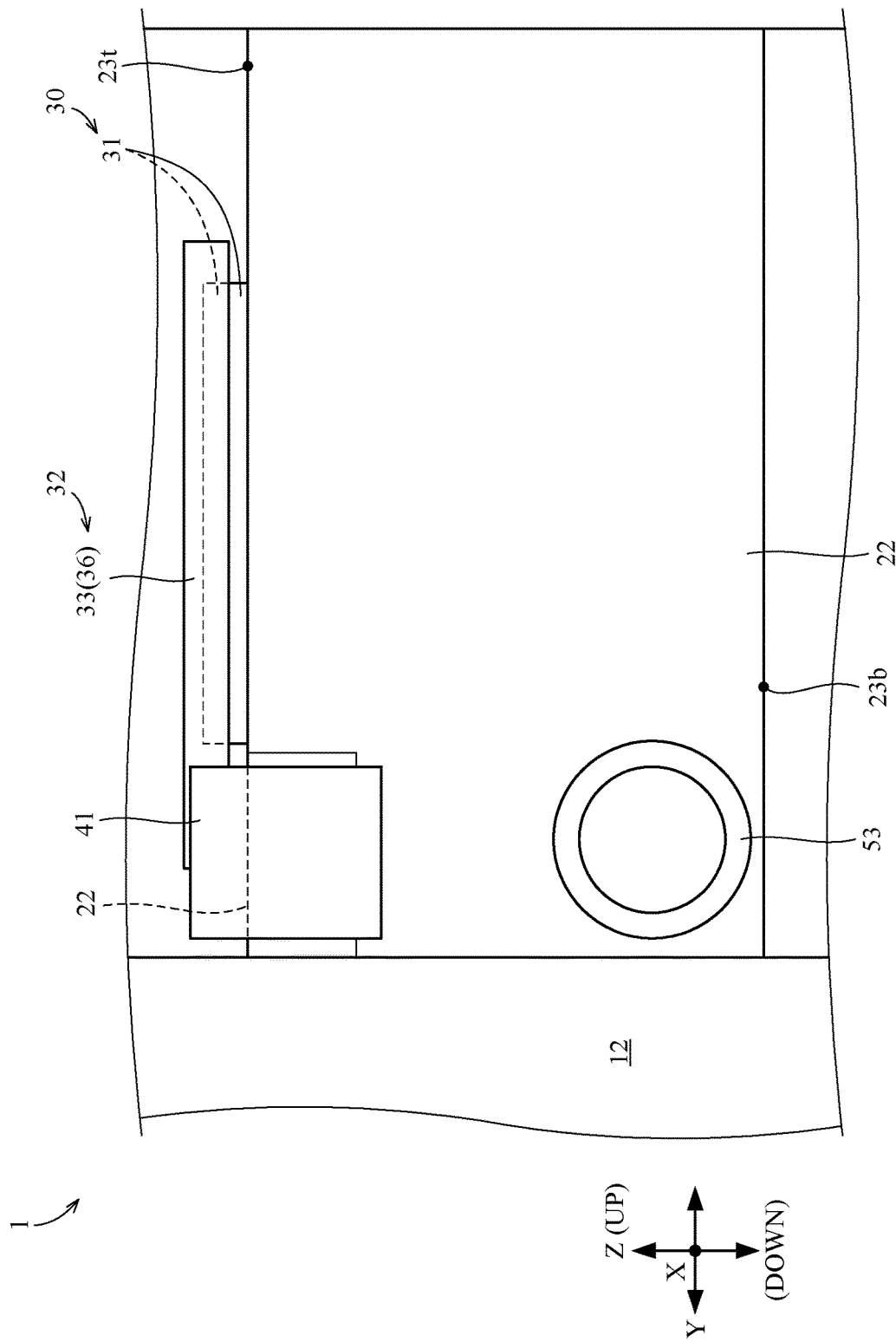
FIG. 7 is a front view of the treating housing.

FIG. 4 is a perspective view of a treating housing 22. FIG. 5 is a plan view of the treating housing 22. FIG. 6 is a side view of the treating housing 22. FIG. 6 is a view of the treating housing 22 seen from the transverse direction Y. FIG. 7 is a front view of the treating housing 22. FIG. 7 is a view of the treating housing 22 seen from the longitudinal direction X. The treating housing 22 is substantially box-shaped.

The treating housing 22 has a transport port 25. The transport port 25 is located in a position adjoining the transporting space 12. The transport port 25 faces the transporting space 12. Wafers W can pass through the transport port 25. The transport mechanism 13 transports wafers W into the treating housing 22. The transport mechanism 13 transports wafers W to the substrate holder 26 through the transport port 25.

Figure 8:
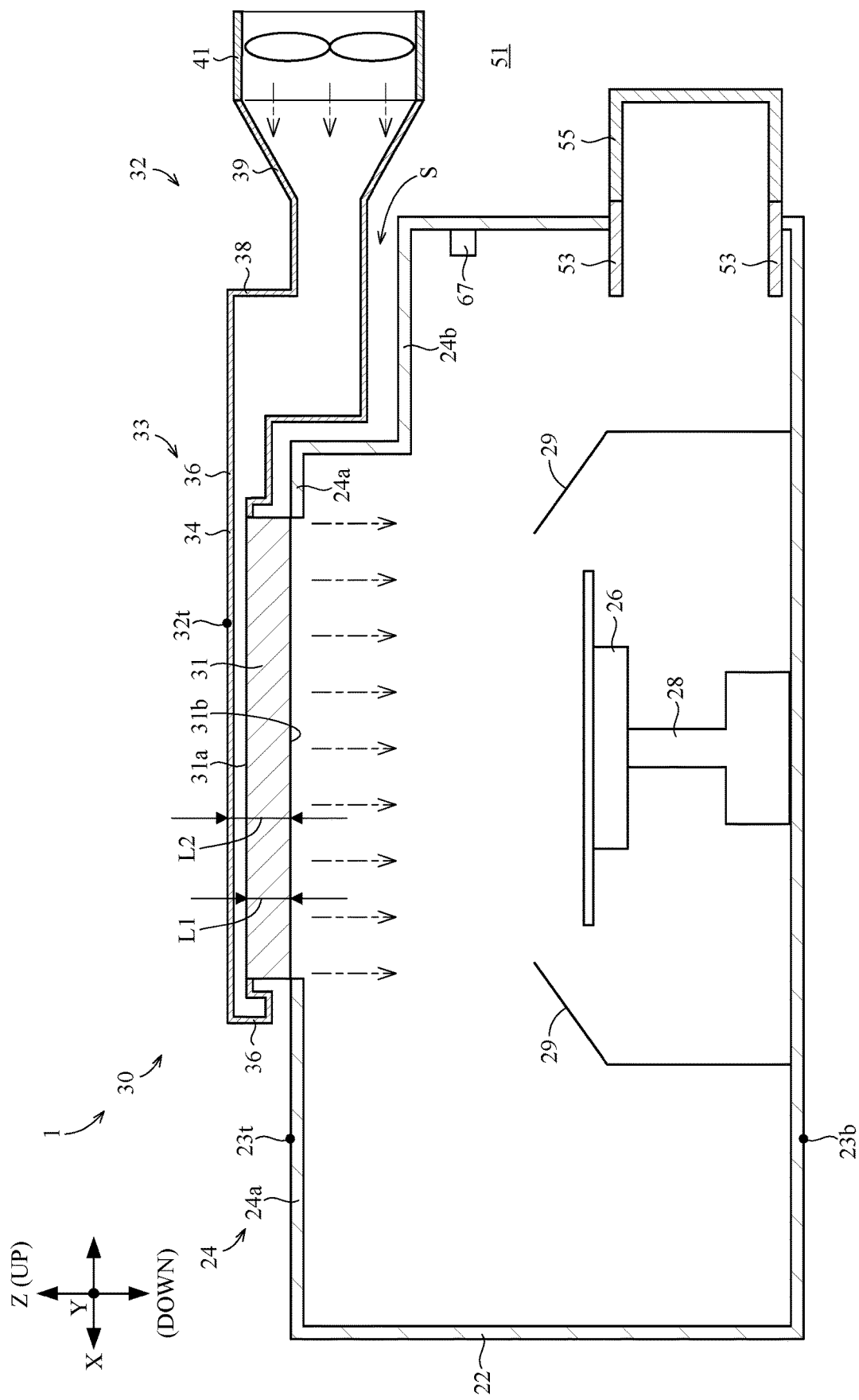
FIG. 8 is a view in vertical section of the treating housing.

FIG. 8 is a view in vertical section of the treating housing 22. FIG. 8 omits illustration of the dispensing units 27 for expediency. The substrate holder 26 holds one wafer W in a horizontal position.

The substrate treating apparatus 1 includes a spin driver 28. The spin driver 28 is installed inside the treating housing 22. The spin driver 28 is connected to the substrate holder 26. The spin driver 28 spins the substrate holder 26. The wafer W held by the substrate holder 26 spins integrally with the substrate holder 26.

The substrate treating apparatus 1 includes a cup 29. The cup 29 is installed inside the treating housing 22. The cup 29 has a substantially cylindrical shape. The cup 29 is located around the substrate holder 26. The cup 29 receives treating liquids scattering from the wafer W held by the substrate holder 26.

The treating housing 22 has a top plate 24. The top plate 24 is disposed in an upper part of the treating housing 22. The top plate 24 extends substantially horizontally.

The top plate 24 has a recess space S indented downward. Specifically, the top plate 24 has a first top plate portion 24a and a second top plate portion 24b. The second top plate portion 24b is lower than the first top plate portion 24a. The second top plate portion 24b is located in a height position lower than the first top plate portion 24a in the vertical direction Z. The first top plate portion 24a is located over the substrate holder 26. The second top plate portion 24b is located in a position close to the piping space 51. The recess space S is located over the second top plate portion 24b.

3. Construction of Gas Supply Unit

Reference is made to FIGS. 2 and 3. The substrate treating apparatus 1 includes a plurality of (e.g. 24) gas supply units 30. The gas supply units 30 supply a gas (e.g. air) to the interiors of the treating housings 22.

One gas supply unit 30 is provided for each treating housing 22. Each gas supply unit 30 supplies the gas only to one treating housing 22. Each gas supply unit 30 does not supply the gas to more than one treating housing 22.

One gas supply unit 30 is an example of the first gas supply unit in this invention.

FIG. 8 shows the entirety of one gas supply unit 30 for expediency. The gas supply unit 30 has a filter 31, a duct 32, and a fan 41. The filter 31 is located in the upper part of the treating housing 22. The filter 31 blows the gas out into the treating housing 22. The duct 32 is located outside the treating housing 22. The duct 32 is connected to the filter 31. The fan 41 is located outside the treating housing 22. The fan 41 is connected to the duct 32.

The filter 31 is installed on the top plate 24. The filter 31 is installed on the first top plate portion 24a. The filter 31 is located over the substrate holder 26.

The fan 41 sends the gas. The gas flows from the fan 41 through the duct 32 into the filter 31. One fan 41 sends the gas only to one filter 31. The filter 31 filters the gas. The filter 31 blows out the filtered gas. The filter 31 is a ULPA (Ultra Low Penetration Air) filter, for example. The gas flows from the filter 31 into the treating housing 22. One fan 41 sends the gas only to one treating housing 22. The quantity of ventilation of one fan 41 corresponds to the feed rate of the gas to one treating housing 22.

The fan 41 sends the gas horizontally. The filter 31 blows out the gas downward. FIG. 8 schematically shows currents of the gas blown from the fan 41 and currents of the gas blown out of the filter 31. The blowing direction of the fan 41 is different from the blowout direction of the filter 31. For example, the blowing direction of the fan 41 is perpendicular to the blowout direction of the filter 31.

The gas blown out of the filter 31 reaches the substrate holder 26. The downward gas currents (downflows) are formed around the wafer W held by the substrate holder 26.

The arrangement of the treating housing 22, filter 31, duct 32, and fan 41 will be described now.

At least part of the filter 31 is located in a position higher than the treating housing 22. For example, the whole of the filter 31 is located in a position higher than the treating housing 22. For example, the whole of the filter 31 is located above the treating housing 22.

Part of the duct 32 is located in a position higher than the treating housing 22. The other part of the duct 32 is located in the same height position as the treating housing 22. Specifically, the treating housing 22 has an upper end 23t and a lower end 23b. For example, the height position of the top plate 24 corresponds to the upper end 23t. For example, the height position of the first top plate portion 24a corresponds to the upper end 23t. Part of the duct 32 is located in a position higher than the upper end 23t. The other part of the duct 32 is located in a height position equal to or lower than the upper end 23t and equal to or higher than the lower end 23b. The whole of the duct 32 is located in a height position equal to or higher than the lower end 23b.

At least part of the duct 32 is located above the treating housing 22. The duct 32 is located close to the top plate 24. The duct 32 extends along the top plate 24.

The duct 32 extends from the filter 31 to a position lower than the filter 31. Specifically, the duct 32 has a portion located in a position higher than the filter 31 and a portion located in a position lower than the filter 31. Consequently, the duct 32 extends from the position higher than the filter 31 to the position lower than the filter 31.

The duct 32 has a portion located above the filter 31. The duct 32 covers an area over the filter 31. The duct 32 extends substantially horizontally from the filter 31. The duct 32 extends from the filter 31 to the piping space 51.

At least part of the fan 41 is located in the same height position as the treating housing 22. At least part of the fan 41 is located in a height position equal to or lower than the upper end 23t and equal to or higher than the lower end 23b. The whole of the fan 41 is located in a position higher than the lower end 23b.

The fan 41 includes a portion located in a position higher than the treating housing 22. Consequently, the fan 41 extends from the position higher than the upper end 23t to the position lower than the upper end 23t.

The fan 41 includes a portion located in a position lower than the second top plate portion 24b. Consequently, the fan 41 extends from the position higher than the first top plate portion 24a to the position lower than the second top plate portion 24b.

The fan 41 is located sideways from the treating housing 22. The whole fan 41 is located sideways from the treating housing 22. The fan 41 is not located above the treating housing 22.

At least part of the fan 41 is located in a position lower than the filter 31. At least part of the fan 41 is located in a height position lower than the filter 31 in the vertical direction Z.

The fan 41 includes a portion located in a position higher than the filter 31. Consequently, the fan 41 extends from the position higher than the filter 31 to the position lower than the filter 31.

The fan 41 is located sideways from the filter 31. The whole of the fan 41 is located sideways from the filter 31. The fan 41 is not located above the filter 31. The filter 31 and fan 41 are out of alignment in the vertical direction Z.

At least part of the fan 41 is located in a height position equal to or lower than the duct 32. Specifically, the duct 32 has an upper end 32t. At least part of the fan 41 is located in a height position equal to or lower than the upper end 32t.

In this embodiment, the whole of the fan 41 is located in a position lower than the upper end 32t. The upper end 32t corresponds to an upper end of the gas supply unit 30.

FIG. 5 shows the filter 31 in a broken line. The filter 31 has a substantially rectangular shape in plan view. The whole of the filter 31 overlaps the treating housing 22 in plan view.

A large part of the duct 32 overlaps the treating housing 22 in plan view. The other part of the duct 32 does not overlap the treating housing 22 in plan view. The other part of the duct 32 is located in the piping space 51.

The duct 32 overlaps the whole of the filter 31 in plan view.

The fan 41 is, in plan view, located in a position not overlapping the treating housing 22. The fan 41 has no portion thereof overlapping the treating housing 22 in plan view.

The fan 41 is, in plan view, located in a position not overlapping the filter 31. The fan 41 has no portion thereof overlapping the filter 31 in plan view.

The fan 41 is located in the piping space 51. For example, the whole of the fan 41 is located in the piping space 51.

The fan 41 is open to the piping space 51. The fan 41 takes in the gas from the piping space 51. The fan 41 sends the gas from the piping space 51 to the filter 31.

FIG. 6 shows part of the filter 31 in a broken line. Part of the duct 32 overlaps the filter 31 in the side view of the treating housing 22. The fan 41 does not overlap the treating housing 22 in the side view of the treating housing 22. In this specification, the term "in the side view" is synonymous with "as seen from the transverse direction Y".

FIG. 7 shows part of the treating housing 22 in a broken line. Part of the duct 32 overlaps the filter 31 in the front view of the treating housing 22. At least part of the fan 41 overlaps the treating housing 22 in the front view of the treating housing 22. In this specification, the term "in the front view" is synonymous with "as seen from the longitudinal direction X".

4. Detailed Constructions of Filter 31 and Duct 32

Reference is made to FIG. 8. The filter 31 extends horizontally. The filter 31 has a flat shape. FIG. 8 shows a length L1 of the filter 31 in the vertical direction. The length L1 of the filter 31 in the vertical direction Z is shorter than a length of the filter 31 in a horizontal direction.

The filter 31 has an upper surface 31a and a lower surface 31b. The upper surface 31a and lower surface 31b are substantially horizontal respectively. The filter 31 takes in the gas from the upper surface 31a. The filter 31 puts out the gas from the lower surface 31b. The lower surface 31b corresponds to the blowoff surface of the filter 31.

The upper surface 31a of the filter 31 is located in a position higher than the treating housing 22. The lower surface 31b of the filter 31 is located in substantially the same height position as the first top plate portion 24a.

Reference is made to FIGS. 4 and 6. The duct 32 has a first horizontal portion 33, a vertical portion 38, and a second horizontal portion 39. The first horizontal portion 33 extends horizontally from the filter 31. The vertical portion 38 extends downward from the first horizontal portion 33. The second horizontal portion 39 extends horizontally from the vertical portion 38 to the fan 41. At least part of the second horizontal portion 39 is located in a position lower than the first horizontal portion 33. At least part of the second horizontal portion 39 is, in the vertical direction Z, located in a height position lower than the first horizontal portion 33. For example, the whole of the second horizontal portion 39 is located in a position lower than the first horizontal portion 33.

Reference is made to FIG. 5. The whole of the first horizontal portion 33 overlaps the treating housing 22 in plan view. The whole of the vertical portion 38 overlaps the treating housing 22 in plan view. The second horizontal portion 39 has a part overlapping the treating housing 22 and a part not overlapping the treating housing 22 in plan view.

The first horizontal portion 33 overlaps the whole of the filter 31 in plan view. The vertical portion 38 does not overlap the filter 31 in plan view. The second horizontal portion 39 does not overlap the filter 31 in plan view.

The first horizontal portion 33 has a flat part 34. The flat part 34 has an edge region 35. The flat part 34 has a substantially rectangular shape in plan view.

The flat part 34 overlaps the whole of the filter 31 in plan view. The flat part 34 is substantially the same size as the filter 31 in plan view. The flat part 34 is slightly larger than the filter 31 in plan view.

The first horizontal portion 33 has an outer groove region 36. The outer groove region 36 is located around the flat part 34 in plan view. The outer groove region 36 forms a loop around the flat part 34 in plan view. The outer groove region 36 is communicatively connected to the edge region 35 of the flat part 34. Specifically, the outer groove region 36 communicates with the edge region 35 of the flat part 34. The outer groove region 36 is connected to the edge region 35 of the flat part 34. The outer groove region 36 is connected to the entire edge region 35 of the flat part 34. The outer groove region 36 is connected to the entire circumference of the edge region 35 of the flat part 34.

The outer groove region 36 forms a loop around the filter 31 in plan view. The outer groove region 36 does not overlap the filter 31 in plan view.

The outer groove region 36 extends from part of the edge region 35 of the flat part 34 to the vertical portion 38. The flat part 34 is indirectly connected to the vertical portion 38 through the outer groove region 36. The vertical portion 38 sends the gas to the outer groove region 36. The outer groove region 36 sends the gas to the flat part 34. The flat part 34 blows out the gas downward. The flat part 34 feeds the gas to the filter 31.

Reference is made to FIG. 8. The first horizontal portion 33 is located above the first top plate portion 24a. The first horizontal portion 33 extends along the first top plate portion 24a. The vertical portion 38 is located above the second top plate portion 24b. The vertical portion 38 extends to a position lower than the first top plate portion 24a. The second horizontal portion 39 is located above the second top plate portion 24b. At least part of the second horizontal portion 39 is located in a position lower than the first top plate portion 24a. The vertical portion 38 and second horizontal portion 39 are arranged in the recess space S respectively. The second horizontal portion 39 extends along the second top plate portion 24b. The second horizontal portion 39 extends to the piping space 51.

The first horizontal portion 33 includes the upper end 32t of the duct 32.

The flat part 34 extends horizontally. The flat part 34 is located over the filter 31. The flat part 34 covers areas over the filter 31. The flat part 34 is placed close to the filter 31. The flat part 34 blows out the gas downward.

As noted above, FIG. 8 shows the length L1 of the filter 31 in the vertical direction Z. FIG. 8 further shows a total length L2 of the flat part 34 and filter 31 in the vertical direction Z. The length L2 is larger than the length L1. The length L2 is smaller than twice the length L1.

The outer groove region 36 extends downward from flat part 34. The outer groove region 36 extends to a position lower than the upper surface 31a of the filter 31. The whole of the outer groove region 36 is located in a position higher than the lower surface 31b of the filter 31. The outer groove region 36 is located laterally of and close to the filter 31.

The outer groove region 36 does not extend upward from the flat part 34. The outer groove region 36 does not extend to a position higher than the flat part 34. The whole of the outer groove region 36 is located in a height position equal to or lower than the flat part 34.

The first horizontal portion 33 appearing in FIG. 6 corresponds to the outer groove region 36. The outer groove region 36 extends substantially horizontally. At least part of the outer groove region 36 overlaps the filter 31 in the side view of the treating housing 22.

The first horizontal portion 33 appearing in FIG. 7 corresponds to the outer groove region 36. At least part of the outer groove region 36 overlaps the filter 31 in the front view of the treating housing 22.

Figure 9:
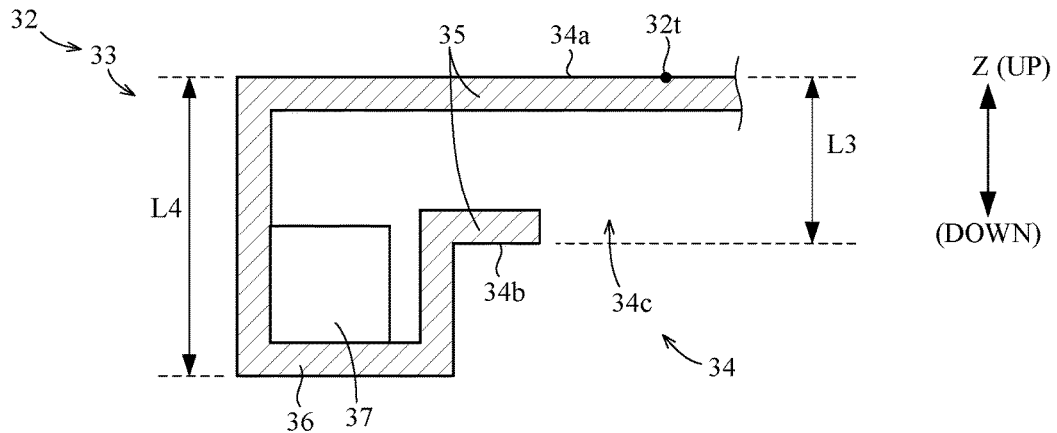
FIG. 9 is a view in vertical section of a portion of a duct.

FIG. 9 is a view in vertical section of a portion of the duct 32. The flat part 34 has an upper surface 34a. The height position of the upper surface 34a corresponds to the upper end 32t of the duct 32. The height position of the upper surface 34a corresponds to the upper end of the gas supply unit 30.

The flat part 34 has a lower surface 34b and an opening 34c. The lower surface 34b and opening 34c are located below the upper surface 34a. The opening 34c is formed in the lower surface 34b. The opening 34c takes up a large part of the lower surface 34b. The position of the lower surface 34b corresponds to the position of the edge region 35 of the flat part 34.

The opening 34c is substantially the same size as the filter 31 in plan view. The opening 34c is located over the upper surface 31a of the filter 31. The opening 34c is located close to the upper surface 31a of the filter 31. The flat part 34 blows out the gas from the opening 34c. The flat part 34 feeds the gas to the filter 31 through the opening 34c.

The outer groove region 36 extends downward from the edge region 35 of the flat part 34.

FIG. 9 shows a length L3 of the flat part 34 in the vertical direction Z. Length L3 is smaller than length L1. FIG. 9 shows a length L4 of the outer groove region 36 in the vertical direction Z. Length L4 is larger than length L3.

Figure 10:
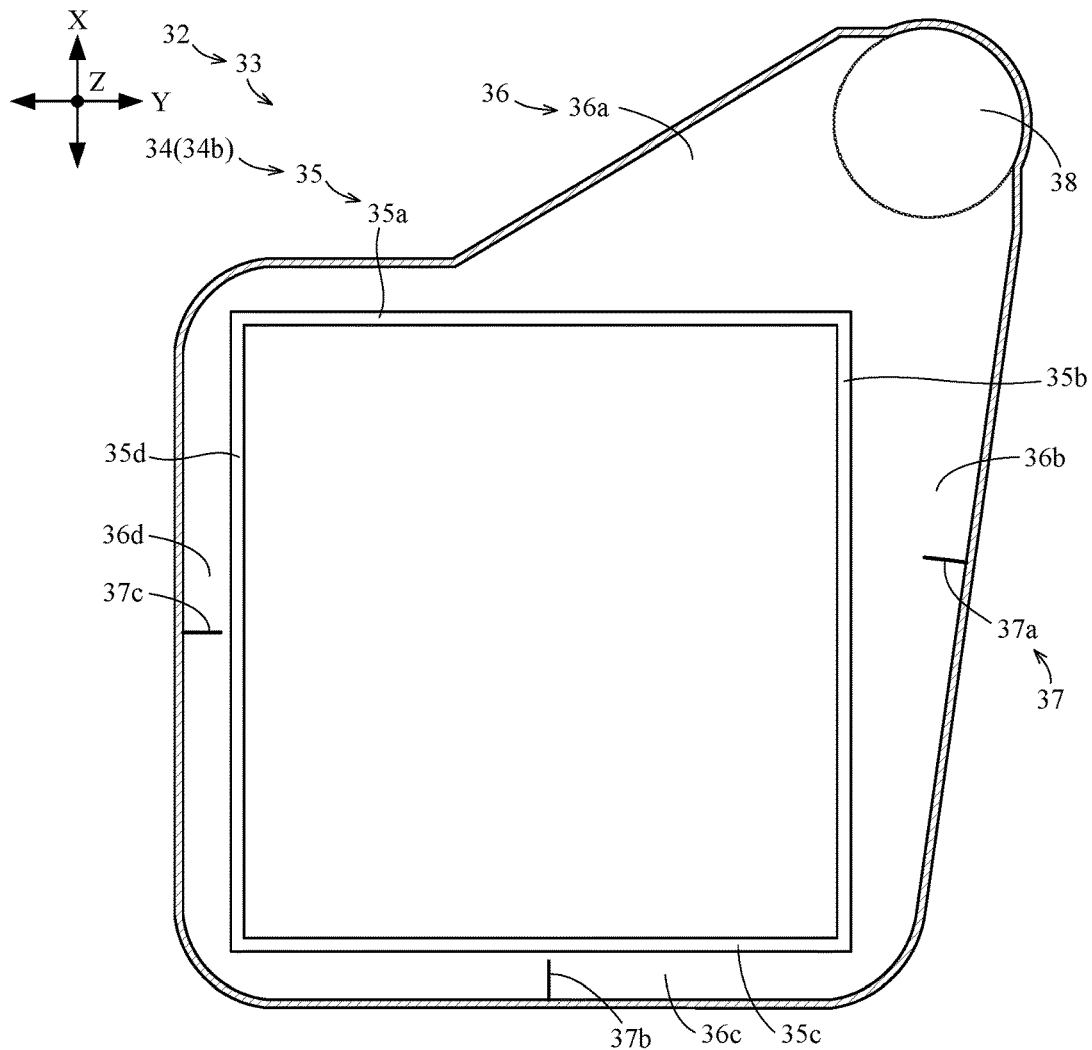
FIG. 10 is a view in horizontal section of a portion of the duct.

FIG. 10 is a view in horizontal section of a portion of the duct 32. The edge region 35 includes a first side 35a, a second side 35b, a third side 35c, and a fourth side 35d. The outer groove region 36 includes a first part 36a, a second part 36b, a third part 36c, and a fourth part 36d. The first part 36a is connected to the first side 35a. The first part 36a extends along the first side 35a. Similarly, the second to fourth parts 36b-36d are connected to the second to fourth sides 35b-35d respectively. The second to fourth parts 36b-36d extend along the second to fourth sides 35b-35d respectively. The first to fourth parts 36a-36d are connected together to form a loop.

The first part 36a and second part 36b extend to the vertical portion 38 respectively. The first part 36a and second part 36b are close to the vertical portion 38. The third part 36c and fourth part 36d are far from the vertical portion 38. The third part 36c is smaller than the first part 36a and second part 36b in plan view. The fourth part 36d is smaller than the first part 36a and second part 36b in plan view.

The duct 32 has one or more baffle plates 37. The baffle plates 37 are also called baffles. The baffle plates 37 are installed in the outer groove region 36. The baffle plates 37 guide part of the gas flowing through the outer groove region 36 to the flat part 34.

The baffle plates 37 intersect the directions in which the outer groove region 36 extends. The baffle plates 37 orthogonally cross the directions in which the outer groove region 36 extends, for example. The baffle plates 37 have a substantially vertical plate shape, for example.

The baffle plates 37 narrow flow paths of the outer groove region 36. The baffle plates 37 block only part of the flow paths of the outer groove region 36. The baffle plates 37 are located only in lower parts of the outer groove region 36, for example.

In this embodiment, the duct 32 has three baffle plates 37. These baffle plates 37 are distinguished from one another by calling them baffle plates 37a, 37b, and 37c. The baffle plate 37a is installed in the second part 36b. The baffle plate 37b is installed in the third part 36c. The baffle plate 37b is, in plan view, located in the middle of the third part 36c in the direction in which the third part 36c extends. The baffle plate 37c is installed in the fourth part 36d. The baffle plate 37c is, in plan view, located in the middle of the fourth part 36d in the direction in which the fourth part 36d extends.

Figure 11:
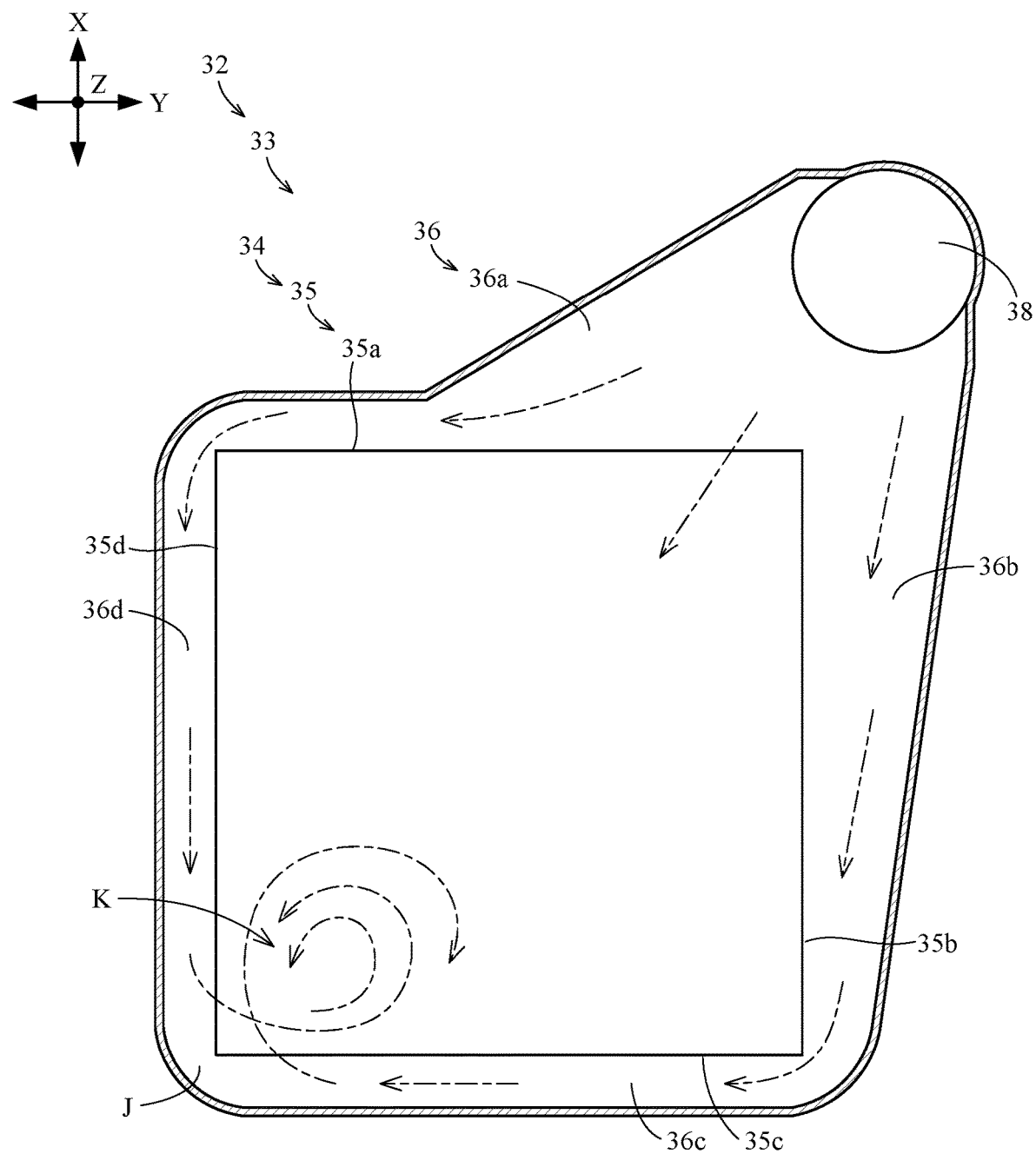
FIG. 11 is a view schematically showing currents of a gas in a flat part and an outer groove region.
Figure 12:
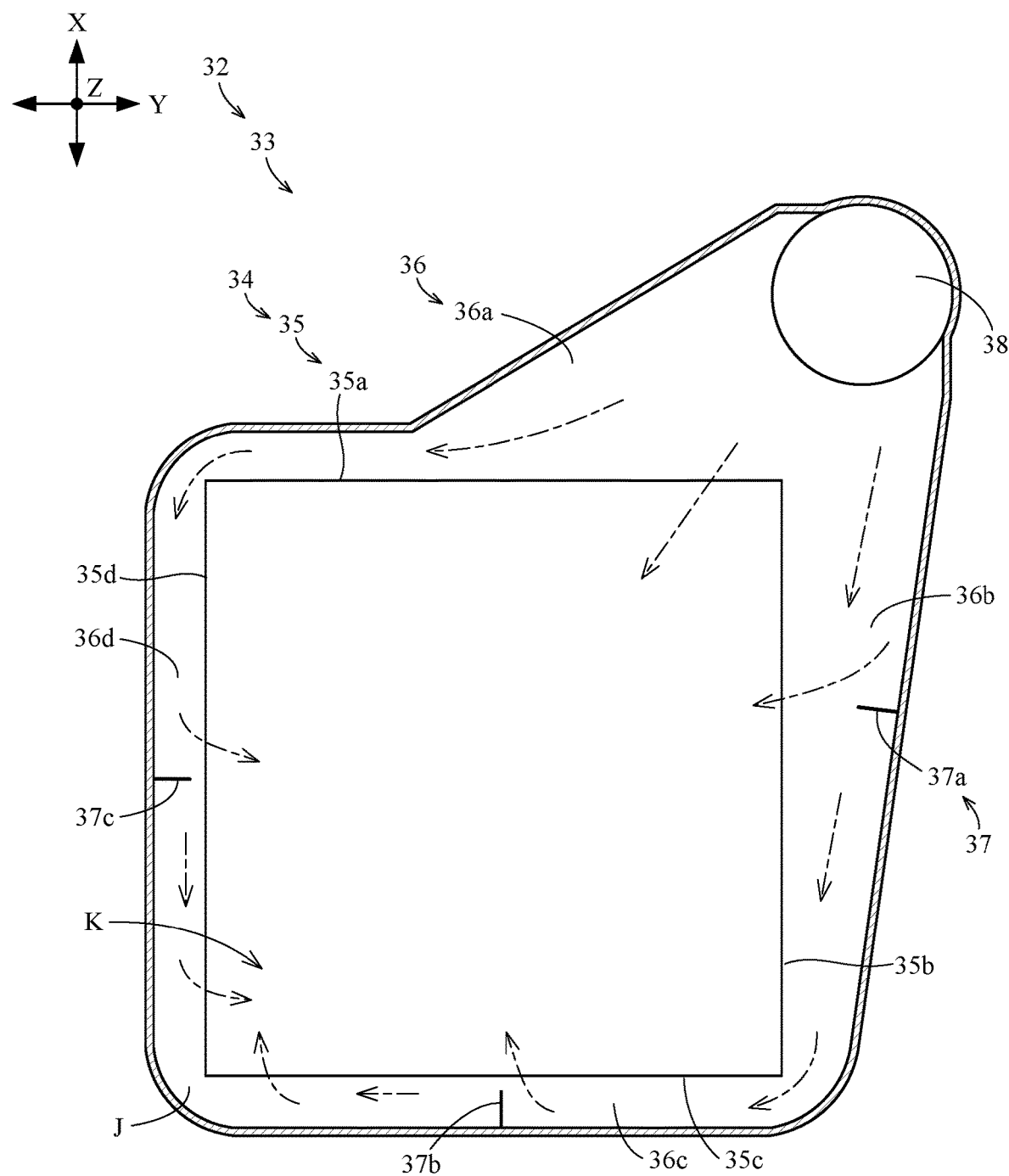
FIG. 12 is a view schematically showing currents of the gas in the flat part and outer groove region.

The effect of the baffle plates 37 will be described. Inventors herein did simulations of gas currents in the flat part 34 and outer groove region 36. FIGS. 11 and 12 are views schematically showing simulation results. FIGS. 11 and 12 each schematically show gas currents in the flat part 34 and outer groove region 36.

FIG. 11 shows simulation results in the case of the duct 32 not provided with the baffle plates 37. When the duct 32 is not provided with the baffle plates 37, the gas tends to whirl around in the flat part 34.

Specifically, when the baffle plates 37 are not installed, the gas tends to flow in the directions in which the outer groove region 36 extends. When the baffle plates 37 are not installed, the gas does not easily flow from the outer groove region 36 to the flat part 34. For example, the quantity of gas that flows from the first part 36a to the fourth part 36d is relatively large. In other words, the quantity of gas that flows from the first part 36a to the first side 35a is relatively small. The quantity of gas that flows from the second part 36b to the third part 36c is relatively large. In other words, the quantity of gas that flows from the second part 36b to the second side 35b is relatively small. The place where the third part 36c and fourth part 36d are connected to each other will be called "connection J". The quantity of gas that flows from the third part 36c to the connection J is relatively large. The quantity of gas that flows from the fourth part 36d to the connection J is relatively large. The gas hits and bounces off the connection J, and then flows to the flat part 34. Consequently, the quantity of gas that flows from the connection J to the third side 35c and fourth side 35d of the flat part 34 is relatively large. The area of the flat part 34 near the connection J will be called "deep area K". The deep area K is liable to vortex gas currents. The gas tends to whirl around in the deep area K. In an area where the gas whirls around, a large part of the gas flows substantially horizontally and only little gas flows downward. As a result, in the area where vortex gas currents have occurred, the quantity or speed of the gas that flows downward decreases remarkably. The gas blown out of the flat part 34 is remarkably uneven over the entire flat part 34. In the area where vortex gas currents have occurred, the quantity or speed of the gas that flows from the flat part 34 to the filter 31 decreases remarkably. The gas that flows from the flat part 34 to the filter 31 is remarkably erratic over the entire flat part 34.

FIG. 12 shows simulation results in the case of the duct 32 having the baffle plates 37. When the duct 32 has the baffle plates 37, the gas does not easily whirl around in the flat part 34.

Specifically, when the baffle plates 37 are installed, the gas easily flows from the outer groove region 36 to the flat part 34. When the baffle plates 37 are installed, the gas does not easily flow in the directions in which the outer groove region 36 extends. For example, the baffle plate 37a increases the quantity of gas that flows from the second part 36b to the second side 35b. The baffle plate 37a decreases the quantity of gas that flows from the second part 36b to the third part 36c. The baffle plate 37b increases the quantity of gas that flows from the third part 36c to the third side 35c. The baffle plate 37b decreases the quantity of gas that flows from the third part 36c to the connection J. The baffle plate 37c increases the quantity of gas that flows from the fourth part 36d to the fourth side 35d. The baffle plate 37c decreases the quantity of gas that flows from the fourth part 36d to the connection J. As a result, the quantity of gas that flows from the connection J to the flat part 34 decreases. There is little chance of vortex gas currents occurring in the deep area K. Vortex gas currents do not easily occur in the areas other than the deep area K of the flat part 34, either. That is, vortex gas currents do not easily occur in the entire flat part 34. As a result, the gas blows off from the flat part 34 substantially uniformly over the entire flat part 34. The gas flows substantially uniformly from the entire flat part 34 into the filter 31.

Inventors herein did simulations also of a flow speed distribution on the blowoff surface of the filter 31. The blowoff surface of the filter 31 is the lower surface 31b. Simulation results in the case of the duct 32 not provided with the baffle plates 37 are as follows:

average speed of gas in entire blowoff surface Va1: 0.18 m/s maximum speed of gas Vmax1: 0.194 m/s minimum speed of gas Vmin1: 0.153 m/s speed uniformity U1: 23%

Here, the speed uniformity U1 is a value obtained from a difference between the maximum speed Vmax1 and minimum speed Vmin1 divided by the average speed Va1.

$U1=(Vmax1-Vmin1)/Va1*100$

Although not shown, a portion of the filter 31 located directly under the deep area K will be called "deep area F". The speed of the gas in the deep area F is remarkably lower than the average speed Va1. The speed of the gas in the deep area F is close to the minimum speed Vmin1.

Simulation results in the case of the duct 32 having the baffle plates 37 are as follows:

average speed of gas in entire blowoff surface Va2: 0.18 m/s maximum speed of gas Vmax2: 0.190 m/s minimum speed of gas Vmin2: 0.176 m/s speed uniformity U2: 8%

Here, the speed uniformity U2 is a value obtained from a difference between the maximum speed Vmax2 and minimum speed Vmin2 divided by the average speed Va2.

$U2=(Vmax2-Vmin2)/Va2*100$

Thus, the flow speed from the blowoff surface of the filter 31 is effectively uniformed by the baffle plates 37. The baffle plates 37 improve the uniformity of the flow speed on the blowoff surface of the filter 31. As a result, the filter 31 blows off the gas from the blowoff surface thereof substantially uniformly.

Reference is made to FIG. 8. In this embodiment, no flow straightener member is provided below the filter 31 or above the substrate holder 26. A flow straightener member is a member for straightening the gas currents. The flow straightener member is, for example, a plate with a plurality of pores formed therein. Therefore, while the gas flows from the filter 31 to the substrate holder 26, the gas flow path is not narrowed down smaller than the area of the blowoff surface of the filter 31. That is, with the gas flow path not narrowed down smaller than the area of the blowoff surface of the filter 31, the gas reaches from the filter 31 to the substrate holder 26.

5. Projection Length of Gas Supply Unit

FIG. 6 shows a projection length L5 of the gas supply unit 30 projecting upward from the treating housing 22. In this specification, the projection length L5 of the gas supply unit 30 projecting upward from the treating housing 22 is called the "projection length L5 of the gas supply unit 30". The projection length L5 of the gas supply unit 30 is twice or less than twice the length L1 of the filter 31 in the vertical direction Z.

The projection length L5 of the gas supply unit 30 is defined as follows, for example. The projection length L5 of the gas supply unit 30 is a distance in the vertical direction Z between the upper end of an overlap part and the upper end 23t of the treating housing 22. Here, the "overlap part" is the part of the gas supply unit 30 that overlaps the treating housing 22 in plan view.

In this embodiment, the overlap part of the gas supply unit 30 includes the whole of the filter 31 and part of the duct 32 described above. The overlap part of the gas supply unit 30 does not include the fan 41. It is because the fan 41 does not overlap the treating housing 22 in plan view. The fan 41 is, therefore, not a factor of the projection length L5. The upper end of the overlap part of the gas supply unit 30 corresponds to the upper end 32t of the duct 32. The projection length L5 of the gas supply unit 30 is, therefore, a distance in the vertical direction Z between the upper end 32t and upper end 23t.

Of the two treating housings 22 adjoining each other in the vertical direction Z, the lower treating housing 22 will be called the "first treating housing 22A", and the upper treating housing 22 the "second treating housing 22B". The gas supply unit 30 that supplies the gas to the interior of the first treating housing 22A will be called the "first gas supply unit 30A". In this case, the second treating housing 22B is located above the duct 32 of the first gas supply unit 30A. The second treating housing 22B is located close to the duct 32 of the first gas supply unit 30A.

The fan 41 of the first gas supply unit 30A does not overlap the second treating housing 22B in plan view. Therefore the fan 41 of the first gas supply unit 30A does not interfere with the second treating housing 22B.

6. Exhaust System of the Treating Housing 22

Reference is made to FIG. 7. The treating housing 22 has an exhaust port 53. The exhaust port 53 is formed in a position facing the piping space 51. The exhaust port 53 is formed in a portion of the treating housing 22 adjoining the piping space 51. The gas inside the treating housing 22 is discharged to the exterior of the treating housing 22 through the exhaust port 53. The exhaust port 53 is located in the same height position as the treating housing 22. The whole of the exhaust port 53 is located in a height position equal to or lower than the upper end 23t and equal to and higher than the lower end 23b. The exhaust port 53 is located in a height position close to the lower end 23b. The exhaust port 53 is located in a lower part of the treating housing 22.

The exhaust port 53 is located below the fan 41. The fan 41 and exhaust port 53 are aligned in the vertical direction Z in a side view of the treating housing 22.

The fan 41 and exhaust port 53 are located in positions close to the transporting space 12 respectively.

Reference is made to FIGS. 2 and 4 to 6. The substrate treating apparatus 1 includes a plurality of (e.g. 24) horizontal exhaust units 55. One horizontal exhaust unit 55 is provided for each treating housing 22. The horizontal exhaust unit 55 is provided in the piping space 51. The horizontal exhaust unit 55 is connected to the exhaust port 53. The horizontal exhaust unit 55 extends horizontally. The horizontal exhaust unit 55 is located in the same height position as the treating housing 22. The whole of the horizontal exhaust unit 55 is located in a height position equal to or lower than the upper end 23t and equal to and higher than the lower end 23b. The horizontal exhaust unit 55 is located in a height position close to the lower end 23b.

The horizontal exhaust unit 55 is located in a position lower than the fan 41. The horizontal exhaust unit 55 is, in the vertical direction Z, located in a height position lower than the fan 41. Part of the horizontal exhaust unit 55 is located in a position close to the transporting space 12. Part of the horizontal exhaust unit 55 is located below the fan 41. Part of the horizontal exhaust unit 55 overlaps the fan 41 in plan view.

Reference is made to FIG. 6. As noted hereinbefore, the fan 41 of the first gas supply unit 30A is located in a position lower than the upper end 32t of the duct 32 of the first gas supply unit 30A. The second treating housing 22B is located above the duct 32 of the first gas supply unit 30A. The fan 41 of the first gas supply unit 30A is therefore located in a position lower than the second treating housing 22B.

The horizontal exhaust unit 55 connected to the second treating housing 22B will be called the "second horizontal exhaust unit 55B". The whole of the second horizontal exhaust unit 55B is located in the same height position as the second treating housing 22B. The fan 41 of the first gas supply unit 30A is therefore located in a position lower than the second horizontal exhaust unit 55B. Consequently, the fan 41 of the first gas supply unit 30A does not interfere with the second horizontal exhaust unit 55B. For the same reason, the fan 41 of the first gas supply unit 30A does not interfere with the exhaust port (not shown) of the second treating housing 22B.

Reference is made to FIGS. 2, 4, and 5. The substrate treating apparatus 1 includes a plurality of (e.g. four) vertical exhaust units 60. One vertical exhaust unit 60 is provided for each of the plurality (e.g. six) of treating housings 22 aligned in the vertical direction Z. The vertical exhaust unit 60 is provided in the piping space 51. The vertical exhaust unit 60 is connected to the horizontal exhaust unit 55. Each vertical exhaust unit 60 is connected to a plurality of (e.g. six) horizontal exhaust units 55. The vertical exhaust unit 60 extends in the vertical direction Z.

The vertical exhaust unit 60 has a first vertical exhaust pipe 61, a second vertical exhaust pipe 62, and a third vertical exhaust pipe 63. The first to third vertical exhaust pipes 61-63 are connected to the horizontal exhaust unit 55 respectively. The first to third vertical exhaust pipes 61-63 extend in the vertical direction Z respectively.

Reference is made to FIG. 2. The vertical exhaust unit 60 extends from the position lower than the fan 41 to a position higher than the fan 41. The fan 41 and vertical exhaust unit 60 are aligned in the transverse direction Y as seen from the longitudinal direction X. That is, the fan 41 and vertical exhaust unit 60 are aligned in the transverse direction Y in front view. The fan 41 is located in a position close to the transporting space 12. The vertical exhaust unit 60 is located in a position far from the transporting space 12.

The first to third vertical exhaust pipes 61-63 are aligned in the transverse direction Y as seen from the longitudinal direction X. The first to third vertical exhaust pipes 61-63 each extend from a position lower than the fan 41 to a position higher than the fan 41. The fan 41 and first to third vertical exhaust pipes 61-63 are aligned in the transverse direction Y as seen from the longitudinal direction X. That is, the fan 41 and first to third vertical exhaust pipes 61-63 are aligned in the transverse direction Y in front view.

Figure 13:
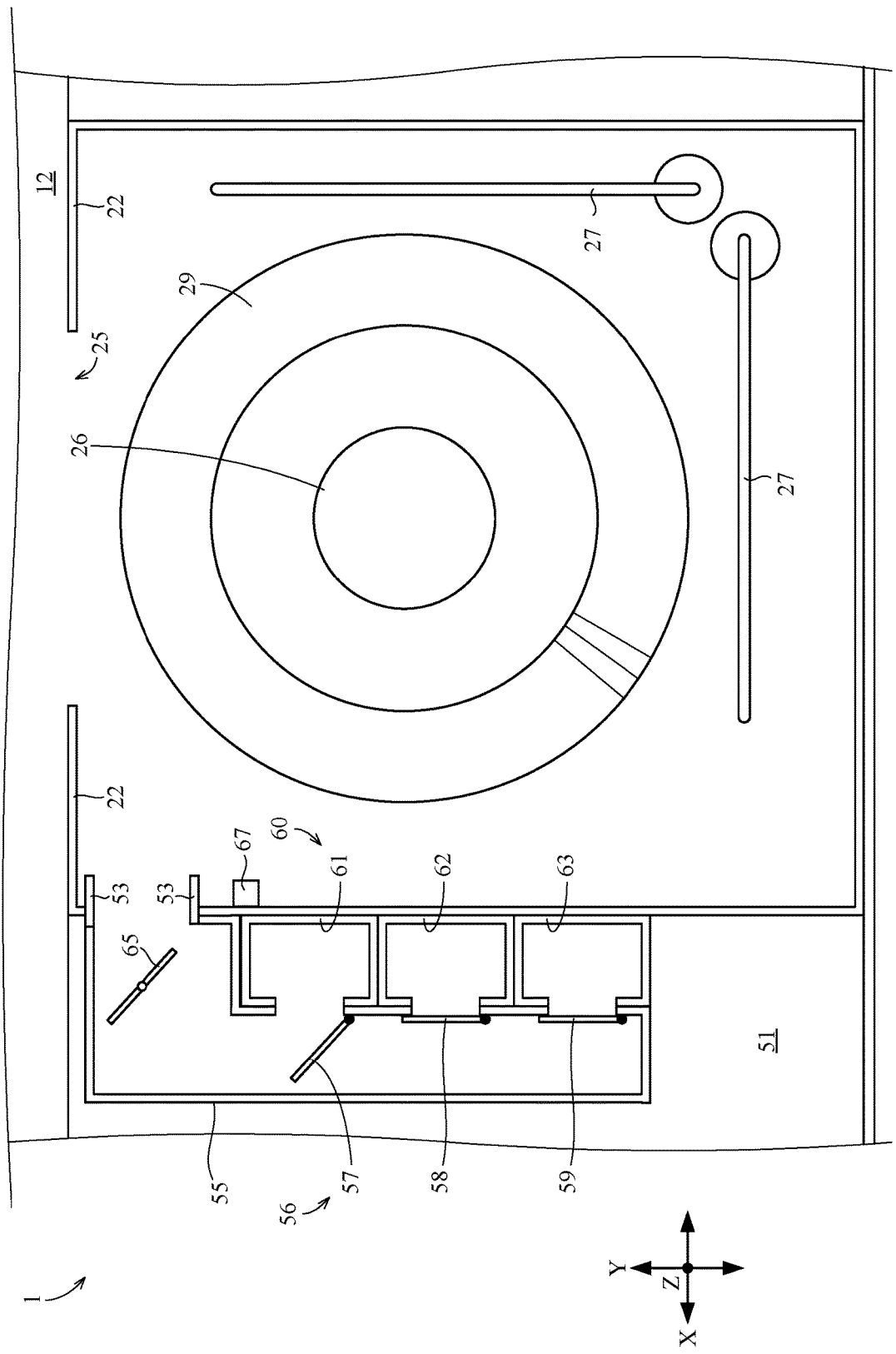
FIG. 13 is a plan view showing an interior of the treating housing.

FIG. 13 is a plan view of the treating housing 22. The horizontal exhaust unit 55 has a switching mechanism 56. The switching mechanism 56 switches an exhaust path of the treating housing 22 to one of the first to third vertical exhaust pipes 61-63. Here, the exhaust path of the treating housing 22 is demarcated by the horizontal exhaust unit 55 and vertical exhaust unit 60. More particularly, each horizontal exhaust unit 55 demarcates the exhaust path of one treating housing 22. Each vertical exhaust unit 60 demarcates the exhaust paths of all the treating housings 22 aligned in the vertical direction Z. The exhaust paths of the treating housings 22 are not open to the piping spaces 51.

Specifically, the switching mechanism 56 switches to a first state, a second state, and a third state. In the first state, the switching mechanism 56 places the treating housing 22 in communication with the first vertical exhaust pipe 61, and cuts off the treating housing 22 from the second and third vertical exhaust pipes 62 and 63. In the first state, only the first vertical exhaust pipe 61 discharges the gas from the treating housing 22. That is, in the first state, the second vertical exhaust pipe 62 does not discharge the gas from the treating housing 22, and the third vertical exhaust pipe 63 does not discharge the gas from the treating housing 22, either. In the second state, the switching mechanism 56 places the treating housing 22 in communication with the second vertical exhaust pipe 62, and cuts off the treating housing 22 from the first and third vertical exhaust pipes 61 and 63. In the second state, only the second vertical exhaust pipe 62 discharges the gas from the treating housing 22. In the third state, the switching mechanism 56 places the treating housing 22 in communication with the third vertical exhaust pipe 63, and cuts off the treating housing 22 from the first and second vertical exhaust pipes 61 and 62. In the third state, only the third vertical exhaust pipe 63 discharges the gas from the treating housing 22.

For example, the switching mechanism 56 is provided in the interior of the horizontal exhaust unit 55. The switching mechanism 56 has a first opening and closing member 57, a second opening and closing member 58, and a third opening and closing member 59. The first opening and closing member 57 places the treating housing 22 in communication with the first vertical exhaust pipe 61, and cuts off the treating housing 22 from the first vertical exhaust pipe 61. The second opening and closing member 58 places the treating housing 22 in communication with the second vertical exhaust pipe 62, and cuts off the treating housing 22 from the second vertical exhaust pipe 62. The third opening and closing member 59 places the treating housing 22 in communication with the third vertical exhaust pipe 63, and cuts off the treating housing 22 from the third vertical exhaust pipe 63. The first to third opening and closing members 57-59 are valves respectively, for example.

7. Construction for Controlling Gas Pressure Inside Treating Housing 22

The substrate treating apparatus 1 includes an exhaust damper 65. The exhaust damper 65 is provided in the exhaust path of the treating housing 22. The exhaust damper 65 regulates the flow rate of the gas flowing through the exhaust path of the treating housing 22. The exhaust damper 65 is provided in the interior of the horizontal exhaust unit 55, for example.

The substrate treating apparatus 1 includes a pressure sensor 67. The pressure sensor 67 measures the pressure of the gas in the interior of the treating housing 22. The pressure sensor 67 is installed in the interior of the treating housing 22.

Figure 14:
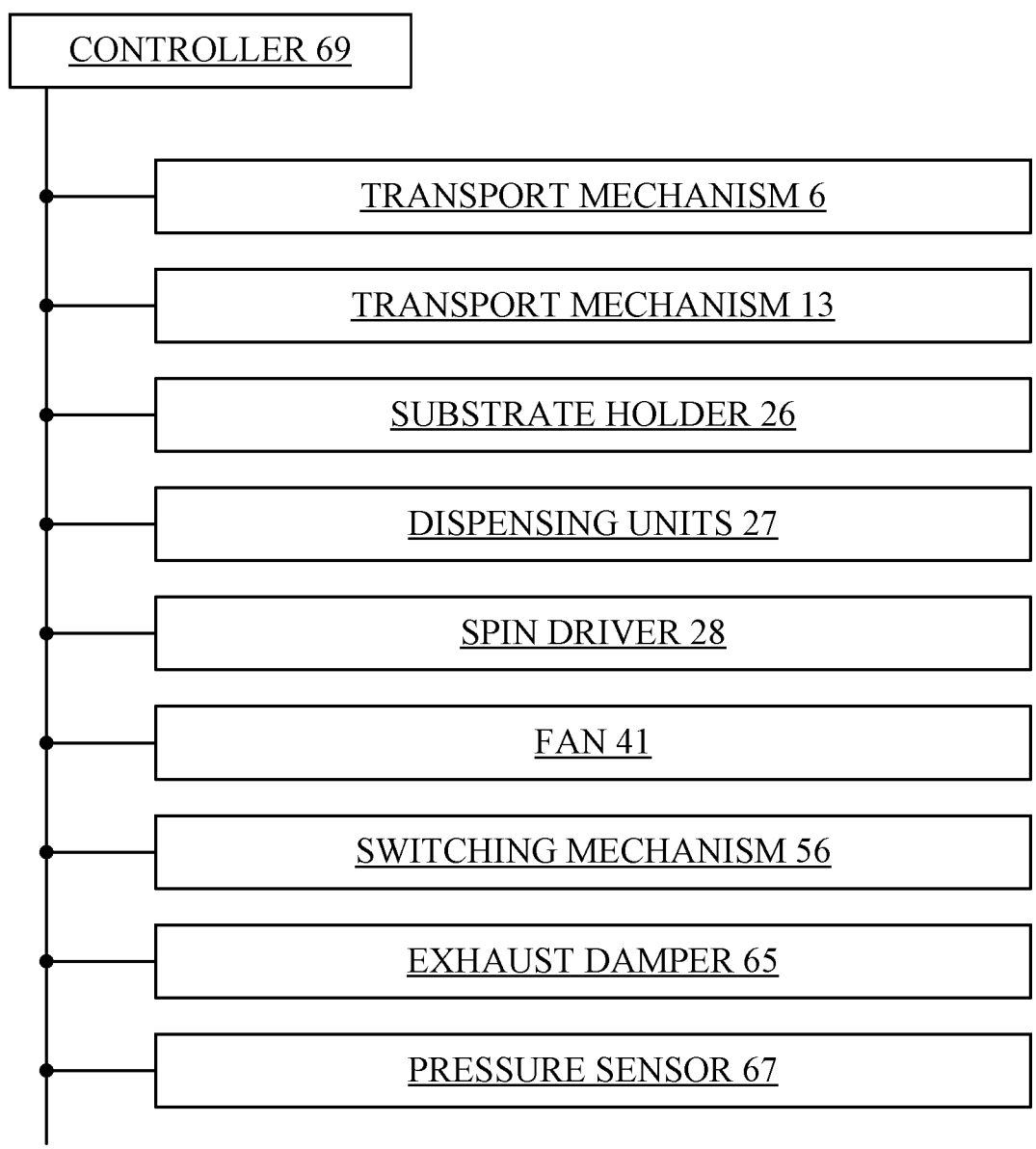
FIG. 14 is a control block diagram of the substrate treating apparatus.

FIG. 14 is a control block diagram of the substrate treating apparatus 1. The substrate treating apparatus 1 includes a controller 69. The controller 69 acquires detection results of the pressure sensor 67. The controller 69 controls at least one of the fan 41 and exhaust damper 65 based on the detection results of the pressure sensor 67. Consequently, the controller 69 regulates the pressure of the gas in the interior of the treating housing 22. For example, the controller 69 controls both the fan 41 and exhaust damper 65 based on the detection results of the pressure sensor 67. The controller 69 is connected to the fan 41, exhaust damper 65, and pressure sensor 67 to be capable of communication therewith.

For example, the controller 69 regulates the quantity of ventilation of the fan 41. For example, the controller 69 regulates the opening degree of the exhaust damper 65.

For example, the controller 69 regulates the detection results of the pressure sensor 67 to be kept constant. For example, the controller 69 regulates the pressure of the gas inside the treating housing 22 to be kept constant. For example, the controller 69 regulates the detection results of the pressure sensor 67 to agree with target values set beforehand. For example, the controller 69 regulates the gas pressure inside the treating housing 22 to agree with a target value set beforehand.

Further the controller 69 controls the transport mechanism 6, transport mechanism 13, substrate holder 26, dispensing units 27, spin driver 28, and switching mechanism 56.

The controller 69 is realized by a central processing unit (CPU) which performs various processes, a RAM (Random-Access Memory) serving as working space for arithmetic processing, and a storage medium such as a fixed disk. The storage medium stores various types of information written in beforehand. The storage medium stores, for example, information (treatment recipe) which provides operating conditions for treatment performed on the wafers W in the interior of each treating housing 22. The storage medium stores, for example, information which provide conditions or target values concerning gas pressure inside the treating housings 22. The storage medium stores, for example, information which provides operating conditions concerning switching of the exhaust paths done by the switching mechanism 56.

8. Example of Operation of Substrate Treating Apparatus 1

An example of operation of the substrate treating apparatus 1 will be described briefly.

The indexer division 3 feeds wafers W to the treating block 11. Specifically, the transport mechanism 6 transfers wafers W from a carrier C to the transport mechanism 13 of the treating block 11.

The transport mechanism 13 transports the wafers W from the indexer division 3 to the interior (i.e. the substrate holder 26) of one of the treating housings 22.

The gas supply unit 30 supplies the gas to the treating housing 22. Specifically, the fan 41 sends the gas into the duct 32. The duct 32 sends the gas to the filter 31. Specifically, the gas flows through the second horizontal portion 39, vertical portion 38, and first horizontal portion 33 in this order. In the first horizontal portion 33, the gas flows from the outer groove region 36 to the flat part 34, and from the flat part 34 to the filter 31. The filter 31 filters the gas. The filter 31 blows off the filtered gas to the interior of the treating housing 22. The gas flows downward in the interior of the treating housing 22. That is, downflows are formed in the interior of the treating housing 22.

The switching mechanism 56 switches the exhaust path of the treating housing 22 to one of the first to third vertical exhaust pipes 61-63. For example, the switching mechanism 56 switches the exhaust path of the treating housing 22 according to the types of treating liquids dispensed from the dispensing units 27.

The switching mechanism 56 switches the exhaust path of the treating housing 22 to the first vertical exhaust pipe 61, for example. In this case, the gas inside the treating housing 22 is discharged through the exhaust port 53 and horizontal exhaust unit 55 to the first vertical exhaust pipe 61.

The controller 69 controls at least one of the fan 41 and exhaust damper 65 based on detection results of the pressure sensor 67. Consequently, the controller 69 regulates the gas pressure in the interior of the treating housing 22.

Each wafer W is treated in the interior of the treating housing 22. Specifically, the substrate holder 26 holds the wafer W. The spin driver 28 spins the wafer W held by the substrate holder 26. The dispensing units 27 supply the wafer W held by the substrate holder 26 with the treating liquids. The cup 29 catches the treating liquids scattering from the wafer W.

After the wafers W are treated in the treating housing 22, the treating block 11 returns the treated wafers W to the indexer division 3. Specifically, the transport mechanism 13 takes the wafers W from the interior (i.e. the substrate holder 26) of the treating housing 22. Then, the transport mechanism 13 transfers the wafers W to the transport mechanism 6 of the indexer division 3.

The indexer division 3 collects the wafers W from the treating block 11. Specifically, the transport mechanism 6 transports the wafers W from the treating block 11 to the carrier C.

9. Effects of the Embodiment

The substrate treating apparatus 1 includes the treating housing 22 and the gas supply unit 30. The treating housing 22 treats wafers W in the interior of the treating housing 22. The gas supply unit 30 supplies a gas to the interior of the treating housing 22. The gas supply unit 30 includes the filter 31, the duct 32, and the fan 41. The filter 31 is disposed in an upper part of the treating housing 22. The filter 31 blows off the gas to the interior of the treating housing 22. The duct 32 and fan 41 are provided in the exterior of the treating housing 22 respectively. The duct 32 is connected to the filter 31. The fan 41 is connected to the duct 32.

The fan 41 is disposed in a position not overlapping the filter 31 in plan view. In other words, the fan 41 does not have a part that overlaps the filter 31 in plan view. Therefore, the filter 31 and fan 41 are not aligned in the vertical direction Z. Further, at least part of the fan 41 is located in the same height position as the treating housing 22. In other words, at least part of the fan 41 is located in a height position equal to or lower than the upper end 23$t$ of the treating housing 22, and equal to or higher than the lower end 23$b$ of the treating housing 22. Therefore, at least part of the fan 41 does not project upward from the treating housing 22. Even if the filter 31 is located in the upper part of the treating housing 22, the fan 41 is restrained from markedly projecting upward from the treating housing 22. Even if the filter 31 is located in the upper part of the treating housing 22, the fan 41 does not excessively project upward from the treating housing 22. Thus, the projection length L5 of the gas supply unit 30 is reduced.

As noted above, according to the substrate treating apparatus 1, the projection length L5 of the gas supply unit 30 can be reduced.

As a result, two treating housings 22 adjoining each other in the vertical direction Z can be arranged close to each other. In other words, the distance of separation between the two treating housings 22 adjoining each other in the vertical direction Z can be reduced. Therefore, even if the number of treating housings 22 aligned in the vertical direction Z increases, the length of the substrate treating apparatus 1 in the vertical direction Z does not enlarge to excess. Consequently, the number of treating housings 22 aligned in the vertical direction Z can be increased easily. This suppresses an increase of the footprint of the substrate treating apparatus 1, and at the same time realizes an improved throughput of the substrate treating apparatus 1.

At least part of the fan 41 is located in a position lower than the filter 31. Therefore, the height position of the fan 41 is relatively low. Thus, the projection length L5 of the gas supply unit 30 is reduced conveniently.

At least part of the duct 32 is located in a position lower than the filter 31. At least part of the fan 41 can therefore easily be located in the position lower than filter 31.

The fan 41 is located in a position not overlapping the treating housing 22 in plan view. In other words, the fan 41 does not have any part that overlaps the treating housing 22 in plan view. Thus, the fan 41 is not located above the treating housing 22. The fan 41 is therefore not a factor of the projection length L5 of the gas supply unit 30. Consequently, the projection length L5 of the gas supply unit 30 is effectively reduced.

The projection length L5 of the gas supply unit 30 is not more than twice the length L1 of the filter 31 in the vertical direction Z. The projection length L5 of the gas supply unit 30 is sufficiently small.

The projection length L5 of the gas supply unit 30 is a distance in the vertical direction Z between the upper end of the overlap part of the gas supply unit 30 and the upper end 22t of the treating housing 22. Therefore, the reduction of the projection length L5 of the gas supply unit 30 corresponds to a thinning of the overlap part of the gas supply unit 30. Therefore, by reducing the projection length L5 of the gas supply unit 30, the distance of separation between the two treating housings 22 adjoining each other in the vertical direction Z can be reduced.

The upper end 32t of the duct 32 corresponds to the upper end of the gas supply unit 30. Therefore, the projection length L5 of the gas supply unit 30 is reduced conveniently.

The duct 32 has the first horizontal portion 33, the vertical portion 38, and the second horizontal portion 39. The first horizontal portion 33 extends substantially horizontally from the filter 31. The vertical portion 38 extends downward from the first horizontal portion 33. The second horizontal portion 39 extends substantially horizontally from the vertical portion 38 to the fan 41. The second horizontal portion 39 is located in a position lower than the first horizontal portion 33. Thus, the second horizontal portion 39 can easily be located in the position lower than the first horizontal portion 33 by means of the vertical portion 38. By the second horizontal portion 39, the height position of the fan 41 can be easily made low. Therefore, the projection length L5 of the gas supply unit 30 is reduced conveniently.

The treating housing 22 has the top plate 24. The top plate 24 includes the first top plate portion 24a and the second top plate portion 24b. The filter 31 is installed on the first top plate portion 24a. The second top plate portion 24b is located below the vertical portion 38 and second horizontal portion 39. The second top plate portion 24b is lower than the first top plate portion 24a. The vertical portion 38 and second horizontal portion 39 are located above the second top plate portion 24b. Therefore, the height position of the vertical portion 38 can easily be made low. The height position of the second horizontal portion 39 can easily be made low. Therefore, the height position of the fan 41 can easily be made low. Consequently, the projection length L5 of the gas supply unit 30 is reduced conveniently.

Part of the duct 32 overlaps the filter 31 in front view. In other words, part of the duct 32 is located in the same height position as the filter 31. Thus, the height position of the duct 32 is relatively low. Therefore, the projection length L5 of the gas supply unit 30 is reduced conveniently.

The duct 32 has a flat part 34. The flat part 34 is located above the filter 31. The flat part 34 extends horizontally. The flat part 34 blows off the gas downward. The length L3 of the flat part 34 in the vertical direction Z is smaller than the length L1 of the filter 31 in the vertical direction Z. That is, the flat part 34 is thinner than the filter 31. Therefore, the projection length L5 of the gas supply unit 30 is reduced conveniently.

The total length L2 of the flat part 34 and filter 31 in the vertical direction Z is smaller than twice the length L1 of the filter 31 in the vertical direction Z. Therefore, the height position of the flat part 34 is relatively low. Consequently, the projection length L5 of the gas supply unit 30 is reduced conveniently.

The height position of the upper surface 34a of the flat part 34 corresponds to the upper end 32t of the duct 32. Therefore, the upper end 32t of the duct 32 is relatively low. Consequently, the projection length L5 of the gas supply unit 30 is reduced conveniently.

The height position of the upper surface 34a of the flat part 34 corresponds to the upper end of the gas supply unit 30.

Therefore, the projection length L5 of the gas supply unit 30 is reduced conveniently.

The duct 32 has the outer groove region 36. The outer groove region 36 is communicatively connected to the edge region 35 of the flat part 34. The outer groove region 36 feeds the gas to the flat part 34. The length L4 of the outer groove region 36 in the vertical direction Z is larger than the length L3 of the flat part 34 in the vertical direction Z. Therefore, the outer groove region 36 can smoothly supply the gas to the flat part 34.

The outer groove region 36 has a loop shape surrounding the flat part 34 in plan view. The outer groove region 36 can therefore supply the gas to the whole of the edge region 35 of the flat part 34. The outer groove region 36 can supply the gas to the flat part 34 through the whole of the edge region 35.

The outer groove region 36 extends downward from the edge region 35 of the flat part 34. Therefore, the height position of the outer groove region 36 can easily be made low. At least part of the outer groove region 36 overlaps the filter 31 in front view. Therefore, the height position of the outer groove region 36 is relatively low. Thus, the projection length L5 of the gas supply unit 30 is reduced conveniently.

The duct 32 has the baffle plates 37. The baffle plates 37 are installed in the outer groove region 36. The baffle plates 37 guide to the flat part 34 part of the gas flowing through the outer groove region 36. The baffle plates 37 cause the gas to flow with increased smoothness from the outer groove region 36 to the flat part 34. For example, the gas is distributed substantially uniformly over the entire flat part 34. For example, the gas cannot easily whirl around in the flat part 34. The flat part 34 thus appropriately feeds the gas to the filter 31. For example, the flat part 34 feeds the gas to the entire upper surface 31a of the filter 31 substantially uniformly. The filter 31 thus blows off the gas appropriately. For example, the filter 31 blows off the gas from the entire blowoff surface of the filter 31 substantially uniformly. For example, the filter 31 blows off the gas at substantially the same flow speed from the entire blowoff surface of the filter 31. Consequently, the wafers W can be treated appropriately in the interior of the treating housing 22.

The baffle plates 37 cross the directions in which the outer groove region 36 extends. Therefore, the baffle plates 37 can conveniently guide part of the gas flowing through the outer groove region 36 to the flat part 34.

The substrate treating apparatus 1 includes the transporting space 12, the transport mechanism 13, and the piping space 51. The transporting space 12 extends in the longitudinal direction X. The transporting space 12 adjoins the treating housing 22. The transport mechanism 13 is installed in the transporting space 12. The transport mechanism 13 transports wafers W to the interior of the treating housing 22. The piping space 51 adjoins the treating housing 22. The treating housing 22 and transporting space 12 are aligned in the transverse direction Y in plan view. The treating housing 22 and piping space 51 are aligned in the longitudinal direction X in plan view. Therefore, the transporting space 12 and piping space 51 do not interfere with each other.

The fan 41 is open to the piping space 51. The fan 41 sends the gas in the piping space 51 to the filter 31. Therefore, the fan 41 is easily located close to the treating housing 22 without the fan 41 interfering with the transport mechanism 13. The gas supply unit 30 is easily reduced in size.

The treating housing 22 has the exhaust port 53. The exhaust port 53 is formed in a position facing the piping space 51. The fan 41 is located above the exhaust port 53. Therefore, the fan 41 does not interfere with the exhaust port 53.

The substrate treating apparatus 1 includes the horizontal exhaust unit 55 and the vertical exhaust unit 60. The horizontal exhaust unit 55 is provided in the piping space 51. The horizontal exhaust unit 55 is connected to the exhaust port 53. The horizontal exhaust unit 55 extends horizontally. The vertical exhaust unit 60 is provided in the piping space 51. The vertical exhaust unit 60 is connected to the horizontal exhaust unit 55. The vertical exhaust unit 60 extends in the vertical direction Z. The fan 41 is located in a position higher than the horizontal exhaust unit 55. Therefore, the fan 41 does not interfere with the horizontal exhaust unit 55. The fan 41 and vertical exhaust unit 60 are aligned in the transverse direction Y as seen from the longitudinal direction X. The fan 41 and vertical exhaust unit 60 are aligned in the transverse direction Y in front view. Therefore, the fan 41 does not interfere with the vertical exhaust unit 60.

The vertical exhaust unit 60 has the first vertical exhaust pipe 61 and the second vertical exhaust pipe 62. The horizontal exhaust unit 55 has a switching mechanism 56. The switching mechanism 56 switches the exhaust path of the treating housing 22 to one of the first vertical exhaust pipe 61 and second vertical exhaust pipe 62. Therefore, the gas can be discharged appropriately from the interior of the treating housing 22.

The vertical exhaust unit 60 has the third vertical exhaust pipe 63. The switching mechanism 56 switches the exhaust path of the treating housing 22 to one of the first to third vertical exhaust pipes 61-63. Therefore, the gas can be discharged more appropriately from the interior of the treating housing 22.

The fan 41, first vertical exhaust pipe 61, and second vertical exhaust pipe 62 are aligned in the transverse direction Y as seen from the longitudinal direction X. The fan 41, first vertical exhaust pipe 61, and second vertical exhaust pipe 62 are aligned in the transverse direction Y as seen in front view. Therefore, the fan 41 does not interfere with the first vertical exhaust pipe 61 or second vertical exhaust pipe 62.

The fan 41, first vertical exhaust pipe 61, second vertical exhaust pipe 62, and third vertical exhaust pipe 63 are aligned in the transverse direction Y as seen from the longitudinal direction X. Therefore, the fan 41 does not interfere with the first to third vertical exhaust pipes 61-63.

The substrate treating apparatus 1 includes the pressure sensor 67 and the controller 69. The pressure sensor 67 measures the gas pressure inside the treating housing 22. The controller 69 controls the fan 41 based on detection results of the pressure sensor 67. For example, the controller 69 regulates the quantity of ventilation of the fan 41 by controlling the fan 41. Consequently, the controller 69 regulates the quantity of gas supplied to the treating housing 22. The controller 69 can therefore conveniently control the gas pressure inside the treating housing 22. Consequently, the wafers W can be treated in the interior of treating housing 22 appropriately.

The fan 41 sends the gas only to the treating housing 22. Each fan 41 sends the gas only to one treating housing 22. The quantity of ventilation of each fan 41 corresponds to the feed rate of gas to one treating housing 22. Therefore, the feed rate of gas to each treating housing 22 can be regulated easily.

The vertical exhaust unit 60 permits passage of the gas discharged from two or more treating housings 22. Therefore, the gas pressure inside the treating housing 22 may be influenced by other treating housings 22. Specifically, the vertical exhaust unit 60 permits passage of the gas discharged from all the treating housings 22 aligned in the vertical direction Z. Therefore, the gas pressures inside the treating housings 22 may influence mutually between all the treating housings 22 aligned in the vertical direction Z. Therefore, the gas pressure inside the treating housing 22 may fluctuate easily. Even in this case, the controller 69 can conveniently suppress the fluctuation of the gas pressure inside the treating housing 22.

Especially when the switching mechanism 56 switches the exhaust path of the treating housing 22 between the first vertical exhaust pipe 61 and second vertical exhaust pipe 62, the gas pressure inside the treating housing 22 fluctuates easily. When the switching mechanism 56 switches the exhaust path of the treating housing 22 between the first to third vertical exhaust pipes 61-63, the gas pressure inside the treating housing 22 fluctuates easily. Even in these cases, the controller 69 can conveniently suppress the fluctuation of the gas pressure inside the treating housing 22.

The substrate treating apparatus 1 includes an exhaust damper 65. The exhaust damper 65 is provided in the exhaust path of the treating housing 22. The controller 69 controls the fan 41 and exhaust damper 65 based on detection results of the pressure sensor 67. For example, the controller 69 regulates the opening degree of the exhaust damper 65 by controlling the exhaust damper 65. Consequently, the controller 69 can regulate the quantity of gas discharged from the treating housing 22. The controller 69 can therefore control the gas pressure inside the treating housing 22 with increased convenience. Thus, the wafers W can be treated more appropriately in the treating housing 22.

The substrate treating apparatus 1 includes the treating housings 22 and the gas supply units 30. Each gas supply unit 30 has the filter 31 and the duct 32. The duct 32 has the flat part 34 and the outer groove region 36. The length L4 of the outer groove region 36 in the vertical direction Z is larger than the length L3 of the flat part 34 in the vertical direction Z. The outer groove region 36 can therefore smoothly feed the gas to the flat part 34. As a result, the flat part 34 can easily be made thin. Thus, the projection length L5 of the gas supply unit 30 is reduced conveniently.

This invention is not limited to the foregoing embodiment, but may be modified as follows:

In the embodiment, part of the fan 41 is located in the same height position as the treating housing 22. The invention is not limited to this. The whole of the fan 41 may be located in the same height position as the treating housing 22. Specifically, the whole of the fan 41 may be located in a height position equal to or lower than the upper end 23t of the treating housing 22, and equal to or higher than the lower end 23b of the treating housing 22.

In the embodiment, the fan 41 does not overlap the treating housing 22 in plan view. The invention is not limited to this. At least part of the fan 41 may overlap the treating housing 22 in plan view. For example, the whole of the fan 41 may overlap the treating housing 22 in plan view.

In the embodiment, the fan 41 is located in the piping space 51. The invention is not limited to this. For example, at least part of the fan 41 may be located above the treating housing 22. For example, at least part of the fan 41 may be located above the second top plate portion 24b of the treating housing 22. For example, at least part of the fan 41 may be located in the recess space S.

In the foregoing embodiment, the fan 41 is not a factor of the projection length L5 of the gas supply unit 30. The invention is not limited to this. The fan 41 may be a factor of the projection length L5 of the gas supply unit 30.

In the foregoing embodiment, the projection length L5 of the gas supply unit 30 is the distance in the vertical direction Z between the upper end of the overlap part of the gas supply unit 30, and the upper end 23t of the treating housing 22. The invention is not limited to this. For example, the projection length L5 of the gas supply unit 30 may be a distance in the vertical direction Z between the upper end of the gas supply unit 30 and the upper end 23t of the treating housing 22.

In the foregoing embodiment, the whole of the fan 41 is located in a position lower than the upper end 32t of the duct 32. The invention is not limited to this. At least part of the fan 41 may be located in a position higher than the upper end 32t of the duct 32.

In the foregoing embodiment, the upper end 32t of the duct 32 corresponds to the upper end of the gas supply unit 30. The invention is not limited to this. The upper end of the fan 41 may correspond to the upper end of the gas supply unit 30.

In the embodiment, the number of treating housings 22 aligned in the vertical direction Z is six. The invention is not limited to this. The number of treating housings 22 aligned in the vertical direction Z may be changed as appropriate.

In the embodiment, the vertical exhaust unit 60 has the third vertical exhaust pipe 63. The invention is not limited to this. The third vertical exhaust pipe 63 may be omitted.

In the embodiment, the exhaust damper 65 is provided in the interior of the horizontal exhaust unit 55. The invention is not limited to this. At least part of the exhaust damper 65 may be located in the exterior of the horizontal exhaust unit 55. For example, at least part of the exhaust damper 65 may be located inside the treating housing 22. For example, at least part of the exhaust damper 65 may be located close to the exhaust port 53.

In the embodiment, the exhaust port 53 is located in a position close to the transporting space 12. The invention is not limited to this. The position of the exhaust port 53 may be changed as appropriate. Further, along with a change of the position of the exhaust port 53, the position of the horizontal exhaust unit 55 may be changed as appropriate.

Figure 15:
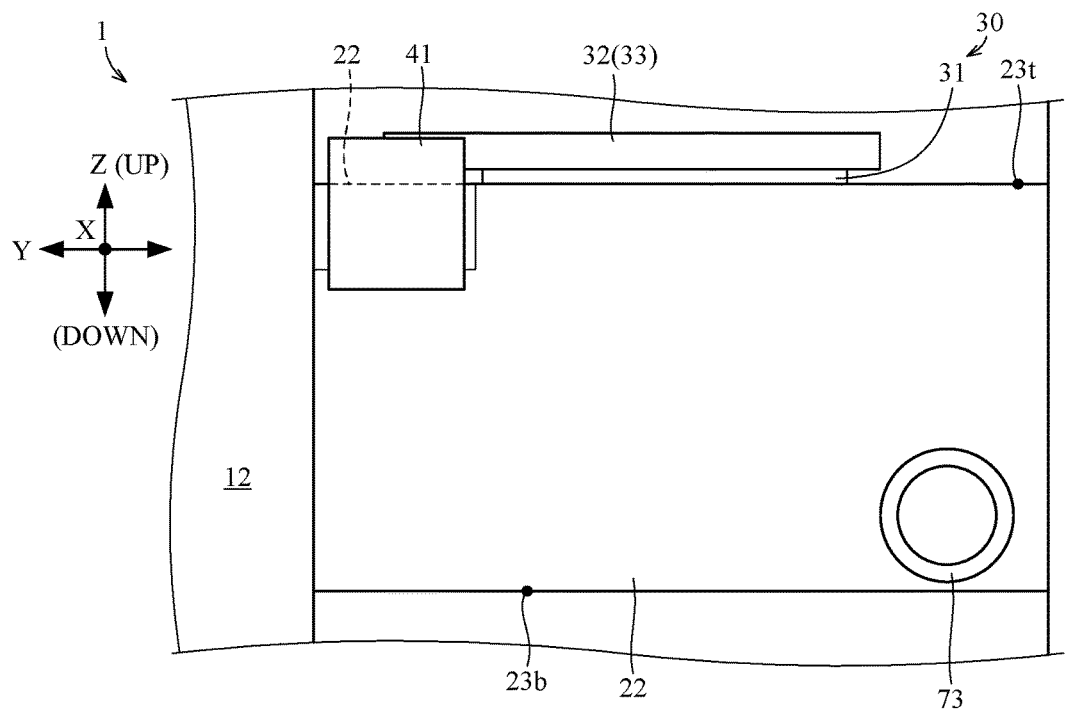
FIG. 15 is a front view of a treating housing in a modified embodiment.
Figure 16:
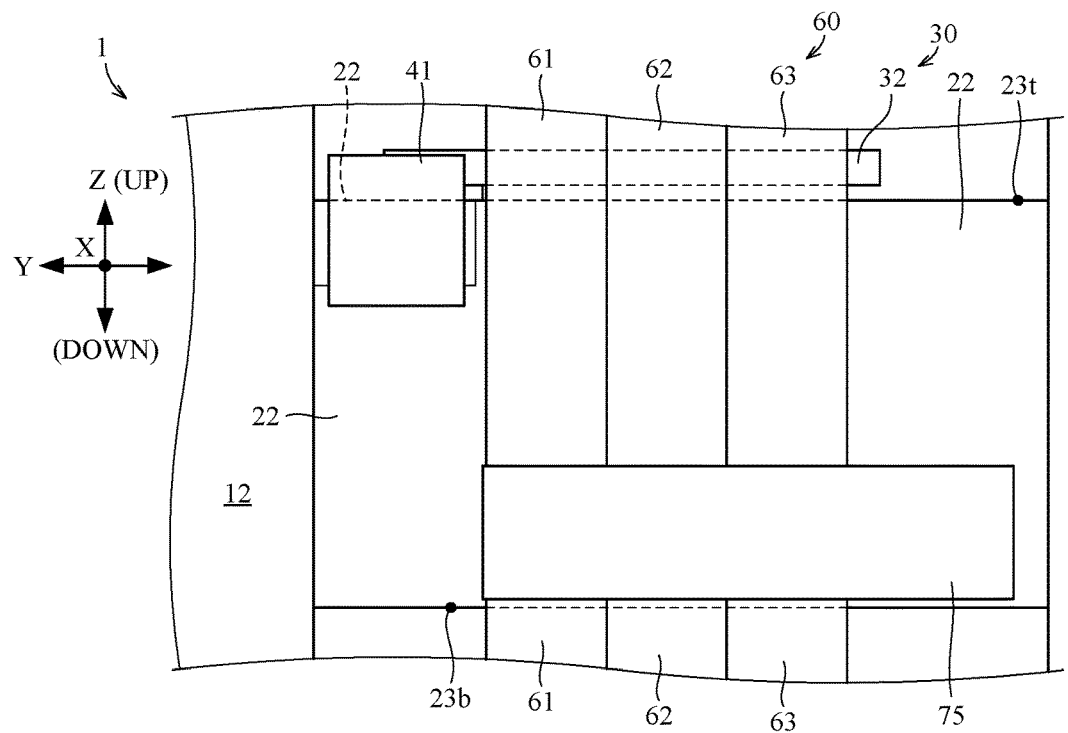
FIG. 16 is a front view of the treating housing in the modified embodiment.

FIGS. 15 and 16 are each front views of a treating housing in a modified embodiment. Components identical to those of the embodiment are shown with the same signs, and will not particularly be described. FIG. 15 omits illustration of the vertical exhaust unit 60 and the like.

Reference is made to FIG. 15. In the modified embodiment, the treating housing 22 has an exhaust port 73 in place of the exhaust port 53. The exhaust port 73 is located in a position far from the transporting space 12. The exhaust port 73 is not located under the fan 41. The fan 41 and exhaust port 73 are not aligned in the vertical direction Z in the front view of the treating housing 22.

Reference is made to FIG. 16. In the modified embodiment, the substrate treating apparatus 1 includes a horizontal exhaust unit 75 in place of the horizontal exhaust unit 55. The horizontal exhaust unit 75 is connected to the exhaust port 73. The horizontal exhaust unit 75 extends horizontally from the exhaust port 73. The horizontal exhaust unit 75 extends to the vertical exhaust unit 60. The vertical exhaust unit 60 is connected to the horizontal exhaust unit 75. Part of the horizontal exhaust unit 75 is located in a position far from the transporting space 12. For example, the horizontal exhaust unit 75 does not have a portion close to the transporting space 12. Though not shown, the whole of the horizontal exhaust unit 75 does not overlap the fan 41 in plan view.

In the embodiment, the substrate treating apparatus 1 does not include a regulator for regulating the gas blown off from the filter 31. The invention is not limited to this. The substrate treating apparatus 1 may include a regulator. A substrate treating apparatus 1 in a modified embodiment will be described in detail hereinafter.

Figure 17:
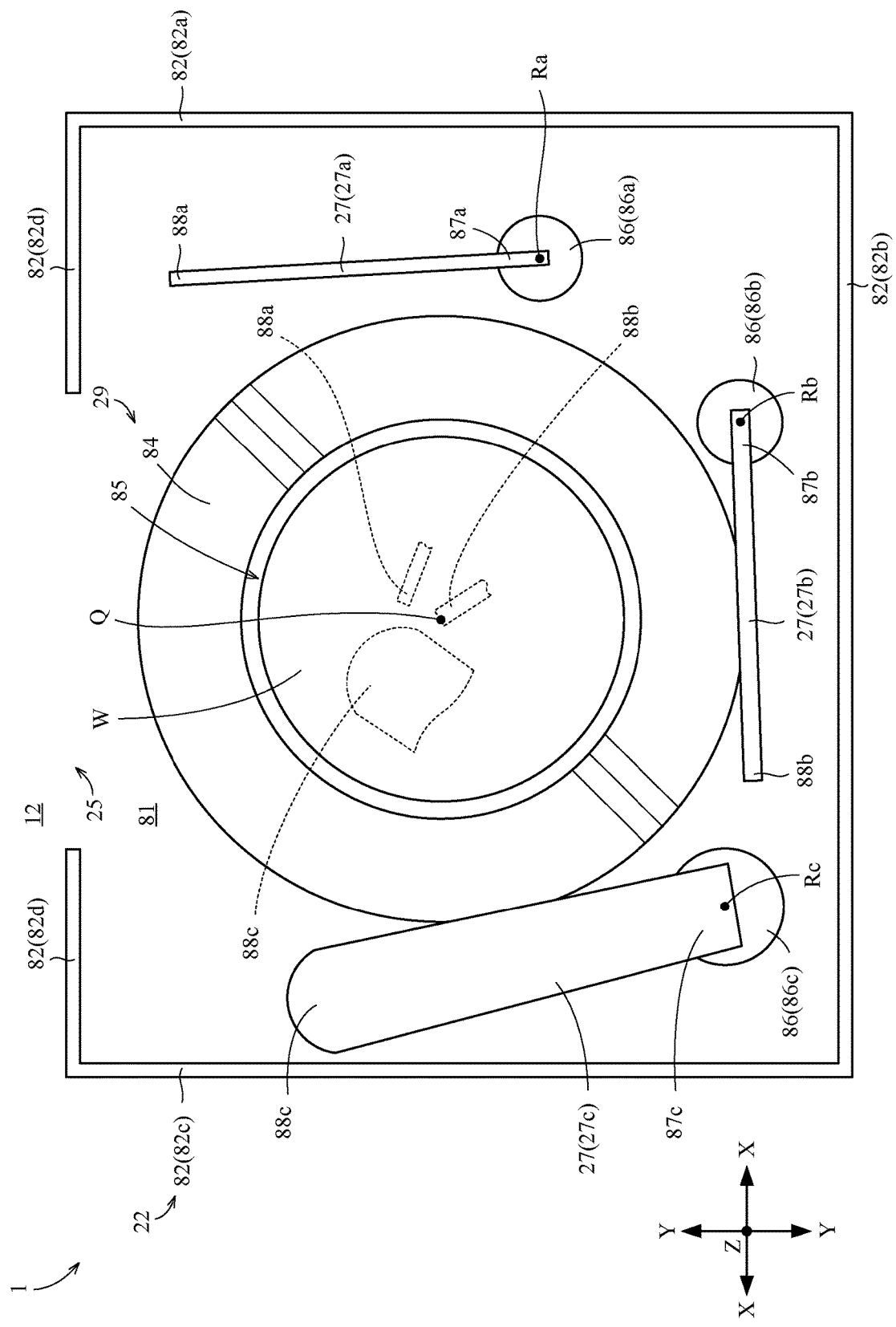
FIG. 17 is a plan view showing an interior of a treating housing in a modified embodiment.
Figure 18:
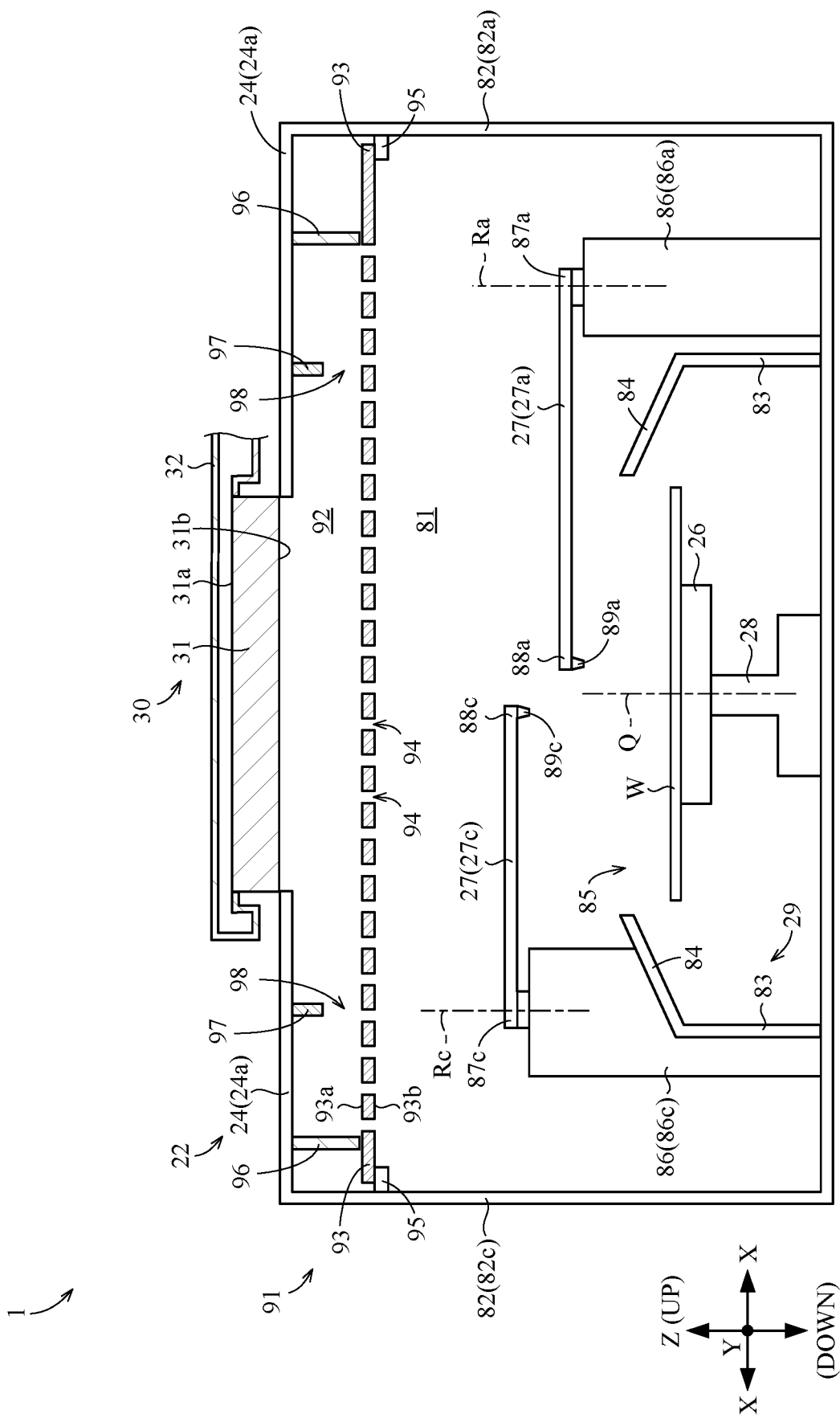
FIG. 18 is a view in vertical section of the treating housing in the modified embodiment.

FIG. 17 is a plan view showing an interior of a treating housing 22 in the modified embodiment. FIG. 18 is a view in vertical section of the treating housing 22 in the modified embodiment. Components identical to those of the embodiment are shown with the same signs, and will not particularly be described.

First, the constructions of the treating housing 22, substrate holder 26, cup 29, dispensing units 27, and filter 31 will be described.

The treating housing 22 demarcates a treating space 81 inside. The treating space 81 is an unoccupied space.

The treating housing 22 has a plurality of (e.g. four) side walls 82. Each side wall 82 is located in a side region of the treating housing 22. Each side wall 82 extends in the vertical direction Z.

The side walls 82, when distinguished from each other, will be called side walls 82a, 82b, 82c, and 82d. The side walls 82a and 82c extend in the transverse direction Y in plan view respectively. The side walls 82a and 82c face each other. The side walls 82b and 82d extend in the longitudinal direction X in plan view respectively. The side walls 82b and 82d face each other. The side wall 82b extends from the side wall 82a to the side wall 82c. The side wall 82d also extends from the side wall 82a to the side wall 82c. The side wall 82d is in contact with the transporting space 12. A transporting port 25 is formed in the side wall 82d.

As described in the embodiment, the substrate treating apparatus 1 includes the substrate holder 26. The substrate holder 26 is disposed inside the treating housing 22. The substrate holder 26 holds a wafer W. FIGS. 17 and 18 show a center axis Q. The center axis Q passes through the center of the wafer W supported by the substrate holder 26, and is parallel to the vertical direction Z.

As described in the embodiment, the substrate treating apparatus 1 includes the cup 29. The cup 29 is installed inside the treating housing 22. The cup 29 is installed in the treating space 81. The cup 29 is located around the substrate holder 26. The cup 29 catches the treating liquids.

The cup 29 has a vertical wall portion 83, a slope portion 84, and an upper opening 85. The vertical wall portion 83 extends in the vertical direction Z. The vertical wall portion 83 has a cylindrical shape centering on the center axis Q. The slope portion 84 is connected to the vertical wall portion 83. The slope portion 84 approaches the center axis Q as it extends upward from the vertical wall portion 83. The slope portion 84 has a truncated cone shape centering on the center axis Q. The slope portion 84 is ring-shaped in plan view. The upper opening 85 is located inward of the slope portion 84 in plan view. The upper opening 85 is formed in substantially the same height position as the upper end of the slope portion 84. The upper opening 85 extends horizontally. The upper opening 85 has a circular shape centering on the center axis Q. The upper opening 85 is larger than the wafer W in plan view. The upper opening 85 overlaps the whole wafer W held by the substrate holder 26 in plan view.

As described in the embodiment, the substrate treating apparatus 1 includes one or more (e.g. three) dispensing units 27. The dispensing units 27 are installed inside the treating housing 22. The dispensing units 27 are installed in the treating space 81. The dispensing units 27 dispense the treating liquids to the wafer W held by the substrate holder 26.

The dispensing units 27, when distinguished from each other, will be called dispensing units 27a, 27b, and 27c. The dispensing units 27a-27c are nozzles respectively. The dispensing units 27a-27c are located in positions higher than the wafer W held by the substrate holder 26 respectively.

The substrate treating apparatus 1 includes one or more (e.g. three) moving mechanisms 86. The moving mechanisms 86 move the dispensing units 27.

The moving mechanisms 86, when distinguished from each other, will be called moving mechanisms 86a, 86b, and 86c. The moving mechanism 86a is connected to the dispensing unit 27a. The moving mechanism 86a moves the dispensing unit 27a. The moving mechanism 86a rotates the dispensing unit 27a about an axis of rotation Ra. Similarly, the moving mechanisms 86b and 86c are connected to the dispensing units 27b and 27c respectively. The moving mechanisms 86b and 86c move the dispensing units 27b and 27c respectively. The moving mechanisms 86b and 86c rotate the dispensing units 27b and 27c about axes of rotation Rb and Rc respectively. The axes of rotation Ra-Rc are parallel to the vertical direction Z respectively. The axes of rotation Ra-Rc pass through the moving mechanisms 86a-86c respectively.

The dispensing unit 27a has a proximal end 87a. The proximal end 87a is connected to the moving mechanism 86a. The proximal end 87a is located outside the cup 29 in plan view. Similarly, the dispensing units 27b and 27c have proximal ends 87b and 87c respectively. The proximal ends 87b and 87c are connected to the moving mechanisms 86b and 86c respectively. The proximal ends 87b and 87c are located outside the cup 29 in plan view respectively.

The dispensing unit 27a has a distal end 88a. The distal end 88a is movable to a dispensing position and a standby position. Specifically, the moving mechanism 86a moves the distal end 88a to the dispensing position and standby position. Similarly, the dispensing units 27b and 27c have distal ends 88b and 88c, respectively. The distal ends 88b and 88c are movable to dispensing positions and standby positions respectively. Specifically, the moving mechanisms 86b and 86c move the distal ends 88b and 88c to the dispensing positions and standby positions respectively.

FIG. 17 shows the distal ends 88a-88c located in the standby positions in solid lines. When the distal end 88a is located in the standby position, the distal end 88a lies outward of the wafer W held by the substrate holder 26 in plan view. That is, when the distal end 88a is located in the standby position, the distal end 88a does not overlap the wafer W held by the substrate holder 26 in plan view. Similarly, when the distal ends 88b and 88c are located in the standby positions respectively, the distal ends 88b and 88c lie outward of the wafer W held by the substrate holder 26 in plan view. That is, when the distal ends 88b and 88c are located in the standby positions respectively, the distal ends 88b and 88c do not overlap the wafer W held by the substrate holder 26 in plan view respectively.

Further, when the distal end 88a is located in the standby position, the distal end 88a lies outward of the cup 29 in plan view. Similarly, when the distal ends 88b and 88c are located in the standby positions respectively, the distal ends 88b and 88c lie outward of the cup 29 in plan view respectively.

When the distal end 88a is located in the standby position, the dispensing unit 27a extends along the side wall 82a. Similarly, when the distal ends 88b and 88c are located in the standby positions respectively, the dispensing units 27b and 27c extend along the side walls 82b and 82c respectively.

FIG. 17 shows the distal ends 88a-88c located in the dispensing positions in broken lines. When the distal end 88a is located in the dispensing position, the distal end 88a overlaps the wafer W held by the substrate holder 26 in plan view. Similarly, when the distal ends 88b and 88c are located in the dispensing positions respectively, the distal ends 88b and 88c overlap the wafer W held by the substrate holder 26 in plan view respectively.

Reference is made to FIG. 18. The distal end 88a has a dispensing opening 89a. The dispensing opening 89a is an opening for dispensing the treating liquid. Similarly, the distal end 88b has a dispensing opening not shown. The distal end 88c also has a dispensing opening 89c.

The distal ends 88a-88c, when not distinguished, will be called distal ends 88 hereinafter.

As described in the embodiment, the substrate treating apparatus 1 includes the filter 31. The filter 31 is located in the upper part of the treating housing 22. The filter 31 is installed on the top plate 24. The filter 31 is installed on the first top plate portion 24a. The filter 31 blows off the gas downward. The filter 31 blows off the gas from the lower surface 31b of the filter 31.

The substrate treating apparatus 1 includes a regulator 91. The regulator 91 receives the gas (e.g. air) blown off from the filter 31. The regulator 91 regulates gas currents. The regulator 91 blows off the gas downward.

The regulator 91 is located below the filter 31.

The regulator 91 is located inside the treating housing 22. The regulator 91 is located above the treating space 81. The regulator 91 is in contact with the treating space 81. The regulator 91 is located above the substrate holder 26. The regulator 91 is located above the dispensing units 27. The regulator 91 is located above the cup 29.

The regulator 91 has a regulating chamber 92. The regulating chamber 92 is an unoccupied space. The regulating chamber 92 is located under the filter 31. The regulating chamber 92 is in contact with the filter 31. The regulating chamber 92 is in contact with the lower surface 31b of the filter 31.

The regulating chamber 92 is located under the top plate 24 of the treating housing 22. The regulating chamber 92 is in contact with the top plate 24. More particularly, the regulating chamber 92 is located under the first top plate portion 24a. The regulating chamber 92 is in contact with the first top plate portion 24a.

The regulating chamber 92 extends horizontally. The horizontal length of the regulating chamber 92 is longer than the horizontal length of the filter 31.

The regulating chamber 92 has a flat shape. The length of the regulating chamber 92 in the vertical direction Z is sufficiently shorter than the horizontal length of the regulating chamber 92. The regulating chamber 92 corresponds to horizontal flow paths for directing the gas radiantly from the filter 31.

The regulator 91 has a blowout plate 93. The blowout plate 93 is located under the regulating chamber 92. The blowout plate 93 is in contact with the regulating chamber 92. The blowout plate 93 is located over the treating space 81. The blowout plate 93 is in contact with the treating space 81.

The blowout plate 93 has a plate shape. The blowout plate 93 extends horizontally. The blowout plate 93 has an upper surface 93a and a lower surface 93b. The upper surface 93a is in contact with the regulating chamber 92. The lower surface 93b is in contact with the treating space 81.

The horizontal length of the blowout plate 93 is longer than the horizontal length of the filter 31. The horizontal length of the blowout plate 93 is equal to or longer than the horizontal length of the regulating chamber 92.

The blowout plate 93 has a plurality of blowout bores 94. The blowout bores 94 are formed in the blowout plate 93. The blowout bores 94 penetrate the blowout plate 93. The blowout bores 94 penetrate the blowout plate 93 in the vertical direction Z. The blowout bores 94 are sufficiently small compared with the blowout plate 93. The blowout bores 94 are densely arranged close to one another. The blowout bores 94 allow communication between the regulating chamber 92 and treating space 81. The lower surface 93b of the blowout plate 93 corresponds to a blowout surface of the regulator 91.

The blowout plate 93 is detachably attached to the treating housing 22.

Specifically, the regulator 91 has support pins 95. The support pins 95 are attached to the treating housing 22. The support pins 95 project from the side walls 82 of the treating housing 22, for example. The support pins 95 extend horizontally. The support pins 95 support the blowout plate 93. The blowout plate 93 is placed on the support pins 95. The lower surface 93b of the blowout plate 93 contacts the support pins 95.

When the support pins 95 support the blowout plate 93, the support pins 95 obstruct downward movement of the blowout plate 93 relative to the support pins 95. When the support pins 95 support the blowout plate 93, the support pins 95 permit upward movement of the blowout plate 93 relative to the support pins 95 (treating housing 22). The blowout plate 93 can therefore be easily attached to and detached from the treating housing 22.

The regulator 91 has barrier walls 96. The barrier walls 96 close lateral parts of the regulating chamber 92. The barrier walls 96 prevent the gas from flowing out of the regulating chamber 92 into the exterior of the regulating chamber 92 through the lateral parts of the regulator 91.

The barrier walls 96 are located at edges of the regulating chamber 92. The barrier walls 96 are located between the top plate 24 and blowout plate 93. The barrier walls 96 extend in the vertical direction Z. For example, the barrier walls 96 are supported by the top plate 24 (specifically the first top plate portion 24a). The barrier walls 96 extend downward from the top plate 24 (specifically the first top plate portion 24a). Alternatively, the barrier walls 96 may be supported by the blowout plate 93. The barrier walls 96 may extend upward from the blowout plate 93.

The barrier walls 96 permit the blowout plate 93 to move slightly upward relative to the treating housing 22. Therefore, the blowout plate 93 can easily be attached to the treating housing 22. The blowout plate 93 can easily be detached from the treating housing 22.

Specifically, clearances are provided either between the barrier walls 96 and top plate 24 or between the barrier walls 96 and blowout plate 93. The clearances are spaces.

The clearances are sufficiently small. The clearances are small enough to such an extent that they can substantially restrain the gas from flowing out of the regulating chamber 92 through the clearances. The clearances are 1 mm, for example.

Thus, the regulating chamber 92 is demarcated by the filter 31, top plate 24 (first top plate portion 24a), blowout plate 93, and barrier walls 96.

The regulator 91 has guide members 97. The guide members 97 are provided in the regulating chamber 92. The guide members 97 are located above the blowout plate 93. The guide members 97 are located between the filter 31 and barrier walls 96 in the horizontal direction. The guide members 97 guide the gas downward in the regulating chamber 92. The guide members 97 form relatively strong downward gas currents near the guide members 97.

The guide members 97 are located in upper parts of the regulating chamber 92. The guide members 97 are not located in lower parts of the regulating chamber 92. The guide members 97 are located only in the upper parts of the regulating chamber 92. The guide members 97 extend in the vertical direction Z. The guide members 97 block the upper parts of the regulating chamber 92. The guide members 97 obstruct the gas flowing horizontally in the upper parts of the regulating chamber 92. The guide members 97 leave open the lower parts of the regulating chamber 92. The guide members 97 keep the lower parts of the regulating chamber 92 horizontally open. The guide members 97 permit the gas to flow horizontally in the lower parts of the regulating chamber 92. In the regulating chamber 92, therefore, the guide members 97 can conveniently guide the gas downward. Further, the gas flows through the lower parts of the regulating chamber 92 without stagnation. The gas in the regulating chamber 92 flows smoothly along the upper surface 93a of the blowout plate 93. The gas in the regulating chamber 92 does not stagnate adjacent the upper surface 93a of the blowout plate 93.

Specifically, the guide members 97 are substantially plate-shaped. The guide members 97 are supported by the top plate 24 (specifically the first top plate portion 24a). The guide members 97 are in contact with the top plate 24 (specifically the first top plate portion 24a). The guide members 97 extend downward from the top plate 24 (specifically the first top plate portion 24a). Lower parts of the guide members 97 are higher than the blowout plate 93. The guide members 97 are separated from the blowout plate 93. The guide members 97 are out of contact with the blowout plate 93.

The length of the guide members 97 in the vertical direction Z is shorter than the length of the regulating chamber 92 in the vertical direction Z. For example, the length of the guide members 97 in the vertical direction Z is less than half the length of the regulating chamber 92 in the vertical direction Z.

The blowout plate 93 and guide members 97 form narrow paths 98 between the blowout plate 93 and guide members 97. The narrow paths 98 are unoccupied spaces. The narrow paths 98 are located below the guide members 97 and above the blowout plate 93. The gas can pass through the narrow paths 98. For example, the length of the narrow paths 98 in the vertical direction Z is more than half the length of the regulating chamber 92 in the vertical direction Z. For example, the length of the narrow paths 98 in the vertical direction Z is 4 mm or more.

Figure 19:
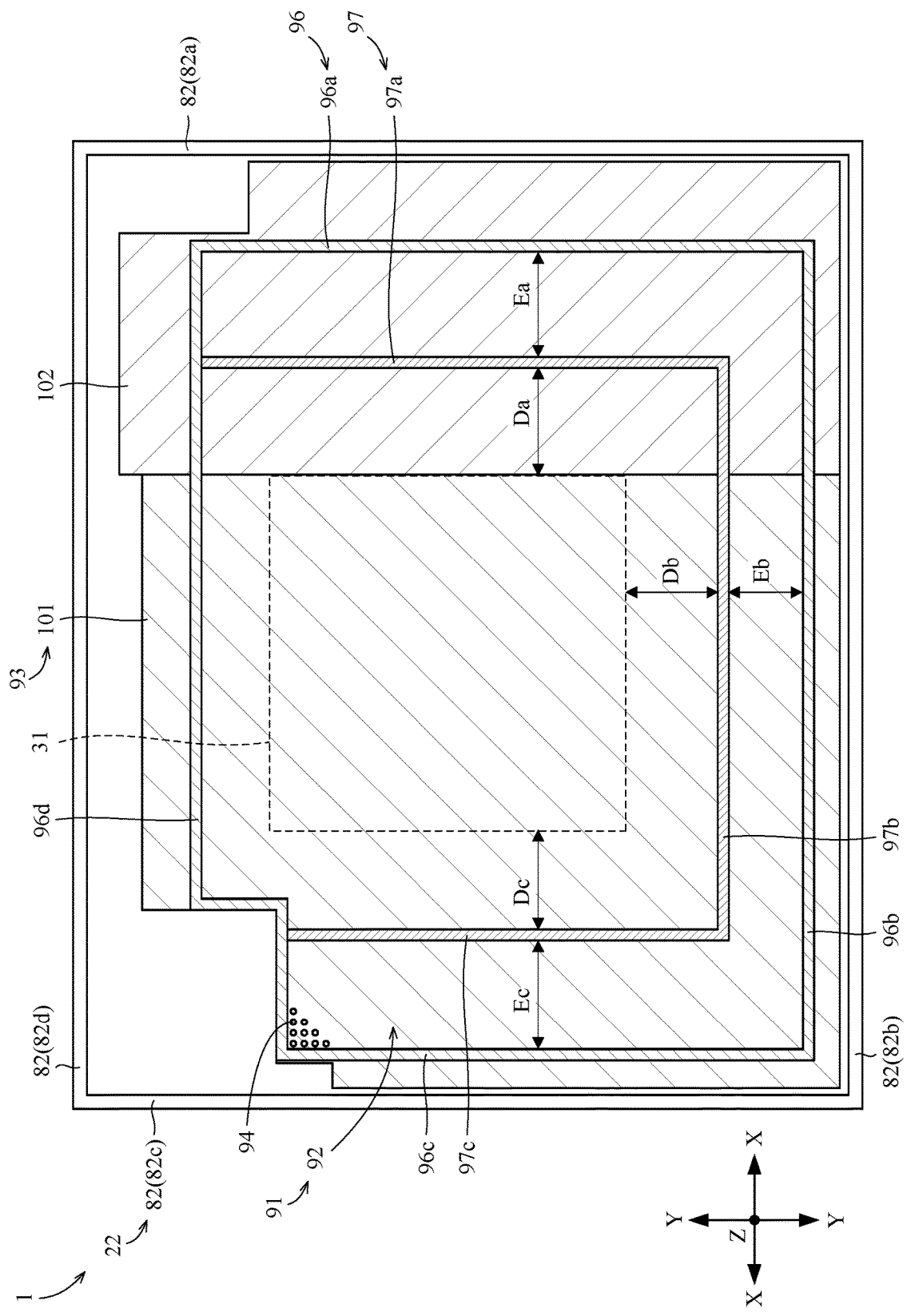
FIG. 19 is a plan view of a regulator in a modified embodiment.

FIG. 19 is a plan view of the regulator 91 in a modified embodiment. FIG. 19 shows the blowout plate 93, the barrier wall 96, and the guide member 97 in hatches for expediency.

The blowout plate 93 has a first member 101 and a second member 102. The first member 101 and second member 102 are separable from each other. The blowout plate 93 can be divided into the first member 101 and second member 102. The first member 101 and second member 102 are aligned horizontally. The second member 102 is adjacent to the first member 101. In plan view, the second member 102 does not substantially overlap the first member 101.

FIG. 19 shows the filter 31 in a broken line. In plan view, the filter 31 has a substantially rectangular shape.

In plan view, the blowout plate 93 is larger than the filter 31. In plan view, the blowout plate 93 overlaps the whole of the filter 31. In plan view, the first member 101 overlaps the whole of the filter 31. In plan view, the whole of the second member 102 is located outward of the filter 31. In plan view, the second member 102 does not overlap the filter 31.

In plan view, the whole of the barrier wall 96 is located outward of the filter 31. In plan view, the barrier wall 96 does not overlap the filter 31. In plan view, the barrier wall 96 has a closed ring shape. In plan view, the barrier wall 96 surrounds the filter 31.

The regulating chamber 92 is an area inward of the barrier wall 96 in plan view. In plan view, the regulating chamber 92 is larger than the filter 31. In plan view, the regulating chamber 92 overlaps the whole of the filter 31.

In plan view, the blowout plate 93 overlaps the whole of the barrier wall 96. In plan view, the blowout plate 93 overlaps the whole of the regulating chamber 92. In plan view, the blowout plate 93 is equal to or larger than the regulating chamber 92. In plan view, the blowout plate 93 overlaps the whole of the guide member 97.

In plan view, the whole of the guide member 97 is located outward of the filter 31. In plan view, the guide member 97 does not overlap the filter 31. In plan view, the whole of the guide member 97 is located inward of the barrier wall 96. In plan view, the guide member 97 has an open ring shape. The guide member 97 has a first end connected to the barrier wall 96, and a second end connected to the barrier wall 96.

Preferably, in plan view, a distance of separation between the filter 31 and guide member 97 is substantially equal to a distance of separation between the guide member 97 and barrier wall 96.

The barrier wall 96 has barrier parts 96a, 96b, 96c, and 96d. The barrier parts 96a-96d are parts of the barrier wall 96 respectively. The barrier parts 96a-96d each extend linearly in plan view. The barrier parts 96a and 96c each extend in the transverse direction Y. The barrier parts 96b and 96d each extend in the longitudinal direction X. The barrier part 96a is close to the side wall 82a in plan view. Similarly, the barrier parts 96b-96d are close to the side walls 82b-82d in plan view respectively.

The guide member 97 has guide parts 97a, 97b, and 97c. The guide parts 97a, 97b, and 97c are parts of the guide member 97, respectively. The guide parts 97a, 97b, and 97c each extend linearly in plan view. The guide parts 97a and 97c each extend in the transverse direction Y. The guide part 97b extends in the longitudinal direction X.

The guide part 97a is located between the barrier part 96a and filter 31 in plan view. The guide part 97b is located between the barrier part 96b and filter 31 in plan view. The guide part 97c is located between the barrier part 96c and filter 31 in plan view. The barrier part 97a, guide part 97a, filter 31, guide part 97c, and barrier part 96c are aligned in this order in the longitudinal direction X. The barrier part 96b, guide part 97b, filter 31, and barrier part 96d are aligned in this order in the transverse direction Y.

FIG. 19 shows distances Da-Dc and distances Ea-Ec. Distance Da is a distance of separation between the filter 31 and guide part 97a. Distance Db is a distance of separation between the filter 31 and guide part 97b. Distance Dc is a distance of separation between the filter 31 and guide part 97c. Distance Ea is a distance of separation between the guide part 97a and barrier part 96a. Distance Eb is a distance of separation between the guide part 97b and barrier part 96b. Distance Ec is a distance of separation between the guide part 97b and barrier part 96c.

Distance Ea preferably is substantially equal to distance Da. Distance Eb preferably is substantially equal to distance Db. Distance Ec preferably is substantially equal to distance Dc.

Distance Db preferably is substantially equal to distance Da. Distance Dc preferably is substantially equal to distance Da.

Distance Eb preferably is substantially equal to distance Ea. Distance Ec preferably is substantially equal to distance Ea.

Figure 20:
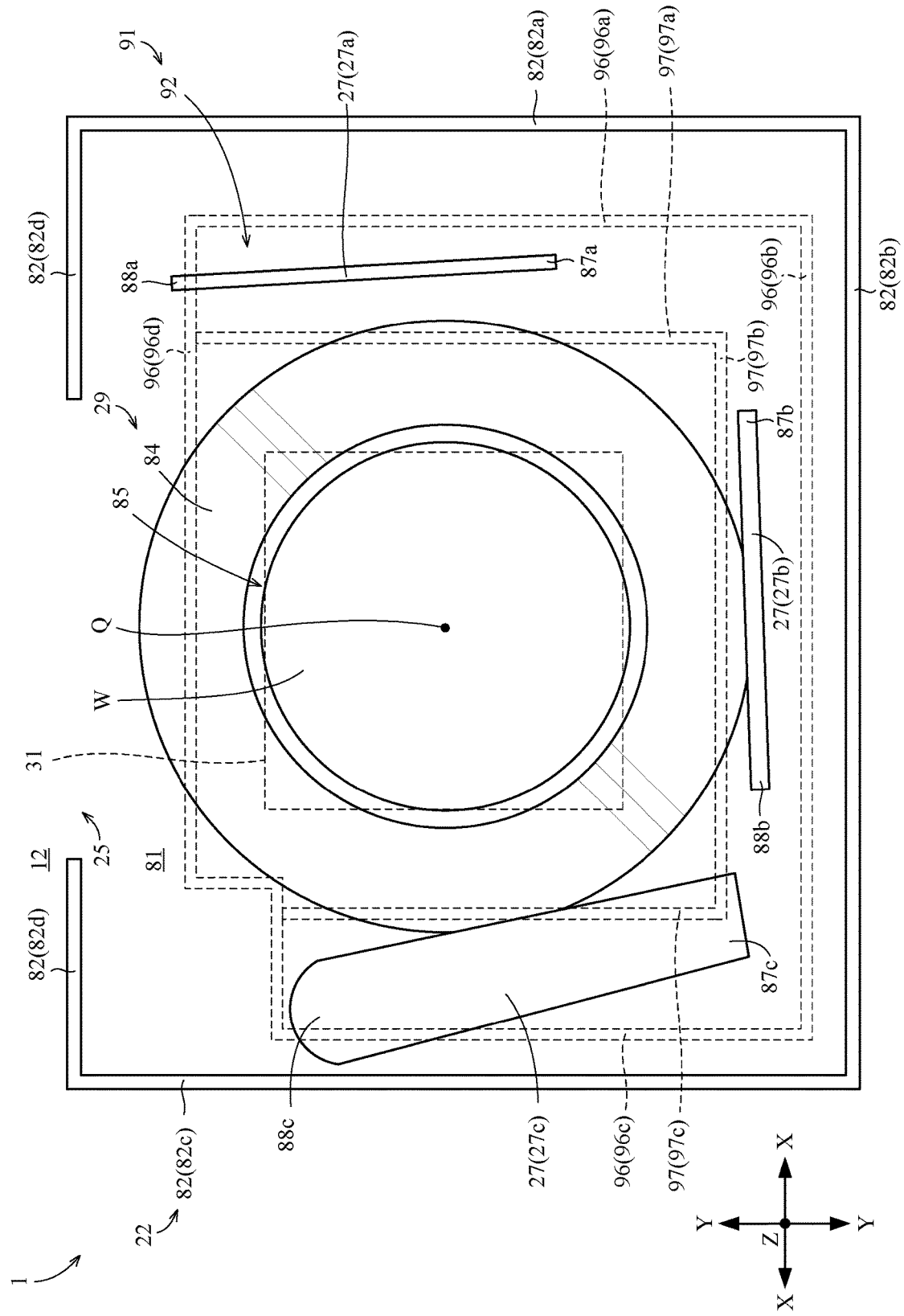
FIG. 20 is a plan view showing an interior of a treating housing in the modified embodiment.

FIG. 20 is a plan view showing the interior of the treating housing 22 in the modified embodiment. In FIG. 20, the distal ends 88a-88c are located in the standby positions respectively. FIG. 20 shows the filter 31, barrier wall 96, and guide member 97 in broken lines.

The filter 31 overlaps the wafer W held by the substrate holder 26 in plan view. The filter 31 overlaps a large part of the wafer W held by the substrate holder 26 in plan view. The filter 31 overlaps the cup 29 in plan view. The filter 31 overlaps the slope portion 84 in plan view. The filter 31 overlaps the upper opening 85 in plan view. When the distal end 88a is located in the standby position, the filter 31 does not overlap the distal end 88a in plan view. When the distal end 88a is located in the standby position, the distal end 88a lies outward of the filter 31 in plan view. When the distal ends 88b and 88c are located in the standby positions, the filter 31 does not overlap the distal ends 88b and 88c in plan view. When the distal ends 88b and 88c are located in the standby positions, the distal ends 88b and 88c each lie outward of the filter 31 in plan view.

The whole of the barrier wall 96 is, in plan view, located outward of the wafer W held by the substrate holder 26. The barrier wall 96 does not overlap the wafer W held by the substrate holder 26 in plan view. The barrier wall 96 surrounds the wafer W held by the substrate holder 26 in plan view. At least part of the barrier wall 96 is located outward of the cup 29 in plan view. At least part of the barrier wall 96 is located outward of the slope portion 84 in plan view. The whole of the barrier wall 96 is located outward of the upper opening 85 in plan view. When the distal end 88a is located in the standby position, the distal end 88a lies outward of the barrier wall 96 in plan view. When the distal end 88a is located in the standby position, part of the dispensing unit 27a lies inward of the barrier wall 96 in plan view. When the distal end 88b is located in the standby position, the distal end 88b lies inward of the barrier wall 96 in plan view. When the distal end 88b is located in the standby position, the whole of the dispensing unit 27b lies inward of the barrier wall 96 in plan view. When the distal end 88c is located in the standby position, part of the distal end 88c lies outward of the barrier wall 96 in plan view. When the distal end 88c is located in the standby position, part of the dispensing unit 27c is located inward of the barrier wall 96 in plan view.

The whole of the guide member 97 is located outward of the wafer W held by the substrate holder 26 in plan view. The guide member 97 does not overlap the wafer W held by the substrate holder 26 in plan view.

At least part of the guide member 97 overlaps the cup 29 in plan view. In this modified embodiment, part of the guide member 97 overlaps the cup 29 in plan view. The other part of the guide member 97 is located outward of the cup 29 in plan view. However, this invention is not limited to this. The whole of the guide member 97 may overlap the cup 29 in plan view. At least part of the guide member 97 overlaps the slope portion 84 in plan view. In this modified embodiment, part of the guide member 97 overlaps the slope portion 84 in plan view. The other part of the guide member 97 is located outward of the slope portion 84 in plan view. However, this invention is not limited to this. The whole of the guide member 97 may overlap the slope portion 84 in plan view. The whole of the guide member 97 is located outward of the upper opening 85 in plan view. The guide member 97 does not overlap the upper opening 85 in plan view.

When the distal ends 88 are located in the standby positions, at least part of the dispensing units 27 lie outward of the guide member 97 in plan view. Specifically, when the distal end 88a is located in the standby position, the whole of the dispensing unit 27a lies outward of the guide member 97 in plan view. When the distal end 88b is located in the standby position, the whole of the dispensing unit 27b lies outward of the guide member 97 in plan view. When the distal end 88c is located in the standby position, part of the dispensing unit 27c lies outward of the guide member 97 in plan view.

When the distal ends 88 are located in the standby positions, the distal ends 88 lie outward of the guide member 97 in plan view. When the distal ends 88 are located in the standby positions, the distal ends 88 do not overlap the guide member 97 in plan view. Specifically, when the distal end 88a is located in the standby position, the whole of the distal end 88a lies outward of the guide member 97 in plan view. Similarly, when the distal ends 88b and 88c are each located in the standby positions, the distal ends 88b and 88c each lie outward of the guide member 97 in plan view.

When the distal end 88a is located in the standby position, the guide part 97a, in plan view, lies between the distal end 88a and the wafer W held by the substrate holder 26. When the distal end 88a is located in the standby position, the guide part 97a, in plan view, extends in a way to separate the distal end 88a from the wafer W held by the substrate holder 26. Similarly, when the distal ends 88b and 88c are located in the standby positions, the guide parts 97b and 97c, in plan view, lie between the distal ends 88b and 88c and the wafer W held by the substrate holder 26 respectively. When the distal ends 88b and 88c are located in the standby positions, the guide parts 97b and 97c, in plan view, extend in a way to separate the distal ends 88b and 88c from the wafer W held by the substrate holder 26 respectively.

Figure 21:
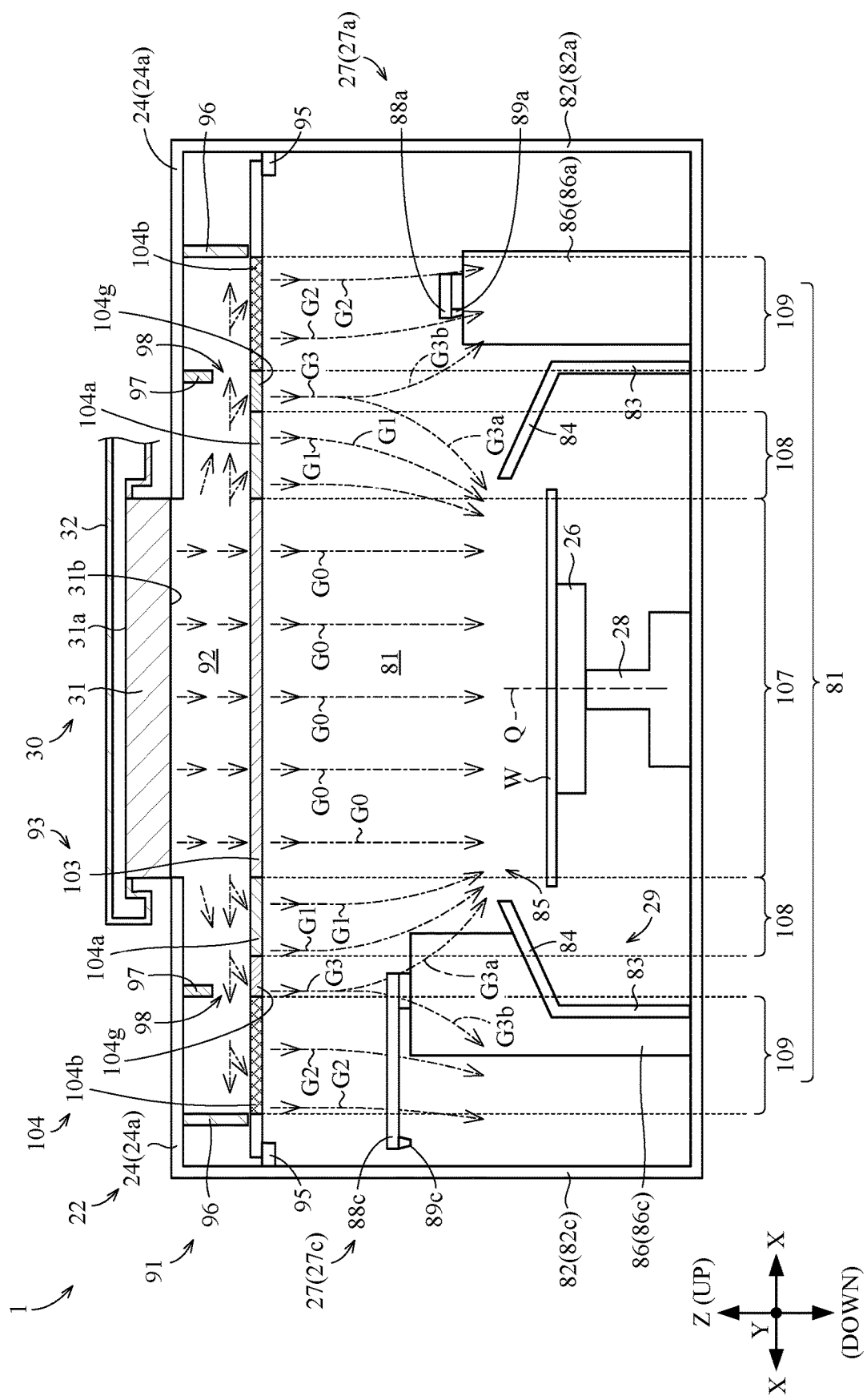
FIG. 21 is a view in vertical section of the treating housing in the modified embodiment.

FIG. 21 is a view in vertical section of the treating housing 22 in the modified embodiment. FIG. 21 schematically shows gas currents in chain lines.

The filter 31 blows off the gas downward. The regulator 91 receives the gas blown off from the filter 31. The regulator 91 blows off the gas downward. Specifically, the regulating chamber 92 receives the gas from the filter 31. The blowout plate 93 blows off the gas into the treating space 81.

Figure 22:
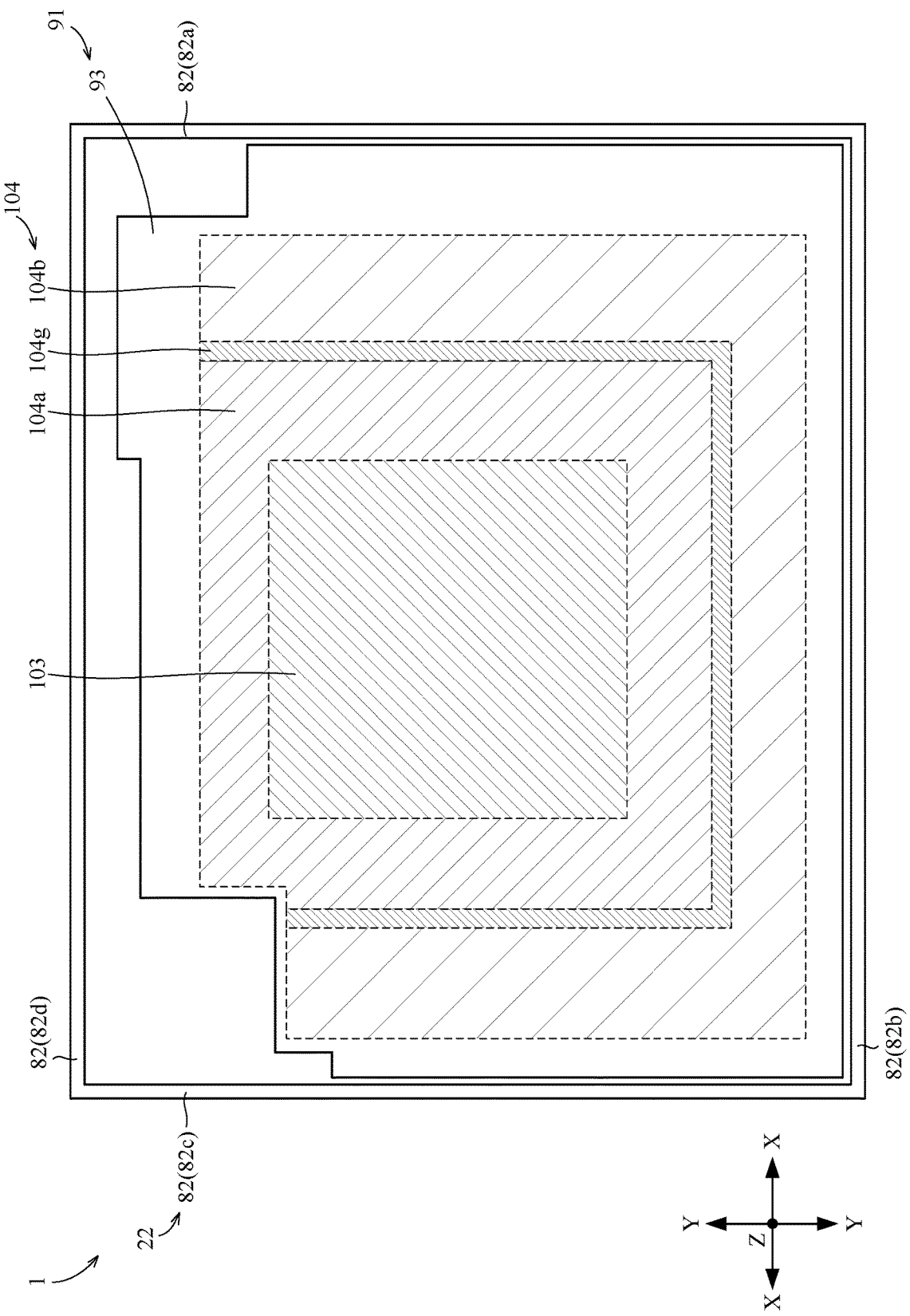
FIG. 22 is a plan view of a blowout plate in the modified embodiment.

FIG. 22 is a plan view of the blowout plate 93 in the modified embodiment. For expediency, the blowout plate 93 has, as defined to be parts thereof, a core zone 103 and a marginal zone 104. The core zone 103 is a portion of the blowout plate 83 located under the filter 31. In other words, the core zone 103 is a portion of the blowout plate 83 that overlaps the filter 31 in plan view. The marginal zone 104 is a portion of the blowout plate 83 located outward of the core zone 103 and inward of the barrier wall 96. The marginal zone 104 is located outward of the filter 31 in plan view. The marginal zone 104 does not overlap the filter 31 in plan view.

The marginal zone 104 has, as defined to be parts thereof, a guide zone 104g, a first zone 104a, and a second zone 104b. The guide zone 104g is a portion of the marginal zone 104 located under the guide member 97. The guide zone 104g may further include part of the marginal zone 104 located near the guide member 97 in plan view. The first zone 104a is a portion of the marginal zone 104 located inward of the guide zone 104g. The second zone 104b is a portion of the marginal zone 104 located outward of the guide zone 104g.

The guide zone 104g is located outward of the filter 31 in plan view. The guide zone 104g does not overlap the filter 31 in plan view. The same applies to the first zone 104a and second zone 104b.

Reference is made to FIG. 21. For expediency, the gas currents blown off from the blowout plate 93 include, as defined to be parts thereof, core blowout currents G0, first blowout currents G1, second blowout currents G2, and third blowout currents G3. The core blowout currents G0 are gas currents blown off from the core zone 103. The first blowout currents G1 are gas currents blown off from the first zone 104a. The second blowout currents G2 are gas currents blown off from the second zone 104b. The third blowout currents G3 are gas currents blown off from the guide zone 104g.

For expediency, the treating space 81 includes, as defined to be parts thereof, a core area 107, a first area 108, and a second area 109. The core area 107 is a portion of the treating space 81 located directly under the core zone 103. The first area 108 is a portion of the treating space 81 located directly under the first zone 104a. The first area 108 is located outward of the core area 107. The second area 109 is a portion of the treating space 81 located directly under the second zone 104b. The second area 109 is located outward of the first area 108.

The currents of the gas in the regulating chamber 92 and treating space 81 will be described. In the regulating chamber 92, the gas starts from the filter 31 and reaches the blowout plate 83. The gas currents in the regulating chamber 92 are classified into linear currents and curved currents. The linear currents flow straight downward instead of bending to horizontal directions. The linear currents reach the core zone 103. The curved currents turn to horizontal directions, and thereafter turn downward to the blowout plate 83. The curved currents reach the marginal zone 104.

The curved currents are further classified into a first to a third currents. The first currents bend down before reaching the guide member 97. The first currents reach the first zone 104a. The second currents bend down after passing the guide member 97 (narrow paths 98). The second currents reach the second zone 104b. The third currents bend down near the guide member 97. The third currents reach the guide zone 104g. The third currents are strong compared with the first currents. The third currents are strong compared with the second currents.

The core blowout currents G0 flow down from the core zone 103. The core blowout currents G0 enter the core area 107. The first blowout currents G1 flow down from the first zone 104a. The first blowout currents G1 enter the first area 108. The second blowout currents G2 flow down from the second zone 104b. The second blowout currents G2 enter the second area 109. The third blowout currents G3 flow down from the guide zone 104g. The third blowout currents G3 enter between the first area 108 and second area 109. The first blowout currents G1 are located outward of the core blowout currents G0. The third blowout currents G3 are located outward of the first blowout currents G1. The second blowout currents G2 are located outward of the third blowout currents G3.

The third blowout currents G3 are strong compared with the first blowout currents G1. The speed of the third blowout currents G3 is higher than the speed of the first blowout currents G1. The third blowout currents G3 are strong compared with the second blowout currents G2. The speed of the third blowout currents G3 is higher than the speed of the second blowout currents G2. The first blowout currents G1 are located inward of the third blowout currents G3. The second blowout currents G2 are located outward of the third blowout currents G3. Therefore, the third blowout currents G3 diverge to inner currents G3a and outer currents G3b.

The inner currents G3a flow downward and inward. The inner currents G3a, while flowing downward, approach the center axis Q. The inner currents G3a, while flowing downward, enter the first area 108. The inner currents G3a make the first blowout currents G1 also approach the center axis Q while flowing downward. The first blowout currents G1 enter the core area 107 from the first area 108. The core blowout currents G0 and first blowout currents G1 pass the upper opening 85. The core blowout currents G0 and first blowout currents G1 are supplied to the wafer W held by the substrate holder 26. The inner currents G3a may also enter the core area 107 from the first area 108. The inner currents G3a may also pass the upper opening 85.

The outer currents G3b flow downward and outward. The outer currents G3b, while flowing downward, move away from the center axis Q. The outer currents G3b, while flowing downward, enter the second area 109. The outer currents G3b make the second blowout currents G2 also move away from the center axis Q while flowing downward. The outer currents G3b prevent the atmosphere of the second area 109 from entering the first area 108. The outer currents G3b prevent the atmosphere of the second area 109 from passing the upper opening 85. The outer currents G3b prevent the atmosphere of the second area 109 from reaching the wafer W held by the substrate holder 26. Thus, the outer currents G3b protect the wafer W held the substrate holder 26 from the atmosphere of the second area 109. The outer currents G3b keep clean the wafer W held by the substrate holder 26.

Effects of the modified embodiment will be described. The filter 31 blows off the gas to the interior of the treating housing 22. The filter 31 blows off the gas downward. The substrate treating apparatus 1 has a regulator 91. The regulator 91 is installed in the interior of the treating housing 22. The regulator 91 has the regulating chamber 92. The regulating chamber 92 is located below the filter 31. Therefore, the regulator 91 can conveniently receive the gas blown off from the filter 31 in the regulating chamber 92.

The regulator 91 has the blowout plate 93. The blowout plate 93 is located below the regulating chamber 92. The blowout plate 93 extends horizontally. The blowout plate 93 has the plurality of blowout bores 94. Consequently, the regulator 91 can conveniently blow off the gas downward from the blowout plate 93 through the blowout bores 94.

The substrate holder 26 is installed in the interior of the treating housing 22. The substrate holder 26 is located below the regulator 91. The substrate holder 26 holds a wafer W. The regulator 91 can therefore conveniently supply the gas to the wafer W held by the substrate holder 26. Specifically, the regulator 91 can form downflows of the gas around the wafer W held by the substrate holder 26.

The regulating chamber 92 extends horizontally. The regulating chamber 92 is larger than the filter 31 in plan view. The regulator 91 has the guide member 97. The guide member 97 is provided in the regulating chamber 92. The guide member 97 guides the gas downward in the regulating chamber 92. The guide member 97 therefore prevents the blowout plate 93 from including blowout faulty parts. The blowout faulty parts are portions of the blowout plate 93 that substantially fail to blow off the gas. Thus, the blowout plate 93 does not include blowout bores 94 that substantially fail to blow off the gas. All the blowout bores 94 blow off the gas. Thus, the guide member 97 regulates the gas currents in the regulating chamber 92.

The blowout plate 93 includes a core zone 103 and a marginal zone 104. The core zone 103 overlaps the filter 31 in plan view. The core zone 103 is close to the filter 31. The marginal zone 104 is located outward of the filter 31 in plan view. The marginal zone 104 is far from the filter 31. The blowout faulty parts tend to occur more easily in the marginal zone 104 than in the core zone 103. The whole of the guide member 97 is located outward of the filter 31 in plan view. That is, the whole of the guide member 97 is located above the marginal zone 104. The guide member 97 therefore prevents the marginal zone 104 from including blowout faulty parts. Specifically, the guide member 97 prevents the speed of the first blowout currents G1 from becoming substantially zero. The guide member 97 prevents the speed of the second blowout currents G2 from becoming substantially zero. The guide member 97 prevents the speed of the third blowout currents G3 from becoming substantially zero.

The whole of the guide member 97 is located outward of the wafer W held by the substrate holder 26 in plan view. The guide zone 104g is therefore located outward of the wafer W held by the substrate holder 26 in plan view. The third blowout currents G3 blown off from the guide zone 104g are relatively strong. Therefore, the third blowout currents G3 protect the wafer W held by the substrate holder 26 from the atmosphere outward of the third blowout currents G3. The atmosphere outward of the third blowout currents G3 corresponds to the atmosphere of the second area 109. Consequently, the third blowout currents G3 keep clean the wafer W held by the substrate holder 26. As a result, the substrate treating apparatus 1 can treat the wafer W held by the substrate holder 26 with high quality.

Further, the third blowout currents G3 increase the quantity of the gas supplied to the wafer W held by the substrate holder 26. Consequently, the substrate treating apparatus 1 can treat the wafer W held by the substrate holder 26 with high quality.

The guide member 97 is located in the upper part of the regulating chamber 92. The guide member 97 extends in the vertical direction Z. The guide member 97 can therefore conveniently guide the gas downward in the regulating chamber 92.

The guide member 97 is located only in the upper part of the regulating chamber 92. That is, the guide member 97 is not located in the lower part of the regulating chamber 92. The guide member 97 keeps open the lower part of the regulating chamber 92. Consequently, the gas flows through the lower part of the regulating chamber 92 without a hitch. In other words, the gas does not stagnate in the lower part of the regulating chamber 92. Thus, the gas in the regulating chamber 92 flows smoothly along the blowout plate 93. As a result, the guide member 97 prevents with increased convenience the blowout plate 93 from including the blowout faulty parts.

The guide member 97 is located in the upper part of the regulating chamber 92. That is, the guide member 97 does not open free the upper part of the regulating chamber 92. Consequently, when the gas passes the guide member 97 (narrow paths 98), the gas does not turn upward. The gas therefore flows smoothly through the lower part of the regulating chamber 92. As a result, the guide member 92 can prevent with increased convenience the blowout plate 93 from including the blowout faulty parts.

Distance Ea is substantially equal to distance Da. Consequently, the difference in size between the first zone 104a and second zone 104b is small. In plan view, for example, the difference between the size of the first zone 104a and the size of the second zone 104b is small. Therefore, the difference in speed between the first blowout currents G1 and second blowout currents G2 is small Consequently, the guide member 97 can conveniently prevent the marginal zone 104 from including the blowout faulty parts. Similarly, distance Eb is substantially equal to distance Db. Distance Ec is substantially equal to distance Dc. Consequently, the guide member 97 can prevent with increased convenience the marginal zone 104 from including the blowout faulty parts.

Distance Eb is substantially equal to distance Ea. Consequently, the speed of the first blowout currents G1 does not vary to excess over the first zone 104a. The guide member 97 can therefore conveniently prevent the first zone 104a from including the blowout faulty parts. Similarly, distance Ec is substantially equal to distance Ea. The guide member 97 can therefore prevent with increased convenience the first zone 104a from including the blowout faulty parts.

Distance Db preferably is substantially equal to distance Da. Consequently, the speed of the second blowout currents G2 does not vary to excess over the second zone 104b. The guide member 97 can conveniently prevent the second zone 104b from including the blowout faulty parts. Similarly, distance Dc is substantially equal to distance Da. The guide member 97 can therefore prevent with increased convenience the second zone 104b from including the blowout faulty parts.

The substrate treating apparatus 1 includes the barrier wall 96. The barrier wall 96 closes the lateral parts of the regulating chamber 92. The barrier wall 96 prevents the gas from flowing out of the regulating chamber 92 through the lateral parts of the regulating chamber 92. Thus, the whole gas in the regulating chamber 92 comes out of the blowout plate 93 through the blowout bores 94. The barrier wall 96 therefore prevents the blowout plate 93 from including the blowout faulty parts.

The substrate treating apparatus 1 includes the dispensing units 27. The dispensing units 27 are installed in the interior of the treating housing 22. The dispensing units 27 dispense treating liquids to the wafer W held by the substrate holder 26. Each dispensing unit 27 includes the distal end 88 movable between the dispensing position and the standby position. When the distal end 88 is located in the standby position, the distal end 88 is located outward of the wafer W held by the substrate holder 26 in plan view. When the distal end 88 is located in the standby position, the guide member 97 is located between the distal end 88 and the wafer W held by the substrate holder 26 in plan view. In other words, when the distal end 88 is located in the standby position, the distal end 88 is located outward of the guide member 97 in plan view, and the wafer W held by the substrate holder 26 is located inward of the guide member 97 in plan view. Therefore, when the distal end 88 is located in the standby position, the guide zone 104g is located between the distal end 88 and the wafer W held by the substrate holder 26 in plan view. In other words, when the distal end 88 is located in the standby position, the distal end 88 is located outward of the guide zone 104g in plan view, and the wafer W held by the substrate holder 26 is located inward of the guide zone 104g in plan view. When the distal end 88 is located in the standby position, the third blowout currents G3 are blown off toward areas between the distal end 88 and the wafer W held by the substrate holder 26. Therefore, when the distal end 88 is located in the standby position, the third blowout currents G3 protect the wafer W held by the substrate holder 26 from the distal end 88. For example, the third blowout currents G3 block the atmosphere near the distal end 88 reaching the wafer W held by the substrate holder 26. For example, the third blowout currents G3 obstruct particles moving from the distal end 88 to the wafer W held by the substrate holder 26. Consequently, the third blowout currents G3 keep still cleaner the wafer W held by the substrate holder 26. As a result, the substrate treating apparatus 1 can treat the wafer W held by the substrate holder 26 with high quality.

The substrate treating apparatus 1 includes the cup 29. The cup 29 is installed in the interior of the treating housing 22. The cup 29 is located around the substrate holder 26. The cup 29 catches the treating liquids. At least part of the guide member 97 overlaps the cup 29 in plan view. Therefore, at least part of the guide zone 104g overlaps the cup 29 in plan view. At least part of the third blowout currents G3 are blown off toward the cup 29. Thus, the third blowout currents G3 effectively protect the wafer W held by the substrate holder 26. Consequently, the third blowout currents G3 effectively keep clean the wafer W held by the substrate holder 26. As a result, the substrate treating apparatus 1 can treat the wafer W held by the substrate holder 26 with high quality.

For example, the third blowout currents G3 effectively restrain the gas from flowing along the upper surface of the slope portion 84 toward the center axis Q. For example, the third blowout currents G3 effectively restrain the gas from flowing inward along the upper surface of the slope portion 84. For example, the third blowout currents G3 effectively restrain the gas from passing areas adjacent the upper surface of the slope portion 84 to enter the upper opening 85. The third blowout currents G3 therefore effectively protect the wafer W held by the substrate holder 26 from the upper surface of the slope portion 84. For example, the third blowout currents G3 block the atmosphere near the upper surface of the slope portion 84 reaching the wafer W held by the substrate holder 26. For example, the third blowout currents G3 obstruct particles moving from the upper surface of the slope portion 84 to the wafer W held by the substrate holder 26.

The blowout plate 93 can be attached to and detached from the treating housing 22. The blowout plate 93 can be maintained easily.

The blowout plate 93 has a first member 101 and a second member 102. The second member 102 adjoins the first member 101. The first member 101 is smaller than the entire blowout plate 93. For example, the size of the first member 101 is smaller than the size of the entire blowout plate 93 in plan view. The first member 101 can therefore be maintained with increased ease. The second member 102 is smaller than the entire blowout plate 93. For example, the size of the second member 102 is smaller than the size of the entire blowout plate 93 in plan view. The second member 102 can therefore be maintained with increased ease. The blowout plate 93 can therefore be maintained with increased ease.

In plan view, the first member 101 overlaps the whole of the filter 31. The whole of the second member 102 is located outward of the filter 32 in plan view. The filter 31 can therefore be maintained conveniently by detaching only the first member 101 from the treating housing 22. The filter 31 can be maintained conveniently without detaching the second member 102 from the treating housing 22.

The embodiment and each modified embodiment may be further varied as appropriate by replacing or combining their constructions with the constructions of the other modified embodiments.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus comprising:
a first treating housing for treating substrates in an interior thereof; and
a first gas supply unit for supplying a gas to the interior of the first treating housing;
wherein the first gas supply unit includes:
a filter disposed in an upper part of the first treating housing for blowing off the gas to the interior of the first treating housing;
a duct disposed in an exterior of the first treating housing and connected to the filter; and
a fan disposed in the exterior of the first treating housing and connected to the duct;
the fan being located in a position not overlapping the filter in plan view;
at least part of the fan being located in a same height position as the first treating housing.

2. The substrate treating apparatus according to claim 1, wherein at least part of the fan is located in a position lower than the filter.

3. The substrate treating apparatus according to claim 1, wherein the fan is located in a position not overlapping the first treating housing in plan view.

4. The substrate treating apparatus according to claim 1, wherein a projection length of the first gas supply unit projecting upward from the first treating housing is at most twice a length of the filter in a vertical direction.

5. The substrate treating apparatus according to claim 1, wherein the duct includes:
a first horizontal portion extending substantially horizontally from the filter;
a vertical portion extending downward from the first horizontal portion; and
a second horizontal portion extending substantially horizontally from the vertical portion and located in a position lower than the first horizontal portion.

6. The substrate treating apparatus according to claim 5, wherein the first treating housing includes a top plate;
the top plate having:
a first top plate portion with the filter mounted thereon; and
a second top plate portion disposed below the vertical portion and the second horizontal portion;
the second top plate portion being lower than the first top plate portion.

7. The substrate treating apparatus according to claim 1, wherein part of the duct overlaps the filter in front view.

8. The substrate treating apparatus according to claim 1, wherein the duct includes a flat part disposed above the filter and extending horizontally for blowing off the gas downward;
the flat part having a vertical length smaller than a vertical length of the filter.

9. The substrate treating apparatus according to claim 8, wherein a total vertical length of the flat part and the filter is smaller than twice the vertical length of the filter.

10. The substrate treating apparatus according to claim 8, wherein a height position of an upper surface of the flat part corresponds to an upper end of the duct.

11. The substrate treating apparatus according to claim 8, wherein the duct includes an outer groove region communicatively connected to an edge region of the flat part for feeding the gas to the flat part;
a vertical length of the outer groove region being larger than the vertical length of the flat part.

12. The substrate treating apparatus according to claim 11, wherein the outer groove region has a loop shape surrounding the flat part in plan view.

13. The substrate treating apparatus according to claim 11, wherein the outer groove region extends downward from the edge region of the flat part;
at least part of the outer groove region overlapping the filter in front view.

14. The substrate treating apparatus according to claim 11, wherein the duct includes baffle plates installed in the outer groove region for guiding, to the flat part, part of the gas flowing through the outer groove region.

15. The substrate treating apparatus according to claim 14, wherein the baffle plates cross directions in which the outer groove region extends.

16. The substrate treating apparatus according to claim 1, further comprising:
a transporting space extending in a horizontal first direction and adjoining the first treating housing;
a transport mechanism installed in the transporting space for transporting the substrates into the first treating housing; and
a piping space adjoining the first treating housing;
wherein
the first treating housing and the transporting space are aligned in a horizontal second direction perpendicular to the first direction in plan view;

the first treating housing and the piping space are aliened in the first direction;
the fan is open to the piping space; and
the fan sends the gas from the piping space to the filter.

17. The substrate treating apparatus according to claim 16, wherein:
the first treating housing includes an exhaust port formed in a position facing the piping space; and
the fan is disposed above the exhaust port.

18. The substrate treating apparatus according to claim 17, further comprising:
a horizontal exhaust unit provided in the piping space, connected to the exhaust port, and extending horizontally; and
a vertical exhaust unit provided in the piping space, connected to the horizontal exhaust unit, and extending vertically;
wherein
the fan is located in a position higher than the horizontal exhaust unit; and
the fan and the vertical exhaust unit are aligned in the second direction as seen from the first direction.

19. The substrate treating apparatus according to claim 18, wherein:
the vertical exhaust unit includes:
a first vertical exhaust pipe extending vertically; and
a second vertical exhaust pipe extending vertically;
the horizontal exhaust unit includes:
a switching mechanism for switching an exhaust path of the first treating housing to one of the first vertical exhaust pipe and the second vertical exhaust pipe; and
the fan, the first vertical exhaust pipe, and the second vertical exhaust pipe are aligned in the second direction as seen from the first direction.

20. The substrate treating apparatus according to claim 1, further comprising:
a pressure sensor for measuring gas pressure inside the first treating housing; and
a controller for controlling the fan based on detection results of the pressure sensor.

21. The substrate treating apparatus according to claim 1, further comprising:
a regulator installed in the interior of the first treating housing for receiving the gas blown off from the filter and blowing off the gas downward; and
a substrate holder installed in the interior of the first treating housing and located below the regulator for holding the substrates;
wherein
the filter blows off the gas downward;
the regulator includes:
a regulating chamber larger than the filter in plan view, located below the filter, and extending horizontally;
a guide member provided in the regulating chamber for guiding the gas downward in the regulating chamber; and
a blowout plate located below the regulating chamber, extending horizontally, and having a plurality of blowout bores;
a whole of the guide member is located outward of the filter in plan view; and
the whole of the guide member is located outward of the substrates held by the substrate holder in plan view.

22. The substrate treating apparatus according to claim 21, wherein the guide member is located only in an upper part of the regulating chamber, and extends vertically.

23. The substrate treating apparatus according to claim 21, further comprising a barrier wall closing lateral parts of the regulating chamber.

24. The substrate treating apparatus according to claim 21, further comprising a dispensing unit installed in the interior of the first treating housing for dispensing a treating liquid to the substrates held by the substrate holder;
wherein
the dispensing unit includes a distal end movable between a dispensing position and a standby position;
when the distal end is located in the standby position, the distal end lies outward of the substrates held by the substrate holder in plan view; and
when the distal end is located in the standby position, the guide member lies between the distal end and the substrates held by the substrate holder in plan view.

25. The substrate treating apparatus according to claim 21, further comprising a cup installed in the interior of the first treating housing and located around the substrate holder for catching a treating liquid;
wherein at least part of the guide member overlaps the cup in plan view.

26. The substrate treating apparatus according to claim 21, wherein the blowout plate is detachably attached to the first treating housing.

27. The substrate treating apparatus according to claim 21, wherein the blowout plate includes a first member, and a second member adjoining the first member.

* * * * *